US012813122B2

(12) United States Patent
Deng et al.

(10) Patent No.: US 12,813,122 B2
(45) Date of Patent: Nov. 24, 2026

(54) DISPLAY SUBSTRATE AND METHOD FOR MANUFACTURING SAME, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Lei Deng, Beijing (CN); Yue Wei, Beijing (CN); Guoqiang Yang, Beijing (CN); Wei Cui, Beijing (CN); Xu Yang, Beijing (CN); Tinghua Shang, Beijing (CN); Yi Zhang, Beijing (CN); Tingliang Liu, Beijing (CN); Huijuan Yang, Beijing (CN); Huiyang Yu, Beijing (CN); Wei Zhang, Beijing (CN); Xiaoliang Guo, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 519 days.

(21) Appl. No.: 18/281,955

(22) PCT Filed: Nov. 8, 2022

(86) PCT No.: PCT/CN2022/130655
§ 371 (c)(1),
(2) Date: Sep. 13, 2023

(87) PCT Pub. No.: WO2023/098420
PCT Pub. Date: Jun. 8, 2023

(65) Prior Publication Data
US 2024/0155876 A1 May 9, 2024

(30) Foreign Application Priority Data
Nov. 30, 2021 (CN) ......................... 202111444118.X
Aug. 8, 2022 (CN) ......................... 202210941064.6

(51) Int. Cl.
*H10K 59/35* (2023.01)
*H10K 50/19* (2023.01)
(Continued)

(52) U.S. Cl.
CPC .......... *H10K 59/353* (2023.02); *H10K 50/19* (2023.02); *H10K 59/1201* (2023.02);
(Continued)

(58) Field of Classification Search
CPC ............ H10K 59/353; H10K 59/1201; H10K 59/122; H10K 59/352; H10K 71/60; H10K 50/19
See application file for complete search history.

(56) References Cited

U.S. PATENT DOCUMENTS 7,732,810 B2 6/2010 Truong et al.
10,923,543 B1 2/2021 Chen
(Continued)

FOREIGN PATENT DOCUMENTS

CN 101447555 A 6/2009
CN 108493228 A 9/2018
(Continued)

OTHER PUBLICATIONS

International Search Report for PCT/CN2022/105240 Mailed Sep. 28, 2022.
(Continued)

*Primary Examiner* — Mary Ellen Bowman

(57) ABSTRACT

Disclosed are a display substrate and a method for manufacturing same, and a display apparatus. The display sub-
(Continued)

strate comprises a base substrate, a plurality of sub-pixels and a partition structure, wherein a light-emitting element of each sub-pixel comprises a light-emitting functional layer and a first electrode and a second electrode located on two sides of the light-emitting functional layer, and the light-emitting functional layer comprises a conductive sub-layer; the partition structure is located between adjacent sub-pixels, and the conductive sub-layer is disconnected at the position where the partition structure is located; the plurality of sub-pixels comprise a plurality of first-color sub-pixels, a plurality of second-color sub-pixels and a plurality of third-color sub-pixels, the partition structure comprises a plurality of annular partition portions, the annular partition portions surround at least one first-color sub-pixel, at least one second-color sub-pixel or at least one third-color sub-pixel.

20 Claims, 32 Drawing Sheets

(51) Int. Cl.
*H10K 59/12* (2023.01)
*H10K 59/122* (2023.01)
*H10K 71/60* (2023.01)

(52) U.S. Cl.
CPC ......... *H10K 59/122* (2023.02); *H10K 59/352* (2023.02); *H10K 71/60* (2023.02)

(56) References Cited

U.S. PATENT DOCUMENTS

| | | | | |
|---|---|---|---|---|
| 11,348,983 | B1 * | 5/2022 | Choung | H10K 59/173 |
| 12,471,482 | B2 * | 11/2025 | Fang | H10K 59/80522 |
| 2007/0052349 | A1 | 3/2007 | Giraldo et al. | |
| 2007/0263164 | A1 * | 11/2007 | Kumagai | H10K 59/122 349/156 |
| 2013/0320367 | A1 * | 12/2013 | Hong | H10K 59/122 257/89 |
| 2017/0141169 | A1 | 5/2017 | Sim et al. | |
| 2018/0190740 | A1 * | 7/2018 | Bang | H10K 59/38 |
| 2019/0363276 | A1 | 11/2019 | Li et al. | |
| 2020/0343322 | A1 | 10/2020 | Jia et al. | |
| 2021/0111302 | A1 | 4/2021 | Pan | |
| 2021/0202882 | A1 | 7/2021 | Shim et al. | |
| 2021/0226154 | A1 | 7/2021 | Ban et al. | |
| 2021/0296370 | A1 | 9/2021 | Song | |
| 2021/0376005 | A1 | 12/2021 | Zhang et al. | |
| 2022/0140023 | A1 * | 5/2022 | Jeon | H10K 59/124 257/40 |
| 2022/0223669 | A1 * | 7/2022 | Takayama | H10K 59/122 |
| 2022/0344421 | A1 * | 10/2022 | Huang | H10K 59/124 |
| 2022/0416197 | A1 | 12/2022 | Chen | |
| 2023/0157133 | A1 * | 5/2023 | Wang | H10K 59/80522 257/40 |
| 2024/0032375 | A1 | 1/2024 | Shang et al. | |
| 2024/0138210 | A1 * | 4/2024 | Kong | H10K 59/353 |

FOREIGN PATENT DOCUMENTS

| | | | |
|---|---|---|---|
| CN | 108649057 | A | 10/2018 |
| CN | 108717942 | A | 10/2018 |
| CN | 109728068 | A | 5/2019 |
| CN | 109742121 | A | 5/2019 |
| CN | 110137378 | A | 8/2019 |
| CN | 110164924 | A | 8/2019 |
| CN | 110783382 | A | 2/2020 |
| CN | 111326675 | A | 6/2020 |
| CN | 111799320 | A | 10/2020 |
| CN | 111834552 | A | 10/2020 |
| CN | 111863929 | A | 10/2020 |
| CN | 112071889 | A | 12/2020 |
| CN | 212874542 | U | 4/2021 |
| CN | 112838103 | A | 5/2021 |
| CN | 213124488 | U | 5/2021 |
| CN | 113314579 | A | 8/2021 |
| CN | 114628448 | A | 6/2022 |
| CN | 114628451 | A | 6/2022 |
| CN | 216749902 | U | 6/2022 |
| CN | 115458701 | A | 12/2022 |
| CN | 115988922 | A | 4/2023 |
| JP | 2005203215 | A | 7/2005 |
| JP | 2008135325 | A | 6/2008 |
| JP | 2017162832 | A | 9/2017 |

OTHER PUBLICATIONS

International Search Report for PCT/CN2022/130655 Mailed Jan. 9, 2023.
Office Action dated Jun. 28, 2023 for Chinese Patent Application No. 202310078696.9 and English Translation.
Office Action dated Sep. 2, 2023 for Chinese Patent Application No. 202310078696.9 and English Translation.
Office Action dated Aug. 26, 2025 for U.S. Appl. No. 18/268,401.
European Search Report for 22899909.0 Mailed Sep. 27, 2024.
First CN Office Action Application No. 202210941064.6 issued Jun. 27, 2026 (15 pages).

* cited by examiner

100

100

100

DISPLAY SUBSTRATE AND METHOD FOR MANUFACTURING SAME, AND DISPLAY APPARATUS

CROSS-REFERENCE TO RELATED APPLICATIONS

The present application is a U.S. National Phase Entry of International Application No. PCT/CN2022/130655 having an international filing date of Nov. 8, 2022, which claims priorities to Chinese Patent Application No. 202111444118.X, filed to the CNIPA on Nov. 30, 2021, and entitled "Display Substrate and Method for Manufacturing same, and Display Apparatus", and Chinese Patent Application No. 202210941064.6, filed to the CNIPA on Aug. 8, 2022, and entitled "Display Substrate and Method for Manufacturing same, and Display Apparatus". The contents of the above-identified applications are hereby incorporated by reference.

TECHNICAL FIELD

Embodiments of the present disclosure relate to a display substrate, a method for manufacturing same, and a display apparatus.

BACKGROUND

With continuous development of display technologies, an Organic Light Emitting Diode (OLED) display apparatus has become a current research hotspot and technology development direction because of its advantages such as wide color gamut, a high contrast ratio, a thin and light design, self-luminous, and a wide viewing angle.

At present, organic light emitting diode display apparatuses have been widely used in a variety of electronic products, ranging from small electronic products such as smart bracelets, smart watches, smart phones, and tablet computers to large electronic products such as notebook computers, desktop computers, and televisions. Therefore, a market demand for active matrix organic light emitting diode display apparatuses is also growing.

SUMMARY

At least one embodiment of the present disclosure provides a display substrate, including: a base substrate; a plurality of sub-pixels located on the base substrate, wherein a sub-pixel includes a light emitting element, the light emitting element includes a light emitting functional layer, and a first electrode and a second electrode that are located on two sides of the light emitting functional layer, the first electrode is located between the light emitting functional layer and the base substrate, the light emitting functional layer includes a conductive sub-layer; and partition structure located on the base substrate, wherein the partition structure is located between adjacent sub-pixels, and the conductive sub-layer is disconnected at a position where the partition structure is located; the plurality of sub-pixels include a plurality of first-color sub-pixels, a plurality of second-color sub-pixels, and a plurality of third-color sub-pixels, the partition structure includes a plurality of annular partition portions, an annular partition portion surrounds at least one of the first-color sub-pixels or at least one of the second-color sub-pixels or at least one of the third-color sub-pixels, and the plurality of annular partition portions surround a plurality of sub-pixels of a same color or a plurality of sub-pixels of different colors; at least one of the annular partition portions is in a closed ring shape, or/and, at least one of the annular partition portions is provided with at least one notch.

An embodiment of the present disclosure also provides a display apparatus, which includes the display substrate.

An embodiment of the present disclosure also provides a method for manufacturing a display substrate, including: forming a plurality of first electrodes on a base substrate; forming a partition structure on the base substrate; forming a light emitting functional layer on a side of the partition structure and the plurality of first electrodes away from the base substrate, wherein the light emitting functional layer includes a conductive sub-layer; and forming a second electrode on a side of the light emitting functional layer away from the base substrate, wherein the second electrode, the light emitting functional layer, and the plurality of the first electrodes form light emitting elements of a plurality of sub-pixels; the partition structure is located between sub-pixels which are adjacent, and the conductive sub-layer is disconnected at a position where the partition structure is located; the plurality of sub-pixels includes a plurality of first-color sub-pixels, a plurality of second-color sub-pixels, and a plurality of third-color sub-pixels, the partition structure includes a plurality of annular partition portions, an annular partition portion surrounds at least one of the first-color sub-pixels or at least one of the second-color sub-pixels or at least one of the third-color sub-pixels, and the plurality of annular partition portions surround a plurality of sub-pixels of a same color or a plurality of sub-pixels of different colors; at least one of the annular partition portions is in a closed ring shape, or/and at least one of the annular partition portions is provided with at least one notch.

According to the display substrate of the embodiment of the present disclosure, crosstalk between adjacent sub-pixels caused by a conductive sub-layer (e.g., a charge generation layer) with a relatively high conductivity may be avoided by disposing a partition structure between adjacent sub-pixels and making the conductive sub-layer (e.g., the charge generation layer) in a light emitting functional layer disconnect at a location where the partition structure is located. Moreover, since the partition structure includes a plurality of annular partition portions and an annular partition portion surrounds at least one first-color sub-pixel, at least one second-color sub-pixel, or at least one third-color sub-pixel, the partition structure may achieve partition of most adjacent sub-pixels through simple annular partition portions, thereby avoiding crosstalk between most adjacent sub-pixels. On the other hand, since crosstalk between adjacent sub-pixels may be avoided through the partition structure in the display substrate, a pixel density may be improved in the display substrate while a double-layer light emitting (Tandem EL) design is adopted. And the display substrate may have advantages of long life, low power consumption, high brightness, high resolution, and the like. In addition, since the partition structure may also partition a second electrode while partitioning the conductive sub-layer (such as the charge generation layer), at least one of the annular partition portions is provided with at least one notch, in this way, the second electrode is not partitioned at the notch. By disposing the notch, continuity of the second electrode may be improved, and the second electrode may be prevented from being completely partitioned by an annular partition portion in a closed ring shape.

BRIEF DESCRIPTION OF DRAWINGS

In order to explain technical solutions of embodiments of the present disclosure more clearly, accompanying drawings of the embodiments will be introduced briefly below. The accompanying drawings in the following description only relate to some embodiments of the present disclosure, but do not limit the present disclosure.

DETAILED DESCRIPTION

Figure 1:
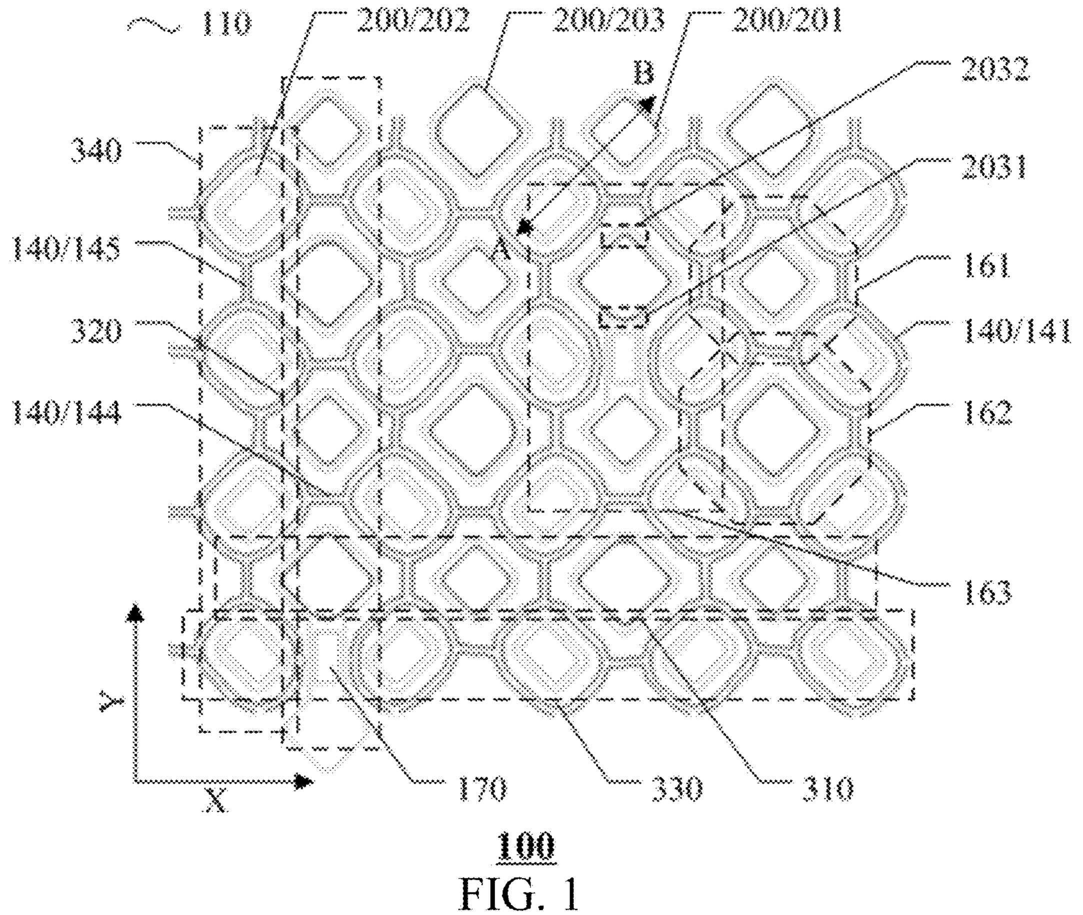
FIG. 1 is a schematic plan view of a display substrate according to an embodiment of the present disclosure.

In order to make objectives, technical solutions, and advantages of the embodiments of the present disclosure more clear, the technical solutions of the embodiments of the present disclosure will be clearly and completely described below with reference to the drawings of the embodiments of the present disclosure. Apparently, the described embodiments are a part of the embodiments of the present disclosure, not all of the embodiments. Based on the described embodiments of the present disclosure, all other embodiments obtained by those of ordinary skill in the art without inventive effort are within the protection scope of the present disclosure.

Unless otherwise defined, technical terms or scientific terms used in the present disclosure should have meanings as commonly understood by those of ordinary skill in the art that the present disclosure belongs to. "First", "second", and similar terms used in the present disclosure do not indicate any order, quantity, or importance, but are used only for distinguishing different components. "Include", "contain", or similar words mean that elements or objects appearing before the words cover elements or objects listed after the words and their equivalents, but do not exclude other elements or objects.

Features such as "parallel", "vertical", and "same" used in embodiments of the present disclosure all include features such as "parallel", "vertical", and "identical" in a strict sense, as well as cases such as "substantially parallel", "substantially vertical", and "substantially the same", etc., which include a certain error, that are within an acceptable range of deviation for a particular value as determined by a person of ordinary skill in the art, taking into account measurement and an error (e.g., a limitation of a measurement system) associated with measurement of a particular quantity. For example, "approximately" can mean being within one or more standard deviations, or within 10% or 5% of the stated value. When a quantity of a component is not specifically indicated below in the embodiments of the present disclosure, it means that the component may be one or more, or may be understood as at least one. "At least one" means one or more, and "plurality" means at least two.

In the embodiments of the present disclosure, a "same layer" refers to a relationship between a plurality of structures or film layers formed by a same material after a same act (e.g., a one-act patterning process), and materials of the plurality of structures or film layers disposed in the same layer are the same. The "same layer" herein does not always mean that a plurality of structures or film layers have a same thickness or a plurality of structures or film layers have a same height in a sectional view.

With continuous development of display technologies, people's pursuit of display quality is getting higher and higher. In order to further reduce power consumption and achieve high brightness, in some technologies, a single-layer emitting layer in an OLED light emitting element is replaced by double-layer emitting layers, and a Charge Generation Layer (CGL) is added between the double-layer emitting layers to achieve a Tandem EL design of double-layer light emitting. An OLED light emitting element with a double-layer light emitting material structure is equivalent to connecting two layers of light emitting materials in series. Compared with an OLED light emitting element with a single emitting layer structure, an efficiency of a current may be improved and power consumption may be reduced on a premise of constant current. In addition, since a display apparatus using a double-layer light emitting design has two emitting layers, its light emitting brightness may be approximately equivalent to twice that of a single emitting layer. Therefore, the display apparatus using the double-layer light emitting design has advantages of long life, low power consumption, high brightness, and the like.

However, inventors of the present application note that, for some high-resolution products, since a charge generation layer has a strong conductivity and charge generation layers of light emitting functional layers (film layers located between a first electrode and a second electrode, for example, film layers including two emitting layers and a charge generation layer herein) of OLED light emitting elements of adjacent sub-pixels are connected, a transverse conductivity of the charge generation layer is relatively good, which easily leads to current crosstalk between adjacent sub-pixels, thereby seriously affecting display quality adversely.

An embodiment of the present disclosure provides a display substrate, which includes a base substrate, a plurality of sub-pixels and a partition structure; the plurality of sub-pixels are located on the base substrate, a sub-pixel includes a light emitting element, the light emitting element includes a light emitting functional layer and a first electrode and a second electrode that are located on two sides of the light emitting functional layer, the first electrode is located between the light emitting functional layer and the base substrate, the light emitting functional layer includes a conductive sub-layer (such as a charge generation layer); the partition structure is located on the base substrate, and the partition structure is located between adjacent sub-pixels, and the conductive sub-layer (such as the charge generation layer) is disconnected at a position where the partition structure is located; the plurality of sub-pixels includes a plurality of first-color sub-pixels, a plurality of second-color sub-pixels, and a plurality of third-color sub-pixels, the partition structure includes a plurality of annular partition portions, an annular partition portion surrounds at least one of the first-color sub-pixels or at least one of the second-color sub-pixels or at least one of the third-color sub-pixels, and the plurality of annular partition portions surround a plurality of sub-pixels of a same color or a plurality of sub-pixels of different colors; at least one of the annular partition portions is in a closed ring shape, and/or, at least one of the annular partition portions is provided with at least one notch.

In the display substrate according to the embodiment of the present disclosure, by providing a partition structure between adjacent sub-pixels (i.e., between first electrodes or effective light emitting regions of adjacent sub-pixels) and enabling a conductive sub-layer (such as a charge generation layer) in a light emitting functional layer to be disconnected at a position where a partition structure is located, crosstalk between adjacent sub-pixels caused by a conductive sub-layer (such as a charge generation layer) with a relatively high conductivity may be avoided. Moreover, since the partition structure includes a plurality of annular partition portions and an annular partition portion surrounds at least one first-color sub-pixel, at least one second-color sub-pixel, or at least one third-color sub-pixel, the partition structure may achieve partition of most adjacent sub-pixels through simple annular partition portions, thereby avoiding crosstalk between most adjacent sub-pixels. On the other hand, since the display substrate may avoid crosstalk between adjacent sub-pixels through the partition structure, the display substrate may improve a pixel density while using a double-layer light emitting (Tandem EL) design. And the display substrate may have advantages of long life, low power consumption, high brightness, high resolution, and the like. In addition, since the partition structure may also partition the second electrode while partitioning the conductive sub-layer (such as the charge generation layer), at least one of the annular partition portions is provided with at least one notch, thus the second electrode is not partitioned at the notch. By disposing the notch, continuity of the second electrode may be improved, and the second electrode may be prevented from being completely partitioned by an annular partition portion with a closed ring shape.

Hereinafter, a display substrate, a method for manufacturing same and a display apparatus according to the embodiments of the present disclosure will be described in detail with reference to the drawings.

Figure 2:
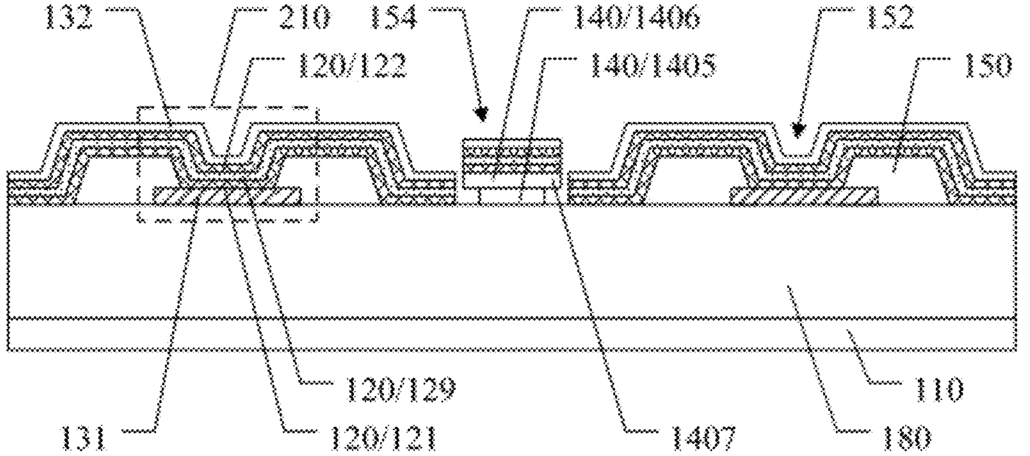
FIG. 2 is a schematic sectional view of a display substrate taken along an AB direction in FIG. 1 according to an embodiment of the present disclosure.

An embodiment of the present disclosure provides a display substrate. FIG. 1 is a schematic plan view of a display substrate according to an embodiment of the present disclosure. FIG. 2 is a schematic sectional view of a display substrate taken along an AB direction in FIG. 1 according to an embodiment of the present disclosure.

As shown in FIGS. 1 and 2, the display substrate 100 includes a base substrate 110 and a plurality of sub-pixels 200; the plurality of sub-pixels 200 are located on the base substrate 110, and a sub-pixel 200 includes a light emitting element 210; the light emitting element 210 includes a light emitting functional layer 120 and a first electrode 131 and a second electrode 132 that are located on two sides of the light emitting functional layer 120, the first electrode 131 is located between the light emitting functional layer 120 and the base substrate 110; the second electrode 132 is at least partially located on a side of the light emitting functional layer 120 away from the first electrode 131; that is to say, the first electrode 131 and the second electrode 132 are located on two sides in a direction perpendicular to the light emitting functional layer 120. The light emitting functional layer 120 includes a plurality of sub-functional layers including a conductive sub-layer 129 with a relatively high conductivity. The aforementioned light emitting functional layer includes not only the conductive sub-layer 129 and a film layer (emitting layer) for directly emitting light, but also a functional film layer for assisting light emitting, such as a hole injection layer, a hole transport layer, an electron transport layer, an electron injection layer, and the like. The conductive sub-layer 129 may be a common layer of the plurality of sub-pixels 200, that is, light emitting functional layers of the plurality of sub-pixels 200 all include the conductive sub-layer 129 of a same material, and the common layer of the plurality of sub-pixels 200, such as the conductive sub-layer 129, may be formed by using an evaporation process and an open mask.

For example, the conductive sub-layer 129 may be a charge generation layer. For example, the first electrode 131 may be an anode, and the second electrode 132 may be a cathode. For example, the cathode may be formed of a material with a high conductivity and a low work function, for example, the cathode may be made of a metal material. For example, the anode may be formed of a transparent conductive material with a high work function.

As shown in FIGS. 1 and 2, the display substrate 100 further includes a partition structure 140 located on the base substrate 110 and between adjacent sub-pixels 200; the charge generation layer 129 in the light emitting functional layer 120 is disconnected at a position where the partition structure 140 is located. That is, the charge generation layer in the light emitting functional layer has a discontinuous structure or a non-integral structure at a disconnected position. In the display substrate according to the embodiment of the present disclosure, crosstalk between adjacent sub-pixels caused by the charge generation layer with a relatively high conductivity is avoided by providing the partition structure between adjacent sub-pixels and disconnecting the charge generation layer in the light emitting functional layer at the position where the partition structure is located. On the other hand, since the display substrate may avoid crosstalk between adjacent sub-pixels through the partition structure, the display substrate may improve a pixel density while using a double-layer light emitting (Tandem EL) design. Therefore, the display substrate may have advantages of long life, low power consumption, high brightness, high resolution, and the like.

In some examples, “adjacent sub-pixels” mean that no another sub-pixel is disposed between two sub-pixels.

In some examples, as shown in FIGS. 1 and 2, a connection line between brightness centers of two adjacent sub-pixels 200 passes through the partition structure 140. Since a size of the charge generation layer in an extension direction of the connection line is relatively small and a resistance of the charge generation layer in the extension direction of the connection line is also relatively small, a charge is easily transferred from one of two adjacent sub-pixels to the other of two adjacent sub-pixels through the charge generation layer along the extension direction of the connection line. Therefore, the display substrate makes the connection line pass through the partition structure, so that the partition structure may effectively block a shortest propagation path of the charge, thereby effectively avoiding crosstalk between adjacent sub-pixels.

Herein, a brightness center of a sub-pixel may be a geometric center of an effective light emitting region of the sub-pixel, or the brightness center of the sub-pixel may be a position where a maximum light emitting brightness value of the sub-pixel is located.

In some examples, as shown in FIGS. 1 and 2, the display substrate 100 further includes a pixel definition layer 150 located on the base substrate 110; the pixel definition layer 150 is located on a side of the first electrode 131 away from the base substrate 110; the pixel definition layer 150 is provided with a plurality of pixel openings 152 and pixel spacing openings 154; the plurality of pixel openings 152 correspond to the plurality of sub-pixels 200 one by one to define effective light emitting regions of the plurality of sub-pixels 200; a pixel opening 152 is configured to expose the first electrode 131, so that the first electrode 131 is in contact with a light emitting functional layer 120 which is subsequently formed. A pixel spacing opening 154 is located between adjacent first electrodes 131, and at least part of the partition structure 140 is located within the pixel spacing opening 154, and the pixel spacing opening 154 may at least partially expose an edge of the partition structure 140. Therefore, in the display substrate, it may avoid manufacturing a partition structure on the pixel definition layer, thereby avoiding increasing a thickness of the display substrate. Of course, the embodiment of the present disclosure includes, but is not limited thereto, and the pixel definition layer may not be provided with the above-mentioned pixel spacing openings, so that the partition structure may be directly disposed on the pixel definition layer, or the partition structure may be manufactured using the pixel definition layer.

Herein, an effective light emitting region of a sub-pixel is a region defined by a pixel opening corresponding to the sub-pixel. Herein, when referring to a position of a sub-pixel, it refers to an effective light emitting region of the sub-pixel, that is, a region defined by a pixel opening corresponding to the sub-pixel. For example, an annular partition portion surrounds a sub-pixel, which means that the annular partition portion surrounds an effective light emitting region of the sub-pixel, that is, the annular partition portion surrounds a pixel opening of the sub-pixel; for another example, between adjacent sub-pixels refers to between effective light emitting regions of adjacent sub-pixels, that is, between pixel openings of adjacent sub-pixels.

For example, a material of the pixel definition layer may include an organic material such as polyimide, acrylic, or polyethylene terephthalate.

In some examples, as shown in FIG. 2, the partition structure 140 may be a partition post and may be of a single-layer structure or a multi-layer structure; for example, the partition structure 140 may include a first isolation portion 1405 and a second isolation portion 1406 which are stacked and the first isolation portion 1405 is located on a side of the second isolation portion 1406 close to the base substrate 110; the second isolation portion 1406 has a first projection portion (i.e., a protrusion portion) 1407 beyond (protruding from) the first isolation portion 1405 in an arrangement direction of two adjacent sub-pixels 200, and the conductive sub-layer 129 of the light emitting functional layer 120 is disconnected at the first projection portion 1407. Therefore, the partition structure may achieve a disconnection of the conductive sub-layer of the light emitting functional layer. The partition structure according to the embodiment of the present disclosure is not limited to a form of the partition post described above, and in another implementation mode, another structure that may achieve the disconnection of the conductive sub-layer of the light emitting functional layer may be adopted for the partition structure, such as a groove form. In addition, the arrangement direction of two adjacent sub-pixels may be an extension direction of a connection line between brightness centers of the two adjacent sub-pixels.

In some examples, as shown in FIG. 2, the plurality of sub-pixels 200 share the second electrode 132 and the second electrode 132 is disconnected at a position where the partition structure 140 is located. However, the embodiment of the present disclosure includes, but is not limited thereto, and the second electrode may also be not disconnected at the position where the partition structure is located.

In some examples, as shown in FIG. 2, the light emitting functional layer 120 includes a first emitting layer 121 and a second emitting layer 122 located on two sides of the conductive sub-layer 129 in a direction perpendicular to the base substrate 110, and the conductive sub-layer 129 is the charge generation layer. Therefore, the display substrate may achieve a double-layer light emitting (Tandem EL) design, and thus has advantages of long life, low power consumption, high brightness, and the like. In the example of FIG. 2, the light emitting functional layer 120 includes two emitting layers, and in another implementation mode, the light emitting functional layer 120 may include more than two emitting layers, for example, may include three emitting layers, wherein two emitting layers (for example, which may be a red emitting layer and a green emitting layer) may be disposed adjacent and located on a side of the charge generation layer close to the base substrate 110, and another emitting layer (for example, which may be a blue emitting layer) may be located on a side of the charge generation layer away from the base substrate 110, and a light emitting element of each sub-pixel may be configured to emit white light, and color display may be achieved through a set color film layer.

In some examples, as shown in FIG. 2, the first emitting layer 121 and the second emitting layer 122 in the light emitting functional layer 120 may also be disconnected at the position where the partition structure 140 is located. In another implementation mode, a first emitting layer 121 and a second emitting layer 122 of each sub-pixel may be located only within a pixel opening of the sub-pixel. However, the embodiment of the present disclosure includes, but is not limited thereto, the first emitting layer and the second emitting layer in the light emitting functional layer may not be disconnected at the position where the partition structure is located, but only the conductive sub-layer is disconnected at the position where the partition structure is located.

In some examples, a conductivity of the conductive sub-layer 129 is greater than a conductivity of the first emitting layer 121 and a conductivity of the second emitting layer 122, and less than a conductivity of the second electrode 132.

For example, as shown in FIG. 2, the first emitting layer 121 is located on a side of the conductive sub-layer 129 close to the base substrate 110; the second emitting layer 122 is located on a side of the conductive sub-layer 129 away from the base substrate 110.

The light emitting functional layer may also include another sub-functional layer except the conductive sub-layer, the first emitting layer, and the second emitting layer, such as a hole injection layer, a hole transport layer, an electron injection layer, and an electron transport layer.

For example, materials of the first emitting layer and the second emitting layer may be selected from pyrene derivatives, anthracene derivatives, fluorene derivatives, perylene derivatives, styrene amine derivatives, and metal complexes, etc.

For example, a material of the hole injection layer may include an oxide, such as a molybdenum oxide, a titanium oxide, a vanadium oxide, a rhenium oxide, a ruthenium oxide, a chromium oxide, a zirconium oxide, a hafnium oxide, a tantalum oxide, a silver oxide, a tungsten oxide, and a manganese oxide.

For example, the material of the hole injection layer may also include an organic material such as hexocyanohexaazatriphenyl, 2, 3, 5, 6-tetrafluoro-7, 7, 8, 8-tetracyanoquinodimethane (F4TCNQ), 1, 2, 3-tris [(cyano) (4-cyano-2, 3, 5, 6-tetrafluorophenyl) methylene] cyclopropane.

For example, a material of the hole transport layer may include aromatic amines with hole transport properties, and dim ethylfluorene or carbazole materials, such as 4, 4'-bis [N-(1-naphthalenyl)-N-phenylamino]biphenyl (NPB), N, N'-bis(3-methylphenyl)-N, N'-diphenyl-[1, 1'-biphenyl]-4, 4'-diamine (TPD), 4-phenyl-4'-(9-phenylfluoren-9-yl)triphenylamine (BAFLP), 4, 4'-bis[N-(9, 9-dimethylfluoren-2-yl)-N-phenylamino]biphenyl (DFLDPBi), 4, 4'-bis(9-carbazolyl)biphenyl (CBP), 9-phenyl-3-[4-(10-phenyl-9-anthracenyl)phenyl]-9H-carbazole (PCzPA).

For example, a material of the electron transport layer may include an aromatic heterocyclic compound, such as a benzimidazole derivative, an imidazole derivative, a pyrimidine derivative, an azine derivative, a quinoline derivative, an isoquinoline derivative, a phenanthroline derivative, and the like.

For example, a material of the electron injection layer may be an alkali metal or metal and their compounds, such as Lithium Fluoride (LiF), Ytterbium (Yb), Magnesium (Mg), Calcium (Ca).

In some examples, the first electrode 131 may be made of a metal material, such as any one or more of Magnesium (Mg), Argentum (Ag), Copper (Cu), Aluminum (Al), Titanium (Ti), and Molybdenum (Mo), or an alloy of the above metals, such as an Aluminum Neodymium alloy (AlNd) or a Molybdenum Niobium alloy (MoNb), and may be of a single-layer structure or a multi-layer composite structure, such as Ti/Al/Ti, or may be of a stacked structure formed by a metal and a transparent conductive material, e.g., a reflective material, such as ITO/Ag/ITO and Mo/AlNd/ITO.

In some examples, the second electrode 132 may be made of any one or more of Magnesium (Mg), Argentum (Ag), and Aluminum (Al), or an alloy made of any one or more of the above metals, or a transparent conductive material, such as Indium Tin Oxide (ITO), or a multi-layer composite structure of a metal and a transparent conductive material.

In some examples, the charge generation layer 129 may be configured to generate carriers, transport carriers, and inject carriers. For example, a material of the charge generation layer 129 may include an n-type doped organic layer/inorganic metal oxide, such as $Alq_3$:Mg/$WO_3$, Bphen:Li/$MoO_3$, BCP:Li/$V_2O_5$, and BCP:Cs/$V_2O_5$; or, an n-type doped organic layer/organic layer, such as $Alq_3$:Li/HAT-CN; or, an n-type doped organic layer/p-type doped organic layer, such as BPhen:Cs/NPB:F4-TCNQ, $Alq_3$:Li/NPB:$FeCl_3$, TPBi:Li/NPB:$FeCl_3$, and $Alq_3$:Mg/m-MTDATA:F4-TCNQ; or, a non-doped type, such as $F_{16}$CuPc/CuPc and Al/$WO_3$/Au.

In some examples, a material of the base substrate 110 may be made of one or more materials of glass, polyimide, polycarbonate, polyacrylate, polyetherimide, polyethersulfone, the embodiment includes, but is not limited thereto.

In some examples, the base substrate may be a rigid substrate or a flexible substrate; when the base substrate is a flexible substrate, the base substrate may include a first flexible material layer, a first inorganic material layer, a semiconductor layer, a second flexible material layer, and a second inorganic material layer that are stacked sequentially. Materials of the first flexible material layer and the second flexible material layer are materials such as Polyimide (PI), Polyethylene Terephthalate (PET), or a surface-treated polymer soft film. Materials of the first inorganic material layer and the second inorganic material layer are Silicon Nitride (SiNx) or Silicon Oxide (SiOx), etc., which are used for improving water and oxygen resistance of the base substrate. The first inorganic material layer and the second inorganic material layer are also referred to as Barrier layers. A material of the semiconductor layer is amorphous silicon (a-si).

For example, taking a case that the base substrate is of a stacked structure PI1/Barrier1/a-si/PI2/Barrier2 as an example, a preparation process of the base substrate includes: firstly, coating a layer of polyimide on a glass carrier plate, forming a first flexible (PI1) layer after curing to form a film; then, depositing a layer of barrier thin film on the first flexible layer to form a first barrier (Barrier1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, forming a second flexible (PI2) layer after curing to form a film; then depositing a layer of barrier thin film on the second flexible layer to form a second barrier (Barrier2) layer covering the second flexible layer, thereby finally completing preparation of the base substrate.

In some examples, as shown in FIG. 1, the plurality of sub-pixels 200 include a plurality of first-color sub-pixels 201, a plurality of second-color sub-pixels 202, and a plurality of third-color sub-pixels 203; the partition structure 140 includes a plurality of first annular partition portions 141, each of the first annular partition portions 141 is disposed around one of the second-color sub-pixels 202, and each of the first annular partition portions 141 is in a closed ring shape. Thus, the charge generation layer 129 in the light emitting functional layer 120 may be disconnected at a first annular partition portion 141, and the first annular partition portion 141 may separate a second-color sub-pixel 202 from other sub-pixels, thereby avoiding crosstalk between the second-color sub-pixel and adjacent sub-pixels. In addition, although a first annular partition shown in FIG. 2 is disposed around only one second-color sub-pixel, the embodiment of the present disclosure includes, but is not limited thereto, and in another implementation mode, the first annular partition may surround two or more second-color sub-pixels.

For example, as shown in FIG. 1, the first annular partition portion 141 is disposed around one of the second-color sub-pixels 202. Thus, the charge generation layer 129 in the light emitting functional layer 120 may be disconnected at the first annular partition portion 141, and the first annular partition portion 141 may separate each second-color sub-pixel 202 from other sub-pixels.

For example, as shown in FIG. 1, in the display substrate 100, a quantity of second-color sub-pixels 202 is greater than a quantity of first-color sub-pixels 201; or, the quantity of second-color sub-pixels 202 is greater than a quantity of third-color sub-pixels 203; or, the quantity of second-color sub-pixels 202 is greater than the quantity of first-color sub-pixels 201 and greater than the quantity of third-color sub-pixels 203. Thus, by disposing the first annular partition portions 141 on an outer side of the second-color sub-pixels 202, most of adjacent sub-pixels on the display substrate may be separated, thereby effectively avoiding crosstalk between the adjacent sub-pixels.

For example, as shown in FIG. 1, in the display substrate 100, a quantity of second-color sub-pixels 202 is approximately twice that of first-color sub-pixels 201 or third-color sub-pixels 203.

In some examples, as shown in FIG. 1, the partition structure 140 includes a plurality of first annular partition portions 141, each of the first annular partition portions 141 is disposed around one of the second-color sub-pixels 202, and the plurality of first annular partition portions 141 may all be in a closed ring shape; the partition structure 140 may further include a plurality of first strip-shaped partition portions 144 and a plurality of second strip-shaped partition portions 145; the first strip-shaped partitions 144 extend along a first direction and the second strip-shaped partitions 145 extend along a second direction, and the first direction and the second direction intersect; a first strip-shaped partition portion 144 connects two first annular partition portions 141 adjacent in the first direction, and a second strip-shaped partition portion 145 connects two first annular partition portions 141 adjacent in the second direction; the plurality of first strip-shaped partition portions 144 and the plurality of second strip-shaped partition portions 145 connect the plurality of first annular partition portions 141 to form a plurality of first grid structures 161 and a plurality of second grid structures 162 in a region outside the plurality of first annular partition portions 141, a first grid structure 161 is disposed around a first-color sub-pixel 201, and a second grid structure 162 is disposed around a third-color sub-pixel 203. Thereby, a first strip-shaped partition portion may separate a first-color sub-pixel and a third-color sub-pixel adjacent in the second direction, so that the charge generation layer in the light emitting functional layer is disconnected at a position where the first strip-shaped partition portion is located, thereby effectively avoiding crosstalk between the first-color sub-pixel and the third-color sub-pixel adjacent in the second direction; a second strip-shaped partition portion may separate a first-color sub-pixel and a third-color sub-pixel adjacent in the first direction, so that the charge generation layer in the light emitting functional layer is disconnected at a position where the second strip-shaped partition portion is located, thereby effectively avoiding crosstalk between the first-color sub-pixel and the third-color sub-pixel adjacent in the first direction.

For example, the first direction and the second direction intersect, for example, the first direction and the second direction are perpendicular to each other.

In some examples, as shown in FIG. 1, the display substrate 100 further includes a plurality of spacers 170; the plurality of first strip-shaped partition portions 144 and the plurality of second strip-shaped partition portions 145 connect the plurality of first annular partition portions 141 and further form a plurality of third grid structures 163 in a region outside the plurality of first annular partition portions 141, a third grid structure 163 is disposed around a first-color sub-pixel 201 and a third-color sub-pixel 203 which are adjacent, and a spacer 170 is located within the third grid structure 163 and between the first-color sub-pixel 201 and the third-color sub-pixel 203. Therefore, when space within the first grid structure and the second grid structure is insufficient to place a spacer, sufficient space for placing the spacer may be provided by disposing the third grid structure as described above; in addition, since the spacer has a certain height and is located between the first-color sub-pixel and the third-color sub-pixel in the third grid structure, the spacer may also prevent crosstalk between the first-color sub-pixel and the third-color sub-pixel in the third grid structure. The plurality of spacers are used for supporting an evaporation mask (a mask used in an evaporation process) for manufacturing the light emitting functional layer (such as an emitting layer) described above. In another implementation mode, the spacer may be located within the first grid structure or within the second grid structure.

In some examples, as shown in FIG. 1, the plurality of first-color sub-pixels 201 and the plurality of third-color sub-pixels 203 are alternately disposed along both the first direction and the second direction and form a plurality of first pixel rows 310 and a plurality of first pixel columns 320, and the plurality of second-color sub-pixels 202 are sequentially arranged along both the first direction and the second direction and form a plurality of second pixel rows 330 and a plurality of second pixel columns 340; the plurality of first pixel rows 310 and the plurality of second pixel rows 330 are alternately disposed along the second direction and a plurality of sub-pixels of a first pixel row 310 and a plurality of sub-pixels of a second pixel row 330 are staggered in the first direction, and the plurality of first pixel columns 320 and the plurality of second pixel columns 340 are alternately disposed along the first direction and a plurality of sub-pixels of a first pixel column 320 and a plurality of sub-pixels of a second pixel column 340 are staggered in the second direction.

In some examples, as shown in FIG. 1, the partition structure 140 is located between a first-color sub-pixel 201 and a third-color sub-pixel 203 which are adjacent, and/or, the partition structure 140 is located between a second-color sub-pixel 202 and a third-color sub-pixel 203 which are adjacent, and/or, the partition structure 140 is located between a first-color sub-pixel 201 and a second-color sub-pixel 202 which are adjacent.

In some examples, a light emitting efficiency of a third-color sub-pixel is less than a light emitting efficiency of a second-color sub-pixel.

For example, a first-color sub-pixel 201 is configured to emit red light, a second-color sub-pixel 202 is configured to emit green light, and a third-color sub-pixel 203 is configured to emit blue light. Of course, the embodiment of the present disclosure includes, but is not limited thereto.

In some examples, as shown in FIG. 1, a shape of an orthographic projection of an effective light emitting region of a first-color sub-pixel 201 on the base substrate 110 includes a rounded rectangle; a shape of an orthographic projection of an effective light emitting region of a second-color sub-pixel 202 on the base substrate 110 includes a rounded rectangle; a shape of an orthographic projection of an effective light emitting region of a third-color sub-pixel 203 on the base substrate 110 includes a rounded rectangle.

In some examples, as shown in FIG. 1, a shape of an orthographic projection of an effective light emitting region of a third-color sub-pixel 203 on the base substrate 110 includes a plurality of rounded corner portions, the plurality of rounded corner portions include a first rounded corner portion 2031, and an arc radius of the first rounded corner portion 2031 is larger than that of another rounded corner portion. At this time, since the arc radius of the first rounded corner portion 2031 is relatively large, space occupied by the first rounded corner portion 2031 is relatively small. Therefore, a spacer 170 may be disposed near the first rounded corner portion 2031, so that an area on the display substrate may be fully utilized to increase a pixel density. At this time, the first rounded corner portion 2031 is a rounded corner portion with a smallest distance from a first-color sub-pixel 201 among the plurality of rounded corner portions of the third-color sub-pixel 203.

In some examples, as shown in FIG. 1, an orthographic projection of the spacer 170 on the base substrate 110 is located on a connection line between a midpoint of the first rounded corner portion 2031 and a brightness center of the first-color sub-pixel 201.

In some examples, as shown in FIG. 1, a shape of an orthographic projection of an effective light emitting region of a third-color sub-pixel 203 on the base substrate 110 includes a plurality of rounded corner portions, the plurality of rounded corner portions include a first rounded corner portion 2031 and a second rounded corner portion 2032, an arc radius of the first rounded corner portion 2031 is larger than an arc radius of the second rounded corner portion 2032; and, the shape of the orthographic projection of the effective light emitting region of the third-color sub-pixel 203 on the base substrate 110 is axially symmetric with respect to a connection line between the first rounded corner portion 2031 and the second rounded corner portion 2032.

Figure 3:
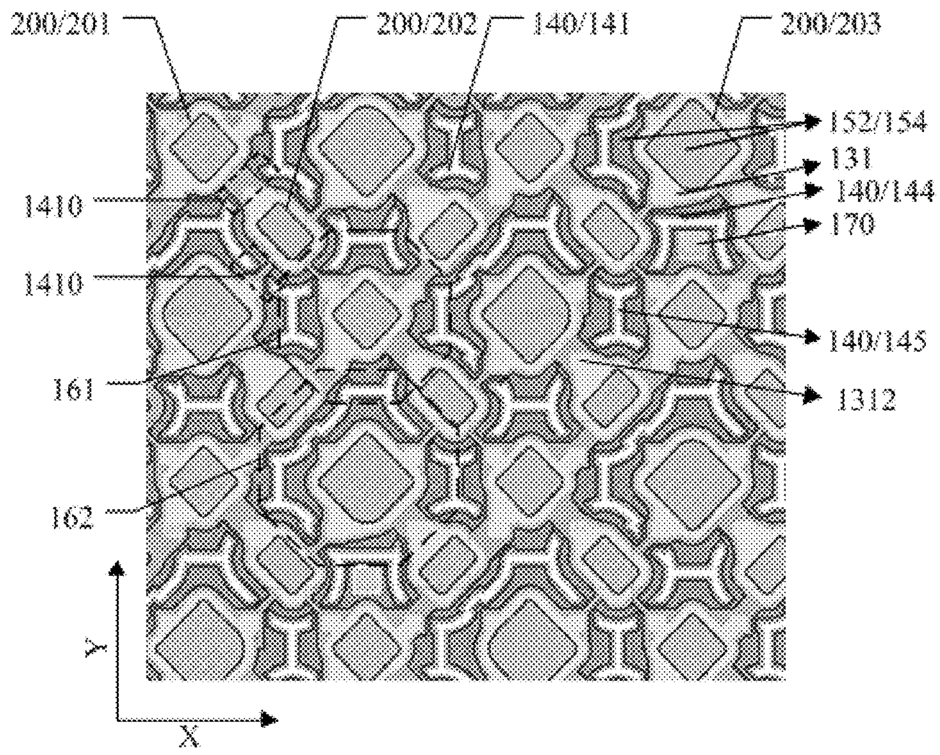
FIG. 3 is a schematic plan view of another display substrate according to an embodiment of the present disclosure.

FIG. 3 is a schematic plan view of another display substrate according to an embodiment of the present disclosure. As shown in FIG. 3, a first annular partition portion 141 includes at least one first notch 1410 (i.e., the first annular partition portion 141 is provided with at least one first notch 1410). When a second-color sub-pixel is externally provided with the first annular partition portion, not only the charge generation layer in the light emitting functional layer produces a fracture at the first annular partition portion, but also a second electrode above the light emitting functional layer may be fractured at a position where the first annular partition portion is located, thus causing a cathode signal to be unable to be transmitted to the second-color sub-pixel. Therefore, by disposing at least one notch on the first annular partition portion, the second electrode may be prevented from being fractured at the position where the first annular partition portion is located, and the first annular partition portion may be prevented from completely isolating the second-color sub-pixel, thereby avoiding a phenomenon that the cathode signal cannot be transmitted among a plurality of sub-pixels.

In some examples, as shown in FIG. 3, a second-color sub-pixel 202 is surrounded by two first-color sub-pixels 201 and two third-color sub-pixels 203; exemplarily, at least one first annular partition portion 141 is provided with four first notches 1410, among the four first notches 1410, at least one first notch 1410 is located between a second-color sub-pixel 202 and a first-color sub-pixel 201, and at least one first notch 1410 is located between a second-color sub-pixel 202 and a third-color sub-pixel 203, for example, the four first notches 1410 are respectively located between a second-color sub-pixel 202 and two first-color sub-pixels 201 adjacent thereto, and between a second-color sub-pixel 202 and two third-color sub-pixels 203 adjacent thereto. Therefore, by disposing the aforementioned first notches, a second electrode or cathode between a second-color sub-pixel and surrounding sub-pixels may be made not to be disconnected, thereby facilitating transmission of a cathode signal. In addition, although the first annular partition portion is provided with the above-mentioned first notches, since a size of a first notch is relatively small, a resistance of a conductive sub-layer (for example, a charge generation layer) at a position of the first notch may be greatly increased, thereby effectively hindering passage of a current, thereby effectively avoiding crosstalk between adjacent sub-pixels. Moreover, since a conductivity of the second electrode is greater than that of the conductive sub-layer, and a plurality of sub-pixels share the second electrode and a plurality of conductive channels exist, transmission of the cathode signal is not hindered even if the size of the first notch is relatively small.

In some examples, the display substrate further includes a plurality of pixel drive circuits, a pixel drive circuit is connected with the first electrode and is configured to drive the light emitting element to emit light; the first electrode includes a main body portion and a connection portion connected with the main body portion, and is configured to be electrically connected with the pixel drive circuit, at least part of the connection portion is located at a position where a notch of the annular partition portion is located.

Exemplarily, as shown in FIG. 3, a first electrode 131 of a second-color sub-pixel 202 includes an electrode main body portion and an electrode connection portion 1312, the electrode connection portion 1312 is configured to be electrically connected with a pixel drive circuit, an orthographic projection of the electrode connection portion 1312 on the base substrate 110 is at least partially overlapped with an orthographic projection of a first notch 1410 of a first annular partition portion 141 on the base substrate 110, i.e., at least part of the electrode connection portion 1312 is located at a position where the first notch 1410 of the first annular partition portion 141 is located. Thus, in the display substrate, the electrode connection portion may be disposed by using the position where the first notch of the first annular partition portion is located, so that a sub-pixel layout may be more compact and a pixel density may be improved.

In some examples, as shown in FIG. 3, the first electrode 131 of the first-color sub-pixel 201 also includes an electrode main body portion and an electrode connection portion 1312, the electrode connection portion 1312 is configured to be electrically connected with a pixel drive circuit; a first electrode 131 of a third-color sub-pixel 203 also includes an electrode main body portion and an electrode connection portion 1312, and the electrode connection portion 1312 is configured to be electrically connected with a pixel drive circuit; orthographic projections of electrode connection portions 1312 of the first-color sub-pixel 201 and the third-color sub-pixel 203 on the base substrate 110 are also at least partially overlapped with the orthographic projection of the first notch 1410 of the first annular partition portion 141 on the base substrate 110. Thus, in the display substrate, the electrode connection portions of the first-color sub-pixel and the third-color sub-pixel may be disposed by further using the position where the first notch of the first annular partition portion is located, so that the sub-pixel layout may be more compact and the pixel density may be improved.

In some examples, as shown in FIG. 3, the partition structure 140 further includes a plurality of first strip-shaped partition portions 144 and a plurality of second strip-shaped partition portions 145; the first strip-shaped partition portions 144 extend along the first direction and the second strip-shaped partition portions 145 extend along the second direction; a first strip-shaped partition portion 144 connects two first annular partition portions 141 adjacent in the first direction, and a second strip-shaped partition portion 145 connects two first annular partition portions 141 adjacent in the second direction. The plurality of first strip-shaped partition portions 144 and the plurality of second strip-shaped partition portions 145 connect the plurality of first annular partition portions 141 to form a plurality of first grid structures 161 and a plurality of second grid structures 162 in a region outside the plurality of first annular partition portions 141, a first grid structure 161 is disposed around a first-color sub-pixel 201, and a second grid structure 162 is disposed around a third-color sub-pixel 203. Thus, a first strip-shaped partition portion may separate a first-color sub-pixel and a third-color sub-pixel adjacent in the second direction, so that the charge generation layer in the light emitting functional layer is disconnected at a position where the first strip-shaped partition portion is located, thereby effectively avoiding crosstalk between the first-color sub-pixel and the third-color sub-pixel adjacent in the second direction; a second strip-shaped partition portion may separate a first-color sub-pixel and a third-color sub-pixel adjacent in the first direction, so that the charge generation layer in the light emitting functional layer is disconnected at a position where the second strip-shaped partition portion is located, thereby effectively avoiding crosstalk between the first-color sub-pixel and the third-color sub-pixel adjacent in the first direction.

For example, the first direction and the second direction intersect, for example, the first direction and the second direction are perpendicular to each other.

In some examples, as shown in FIG. 3, the first notch 1410 of the first annular partition portion 141 also serves as a notch of a first grid structure 161 and a notch of a second grid structure 162. Thus, a second electrode of a first-color sub-pixel 201 located in the first grid structure 161 and a second electrode of a third-color sub-pixel 203 located in the second grid structure 162 are not completely disconnected, thereby facilitating transmission of a cathode signal.

In some examples, as shown in FIG. 3, the display substrate 100 further includes a plurality of spacers 170; a spacer 170 is located within a first grid structure 161 and between a first-color sub-pixel 201 and a third-color sub-pixel 203. When space within the first grid structure is sufficient to place the spacer, the spacer may be placed directly in the first grid structure. The embodiment of the present disclosure includes, but is not limited thereto, and in another implementation mode, the spacer may be located within a second grid structure. In addition, "within a grid structure" mentioned above refers to being within space surrounded by the grid structure, rather than within the grid structure itself.

Figure 4:
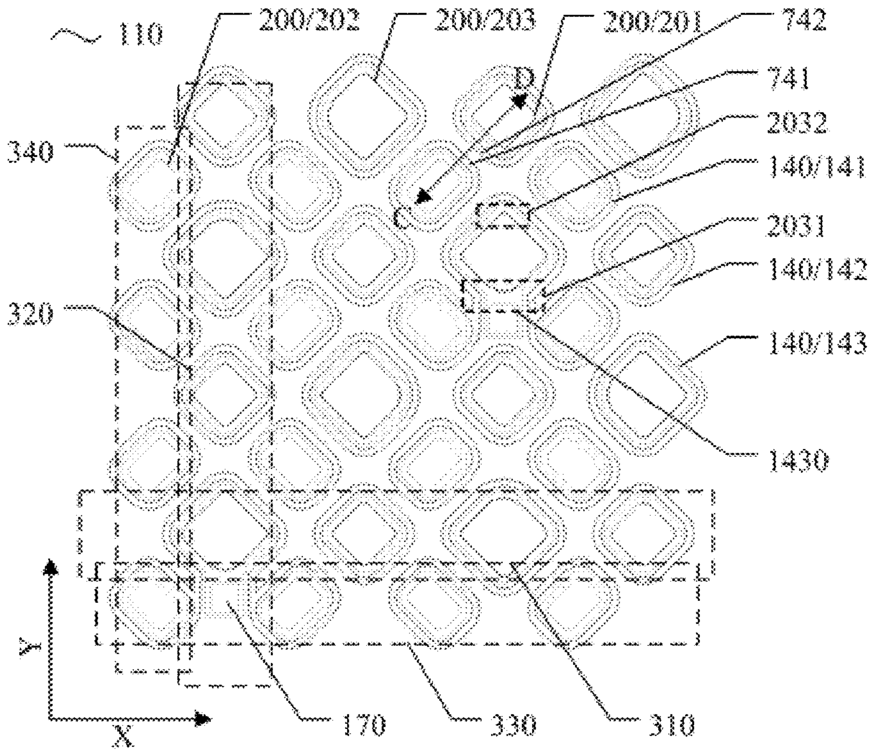
FIG. 4 is a schematic plan view of another display substrate according to an embodiment of the present disclosure.

FIG. 4 is a schematic plan view of another display substrate according to an embodiment of the present disclosure. As shown in FIG. 4, a plurality of sub-pixels 200 includes a plurality of first-color sub-pixels 201, a plurality of second-color sub-pixels 202, and a plurality of third-color sub-pixels 203; a partition structure 140 includes a plurality of first annular partition portions 141, a plurality of second annular partition portions 142, and a plurality of third annular partition portions 143; a first annular partition portion 141 is disposed around one of the second-color sub-pixels 202; a second annular partition portion 142 is disposed around one of the first-color sub-pixels 201; a third annular partition portion 143 is disposed around one of the third-color sub-pixels 203.

In the display substrate shown in FIG. 4, a charge generation layer 129 in a light emitting functional layer 120 may be disconnected at the first annular partition portion 141, the second annular partition portion 142, and the third annular partition portion 143, the first annular partition portion 141 may separate a second-color sub-pixel 202 from other sub-pixels, so that crosstalk between the second-color sub-pixel and adjacent sub-pixels may be avoided; the second annular partition portion 142 may separate a first-color sub-pixel 201 from other sub-pixels, so that crosstalk between the first-color sub-pixel and adjacent sub-pixels may be avoided; the third annular partition portion 143 may separate a third-color sub-pixel 203 from other sub-pixels, so that crosstalk between the third-color sub-pixel and adjacent sub-pixels may be avoided.

Figure 5:
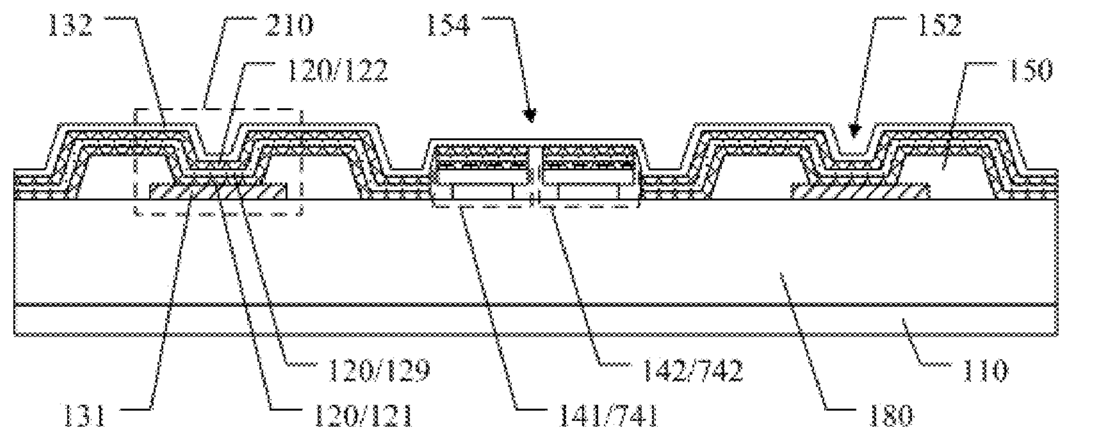
FIG. 5 is a schematic sectional view of a display substrate taken along a CD direction in FIG. 4 according to an embodiment of the present disclosure.

FIG. 5 is a schematic sectional view of a display substrate taken along a CD direction in FIG. 4 according to an embodiment of the present disclosure. As shown in FIG. 5, a partition structure 140 between a first-color sub-pixel 201 and a second-color sub-pixel 202 includes a part of a first annular partition portion 141 and a part of a second annular partition portion 142; at this time, the part of the first annular partition portion 141 may serve as a first sub-partition structure 741 of the partition structure 140, and the part of the second annular partition portion 142 may serve as a second sub-partition structure 742 of the partition structure 140. The first sub-partition structure 741 and the second sub-partition structure 742 are sequentially disposed in an arrangement direction of adjacent sub-pixels 200. When a charge generation layer in a light emitting functional layer is not disconnected or completely disconnected at a position where the first sub-partition structure is located, the charge generation layer in the light emitting functional layer may be disconnected at a position where the second sub-partition structure is located. Thus, by sequentially disposing the first sub-partition structure and the second sub-partition structure in the arrangement direction of adjacent sub-pixels, in the display substrate, the charge generation layer in the light emitting functional layer may be better disconnected at a position where the partition structure is located, thereby further avoiding crosstalk between adjacent sub-pixels caused by a charge generation layer with a relatively high conductivity. Of course, the embodiment of the present disclosure includes, but is not limited thereto, and only one sub-partition structure may be disposed when a separation distance between adjacent sub-pixels is relatively small.

In some examples, as shown in FIG. 4, the display substrate 100 may further include a plurality of spacers 170 that are configured to support an evaporation mask for manufacturing the light emitting functional layer; a spacer 170 may be located between a first-color sub-pixel 201 and a third-color sub-pixel 203 which are adjacent and between two adjacent second-color sub-pixels 202. A second annular partition portion 142 or/and a third annular partition portion 143 close to the spacer 170 are provided with a notch on a side facing the spacer 170, and two of the first annular partition portions 141 close to the spacer 170 are not provided with a notch on a side facing the spacer 170.

Exemplarily, as shown in FIG. 4, the first annular partition portion 141 and the second annular partition portion 142 are both complete annular structures and don't include a notch; while the third annular partition portion 143 includes a third notch 1430, and two ends of the third annular partition portion 143 at the third notch 1430 are connected with two first annular partition portions 141 adjacent in the first direction or the second direction, respectively. Thus, when a pixel density of the display substrate is relatively high and the partition structure includes the first annular partition portion, the second annular partition portion, and the third annular partition portion described above, a spacing between adjacent annular partition portions may not be sufficient to accommodate a spacer; at this time, by disposing a third notch in the third annular partition portion, in the display substrate, a spacer may be disposed at a position where the third notch is located; moreover, since two ends of the third annular partition portion at the third notch are respectively connected with two first annular partition portions adjacent in the first direction or the second direction, for the display substrate, crosstalk between adjacent sub-pixels may be better avoided.

In addition, although the third notch is disposed on the third annular partition portion of the display substrate shown in FIG. 4, the embodiment of the present disclosure includes, but is not limited thereto, and the third annular partition portion may also be a complete annular structure. In addition, when the first annular partition portion, the second annular partition portion, or the third annular partition portion is a complete annular structure, the conductive sub-layer in the light emitting functional layer may be disconnected at a position where an annular partition structure is located by controlling a height, a depth, or another parameter of the annular partition structure, while the second electrode is not disconnected at the position where the annular partition structure is located.

In some examples, as shown in FIG. 4, a shape of an orthographic projection of an effective light emitting region of a first-color sub-pixel 201 on the base substrate 110 includes a rounded rectangle; a shape of an orthographic projection of an effective light emitting region of a second-color sub-pixel 202 on the base substrate 110 includes a rounded rectangle; a shape of an orthographic projection of an effective light emitting region of a third-color sub-pixel 203 on the base substrate 110 includes a rounded rectangle.

In some examples, as shown in FIG. 4, a shape of an orthographic projection of an effective light emitting region of a third-color sub-pixel 203 on the base substrate 110 includes a plurality of rounded corner portions, the plurality of rounded corner portions include a first rounded corner portion 2031, and an arc radius of the first rounded corner portion 2031 is larger than that of another rounded corner portion. At this time, the arc radius of the first rounded corner portion 2031 is relatively large, so that space occupied by the first rounded corner portion 2031 is relatively small, therefore the third notch 1430 of the third annular partition portion 143 may be disposed near the first rounded corner portion 2031, and the spacer 170 may be correspondingly disposed near the first rounded corner portion 2031, thus an area on the display substrate may be fully utilized and a pixel density may be improved. At this time, the first rounded corner portion 2031 is a rounded corner portion with a smallest distance from a first-color sub-pixel 201 among the plurality of rounded corner portions of the third-color sub-pixel 203.

In some examples, as shown in FIG. 4, an orthographic projection of the spacer 170 on the base substrate 110 is located on a connection line between a midpoint of the first rounded corner portion 2031 and a brightness center of a first-color sub-pixel 201.

In some examples, as shown in FIG. 4, a shape of an orthographic projection of an effective light emitting region of a third-color sub-pixel 203 on the base substrate 110 includes a plurality of rounded corner portions, the plurality of rounded corner portions include a first rounded corner portion 2031 and a second rounded corner portion 2032, an arc radius of the first rounded corner portion 2031 is larger than an arc radius of the second rounded corner portion 2032; the shape of the orthographic projection of the effective light emitting region of the third-color sub-pixel 203 on the base substrate 110 is axially symmetric with respect to a connection line between the first rounded corner portion 2031 and the second rounded corner portion 2032.

In some examples, as shown in FIG. 4, a shape of an orthographic projection of an effective light emitting region of a first-color sub-pixel 201 on the base substrate 110 also includes a plurality of rounded corner portions and arc radii of these rounded corner portions are equal.

In some examples, as shown in FIG. 4, a shape of an orthographic projection of an effective light emitting region of a second-color sub-pixel 202 on the base substrate 110 also includes a plurality of rounded corner portions and arc radii of these rounded corner portions are equal.

In some examples, as shown in FIG. 4, an area of an orthographic projection of an effective light emitting region of a third-color sub-pixel 203 on the base substrate 110 is larger than an area of an orthographic projection of an effective light emitting region of a first-color sub-pixel 201 on the base substrate 110; the area of the effective light emitting region of the first-color sub-pixel 201 on the base substrate 110 is larger than an area of an effective light emitting region of a second-color sub-pixel 202 on the base substrate 110. Of course, the embodiment of the present disclosure includes, but is not limited thereto, and an area of an effective light emitting region of a sub-pixel may be set according to actual needs.

In some examples, as shown in FIG. 4, a plurality of first-color sub-pixels 201 and a plurality of third-color sub-pixels 203 are alternately disposed along both the first direction and the second direction and form a plurality of first pixel rows 310 and a plurality of first pixel columns 320, and a plurality of second-color sub-pixels 202 are sequentially arranged along both the first direction and the second direction and form a plurality of second pixel rows 330 and a plurality of second pixel columns 340; the plurality of first pixel rows 310 and the plurality of second pixel rows 330 are alternately disposed along the second direction and a plurality of sub-pixels of a first pixel row 310 and a plurality of sub-pixels of a second pixel row 330 are staggered in the first direction, and the plurality of first pixel columns 320 and the plurality of second pixel columns 340 are alternately disposed along the first direction and a plurality of sub-pixels of a first pixel column 320 and a plurality of sub-pixels of a second pixel column 340 are staggered in the second direction.

In some examples, as shown in FIG. 4, the partition structure 140 is located between a first-color sub-pixel 201 and a third-color sub-pixel 203 which are adjacent, and/or, the partition structure 140 is located between a second-color sub-pixel 202 and a third-color sub-pixel 203 which are adjacent, and/or, the partition structure 140 is located between a first-color sub-pixel 201 and a second-color sub-pixel 202 which are adjacent.

In some examples, a light emitting efficiency of a third-color sub-pixel is less than a light emitting efficiency of a second-color sub-pixel.

For example, a first-color sub-pixel 201 is configured to emit red light, a second-color sub-pixel 202 is configured to emit green light, and a third-color sub-pixel 203 is configured to emit blue light. Of course, the embodiment of the present disclosure includes, but is not limited thereto.

Figure 6:
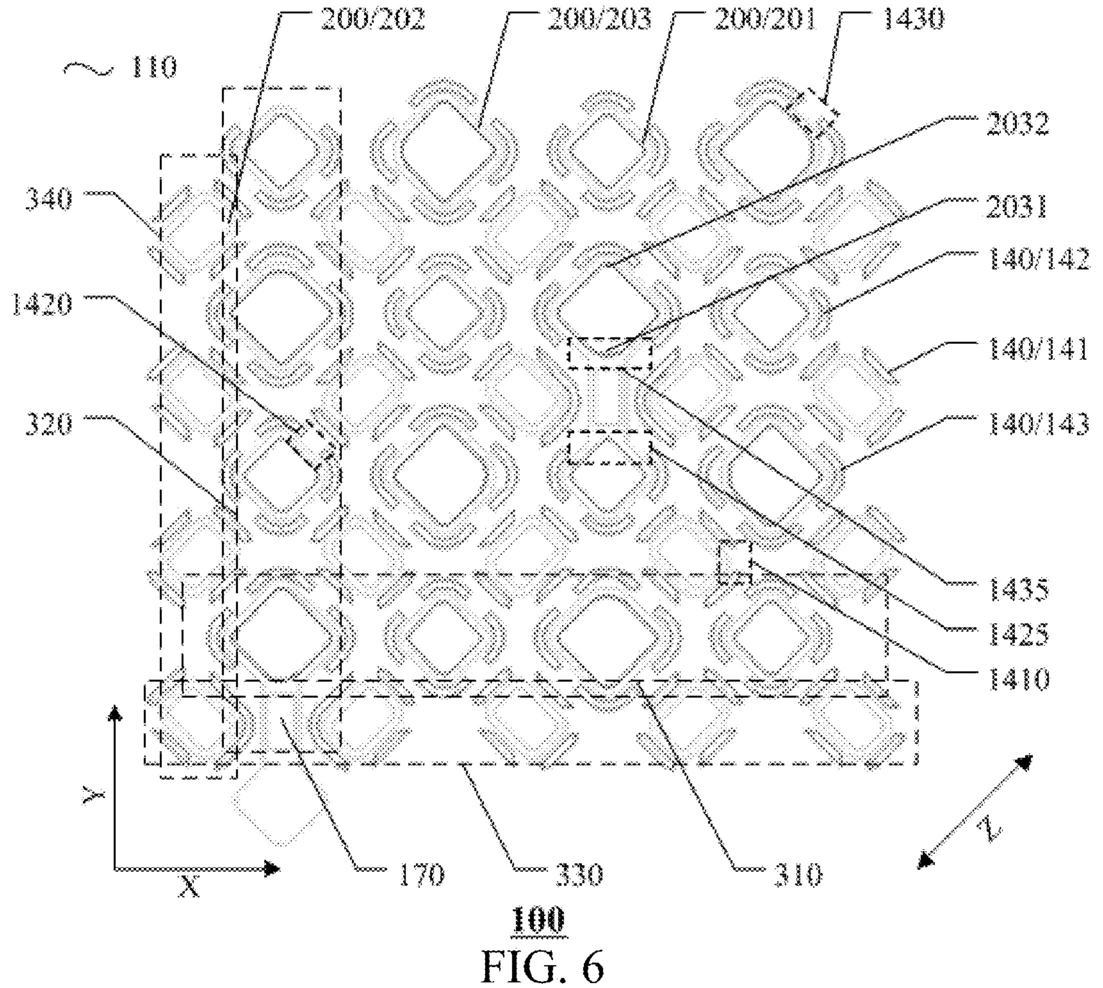
FIG. 6 is a schematic plan view of another display substrate according to an embodiment of the present disclosure.

FIG. 6 is a schematic plan view of another display substrate according to an embodiment of the present disclosure. As shown in FIG. 6, a plurality of sub-pixels 200 includes a plurality of first-color sub-pixels 201, a plurality of second-color sub-pixels 202, and a plurality of third-color sub-pixels 203; the plurality of first-color sub-pixels 201 and the plurality of third-color sub-pixels 203 are alternately disposed along both the first direction and the second direction and form a plurality of first pixel rows 310 and a plurality of first pixel columns 320, and the plurality of second-color sub-pixels 202 are sequentially arranged along both the first direction and the second direction and form a plurality of second pixel rows 330 and a plurality of second pixel columns 340; the plurality of first pixel rows 310 and the plurality of second pixel rows 330 are alternately disposed along the second direction, and a plurality of sub-pixels of a first pixel row 310 and a plurality of sub-pixels of a second pixel row 330 are staggered in the first direction, and the plurality of first pixel columns 320 and the plurality of second pixel columns 340 are alternately disposed along the first direction, and a plurality of sub-pixels of a first pixel column 320 and a plurality of sub-pixels of a second pixel column 340 are staggered in the second direction.

As shown in FIG. 6, a partition structure 140 includes a plurality of first annular partition portions 141, a plurality of second annular partition portions 142, and a plurality of third annular partition portions 143; each first annular partition portion 141 is disposed around one of the second-color sub-pixels 202; each second annular partition portion 142 is disposed around a first-color sub-pixel 201; each third annular partition portion 143 is disposed around a third-color sub-pixel 203.

In the display substrate shown in FIG. 6, a charge generation layer 129 in a light emitting functional layer 120 may be disconnected at a first annular partition portion 141, a second annular partition portion 142, and a third annular partition portion 143, the first annular partition portion 141 may separate a second-color sub-pixel 202 from other sub-pixels, so that crosstalk between the second-color sub-pixel and adjacent sub-pixels may be avoided; the second annular partition portion 142 may separate a first-color sub-pixel 201 from other sub-pixels, so that crosstalk between the first-color sub-pixel and adjacent sub-pixels may be avoided; the third annular partition portion 143 may separate a third-color sub-pixel 203 from other sub-pixels, so that crosstalk between the second-color sub-pixel and adjacent sub-pixels may be avoided.

In some examples, as shown in FIG. 6, the first annular partition portion 141 is provided with at least one first notch 1410, the second annular partition portion 142 is provided with at least one second notch 1420, and the third annular partition portion 143 is provided with at least one third notch 1430. When a second electrode above the light emitting functional layer is likely to be fractured at positions where the first annular partition portion, the second annular partition portion, and the third annular partition portion are located, in the display substrate, the first annular partition portion, the second annular partition portion, and the third annular partition portion may be prevented from completely isolating sub-pixels by disposing at least one first notch on the first annular partition portion, at least one second notch on the second annular partition portion, and at least one third notch on the third annular partition portion, thereby avoiding a phenomenon that a cathode signal cannot be transmitted.

In some examples, as shown in FIG. 6, notches of two adjacent annular partition portions of the plurality of first annular partition portions 141, the plurality of second annular partition portions 142, and the plurality of third annular partition portions 143 are staggered. In this way, it may be ensured that at least a partition structure exists between two adjacent sub-pixels, thereby effectively avoiding crosstalk between adjacent sub-pixels.

In some examples, as shown in FIG. 6, between a first-color sub-pixel 201 and a second-color sub-pixel 202 disposed adjacently, a shortest path for a charge to propagate from the first-color sub-pixel 201 to the second-color sub-pixel 202 is a position where a connection line between a center of an effective light emitting region of the first-color sub-pixel 201 and a center of an effective light emitting region of the second-color sub-pixel 202 is located. In order to effectively avoid crosstalk between the first-color sub-pixel 201 and the second-color sub-pixel 202, a partition structure may be disposed on the connection line between the center of the effective light emitting region of the first-color sub-pixel 201 and the center of the effective light emitting region of the second-color sub-pixel 202. Therefore, a first notch 1410 of a first annular partition portion 141 on an outer side of the second-color sub-pixel 202 and a second notch 1420 of a second annular partition portion 142 on an outer side of the first-color sub-pixel 201 cannot be simultaneously located on the connection line between the center of the effective light emitting region of the first-color sub-pixel 201 and the center of the effective light emitting region of the second-color sub-pixel 202. When the charge cannot propagate from the first-color sub-pixel 201 to the second-color sub-pixel 202 along the shortest path, and at least needs to bypass the first annular partition portion 141 or the second annular partition portion 142, since a propagation path of the charge is relatively long, a resistance of the charge generation layer in the light emitting functional layer is relatively large, and crosstalk between adjacent sub-pixels can also be effectively avoided.

For example, as shown in FIG. 6, between a first-color sub-pixel 201 and a second-color sub-pixel 202 disposed adjacently, a first notch 1410 of a first annular partition portion 141 is spaced from a connection line between a center of an effective light emitting region of the first-color sub-pixel 201 and a center of an effective light emitting region of the second-color sub-pixel 202. That is to say, the first notch 1410 of the first annular partition portion 141 is not disposed on the connection line between the center of the effective light emitting region of the first-color sub-pixel 201 and the center of the effective light emitting region of the second-color sub-pixel 202.

In some examples, as shown in FIG. 6, similarly, between a third-color sub-pixel 203 and a second-color sub-pixel 202 disposed adjacently, in order to effectively avoid crosstalk between the third-color sub-pixel 203 and the second-color sub-pixel 202, a partition structure may also be disposed on a connection line between a center of an effective light emitting region of the third-color sub-pixel 203 and a center of an effective light emitting region of the second-color sub-pixel 202. Therefore, a first notch 1410 of a first annular partition portion 141 on an outer side of the second-color sub-pixel 202 and a third notch 1430 of a third annular partition portion 143 on an outer side of the third-color sub-pixel 203 cannot be simultaneously located on the connection line between the center of the effective light emitting region of the third-color sub-pixel 203 and the center of the effective light emitting region of the second-color sub-pixel 202.

For example, as shown in FIG. 6, between a third-color sub-pixel 203 and a second-color sub-pixel 202 disposed adjacently, a first notch 1410 of a first annular partition portion 141 is spaced from a connection line between a center of an effective light emitting region of the third-color sub-pixel 203 and a center of an effective light emitting region of the second-color sub-pixel 202. That is to say, the first notch 1410 of the first annular partition portion 141 is not disposed on the connection line between the center of the effective light emitting region of the third-color sub-pixel 203 and the effective light emitting region of the second-color sub-pixel 202.

In some examples, as shown in FIG. 6, in a first annular partition portion 141 and a second annular partition portion 142 disposed adjacently in a third direction Z, a first notch 1410 in at least one first notch 1410 of the first annular partition portion 141 closest to the second annular partition portion 142 and a second notch 1420 in at least one second notch 1420 of the second annular partition portion 142 closest to the first annular partition portion 141 are staggered in the third direction Z.

The third direction intersects with the first direction and the second direction, respectively, and is located on a same plane with the first direction and the second direction; for example, the third direction may be an extension direction of a connection line between centers of effective light emitting regions of a first-color sub-pixel and a second-color sub-pixel which are adjacent.

In some examples, as shown in FIG. 6, in a first annular partition portion 141 and a third annular partition portion 143 disposed adjacently in the third direction Z, a first notch 1410 in at least one first notch 1410 of the first annular partition portion 141 closest to the third annular partition portion 143 and a third notch 1430 in at least one third notch 1430 of the third annular partition portion 143 closest to the first annular partition portion 141 are also staggered in the third direction Z.

In some examples, as shown in FIG. 6, a shape of an orthographic projection of an effective light emitting region of a second-color sub-pixel 202 on the base substrate 110 includes a rounded rectangle including four rounded corners; at this time, a first annular partition portion 141 includes four first notches 1410 and these four first notches 1410 are respectively disposed corresponding to four rounded corners of the effective light emitting region of the second-color sub-pixel 202. A shape of an orthographic projection of an effective light emitting region of a first-color sub-pixel 201 on the base substrate includes a rounded rectangle including four sides; at this time, a second annular partition portion 142 includes four second notches 1420 and these four second notches 1420 are respectively disposed corresponding to four sides of the effective light emitting region of the first-color sub-pixel 201. A shape of an orthographic projection of an effective light emitting region of a third-color sub-pixel 203 on the base substrate includes a rounded rectangle including four sides; at this time, a third annular partition portion 143 includes four third notches 1430 and these four third notches 1430 are respectively disposed corresponding to four sides of the effective light emitting region of the third-color sub-pixel 203. With this arrangement, in the display substrate, it may be ensured that notches of annular partition portions on an outer side of two adjacent sub-pixels are staggered, thereby ensuring that at least a partition structure exists between the two adjacent sub-pixels.

In some examples, as shown in FIG. 6, the display substrate 100 further includes a spacer 170; at this time, an annular partition portion near the spacer 170 is different from an annular partition portion at another position. The spacer 170 is surrounded by one first-color sub-pixel 201, two second-color sub-pixels 202, and one third-color sub-pixel 203; the first-color sub-pixel 201 and the third-color sub-pixel 203 are respectively disposed on two sides of the spacer 170 along a second direction Y; the two second-color sub-pixels 202 are respectively provided on two sides of the spacer 170 along a first direction X.

In some examples, as shown in FIG. 6, a first spacer notch 1425 is included at a position of a second annular partition portion 142 on an outer side of a first-color sub-pixel 201 near a spacer 170, and a second spacer notch 1435 is included at a position of a third annular partition portion 143 on an outer side of a third-color sub-pixel 203 near a spacer 170. Thereby, the display substrate may provide sufficient space for placing a spacer. Moreover, since the spacer itself also has a certain partition function, the aforementioned spacer notches will not cause crosstalk between the first-color sub-pixel and the third-color sub-pixel.

In some examples, as shown in FIG. 6, since the second annular partition portion 142 is provided with the aforementioned first spacer notch 1425, the third partition portion 143 is provided with the aforementioned second spacer notch 1435; two first annular partition portions 141 located on two sides of the spacer 170 are not provided with notches at positions close to the spacer 170, thus crosstalk between adjacent sub-pixels may be effectively avoided.

In some examples, as shown in FIG. 6, a size of the spacer 170 in the second direction Y is greater than a size of the spacer 170 in the first direction X.

For example, as shown in FIG. 6, a shape of an orthographic projection of an effective light emitting region of a third-color sub-pixel 203 on the base substrate 110 includes a plurality of rounded corner portions, the plurality of rounded corner portions include a first rounded corner portion 2031, and an arc radius of the first rounded corner portion 2031 is larger than that of another rounded corner portion. At this time, the arc radius of the first rounded corner portion 2031 is relatively large, so that space occupied by the first rounded corner portion 2031 is relatively small, therefore a second spacer notch 1435 may be disposed near the first rounded corner portion 2031, and an area on the display substrate may be fully utilized and a pixel density may be improved. At this time, the first rounded corner portion 2031 is a rounded corner portion with a smallest distance from a first-color sub-pixel 201 among the plurality of rounded corner portions of the third-color sub-pixel 203.

In some examples, as shown in FIG. 6, a shape of an orthographic projection of an effective light emitting region of a third-color sub-pixel 203 on the base substrate 110 includes a plurality of rounded corner portions, the plurality of rounded corner portions include a first rounded corner portion 2031 and a second rounded corner portion 2032, an arc radius of the first rounded corner portion 2031 is larger than an arc radius of the second rounded corner portion 2032; and the shape of the orthographic projection of the effective light emitting region of the third-color sub-pixel 203 on the base substrate 110 is axially symmetric with respect to a connection line between the first rounded corner portion 2031 and the second rounded corner portion 2032.

Figure 7:
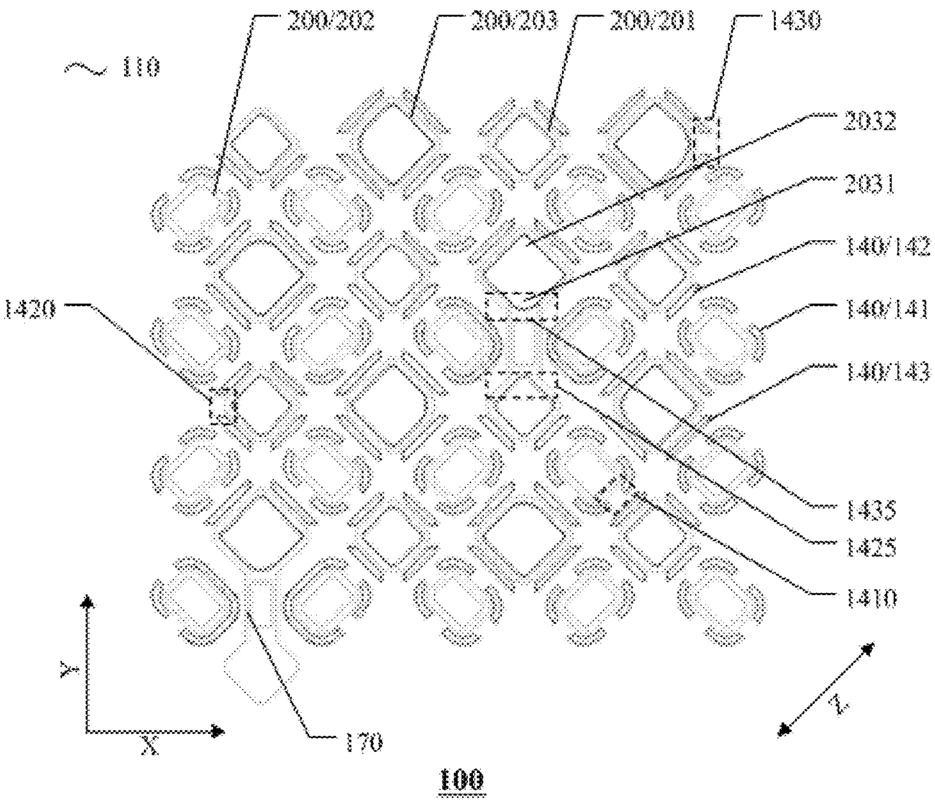
FIG. 7 is a schematic plan view of another display substrate according to an embodiment of the present disclosure.

FIG. 7 is a schematic plan view of another display substrate according to an embodiment of the present disclosure. As shown in FIG. 7, a same pixel arrangement is adopted for the display substrate shown in FIG. 7 and the display substrate shown in FIG. 6. In this case, a partition structure 140 includes a plurality of first annular partition portions 141, a plurality of second annular partition portions 142, and a plurality of third annular partition portions 143; each first annular partition portion 141 is disposed around one of the second-color sub-pixels 202; each second annular partition portion 142 is disposed around one first-color sub-pixel 201; each third annular partition portion 143 is disposed around one third-color sub-pixel 203, thus crosstalk between the second-color sub-pixel and adjacent sub-pixels may be avoided.

In some examples, as shown in FIG. 7, the first annular partition portion 141 includes at least one notch 1410, the second annular partition portion 142 includes at least one notch 1420, and the third annular partition portion 143 includes at least one notch 1430. Moreover, notches of two adjacent annular partition portions in the first annular partition portion 141, the second annular partition portion 142, and the third annular partition portion 143 are staggered, in this way, it may be ensured that at least a partition structure exists between two adjacent sub-pixels, and thus crosstalk between adjacent sub-pixels may be effectively avoided.

In some examples, as shown in FIG. 7, between a first-color sub-pixel 201 and a second-color sub-pixel 202 disposed adjacently, the second notch 1420 of the second annular partition portion 142 is spaced from a connection line between a center of an effective light emitting region of the first-color sub-pixel 201 and a center of an effective light emitting region of the second-color sub-pixel 202. That is to say, the second notch 1420 of the second annular partition portion 142 is not disposed on the connection line between the center of the effective light emitting region of the first-color sub-pixel 201 and the center of the effective light emitting region of the second-color sub-pixel 202.

In some examples, as shown in FIG. 7, between a third-color sub-pixel 203 and a second-color sub-pixel 202 disposed adjacently, the third notch 1430 of the third annular partition portion 143 is spaced from a connection line between a center of an effective light emitting region of the third-color sub-pixel 203 and a center of an effective light emitting region of the second-color sub-pixel 202. That is to say, the third notch 1430 of the third annular partition portion 143 is not disposed on the connection line between the center of the effective light emitting region of the third-color sub-pixel 203 and the center of the effective light emitting region of the second-color sub-pixel 202.

In some examples, as shown in FIG. 7, a shape of an orthographic projection of the effective light emitting region of the second-color sub-pixel 202 on the base substrate 110 includes a rounded rectangle including four sides; at this time, the first annular partition portion 141 includes four first notches 1410 and these four first notches 1410 are respectively disposed corresponding to four sides of the effective light emitting region of the second-color sub-pixel 202. A shape of an orthographic projection of the effective light emitting region of the first-color sub-pixel 201 on the base substrate includes a rounded rectangle including four rounded corners; at this time, the second annular partition portion 142 includes four second notches 1420 and these four second notches 1420 are respectively disposed corresponding to four rounded corners of the effective light emitting region of the first-color sub-pixel 201. A shape of an orthographic projection of the effective light emitting region of the third-color sub-pixel 203 on the base substrate includes a rounded rectangle including four rounded corners; at this time, the third annular partition portion 143 includes four third notches 1430 and these four third notches 1430 are respectively disposed corresponding to four rounded corners of the effective light emitting region of the third-color sub-pixel 203. With this arrangement, in the display substrate, it may be ensured that notches of annular partition portions on an outer side of two adjacent sub-pixels are staggered, thereby ensuring that at least a partition structure exists between the two adjacent sub-pixels.

In some examples, as shown in FIG. 7, the display substrate 100 further includes a spacer 170; at this time, an annular partition portion near the spacer 170 is different from an annular partition portion at another position. The spacer 170 is surrounded by one first-color sub-pixel 201, two second-color sub-pixels 202, and one third-color sub-pixel 203; the first-color sub-pixel 201 and the third-color sub-pixel 203 are respectively disposed on two sides of the spacer 170 along the second direction Y; the two second-color sub-pixels 202 are respectively disposed on two sides of the spacer 170 along the first direction X.

In some examples, as shown in FIG. 7, a first spacer notch 1425 is included at a position of a second annular partition portion 142 on an outer side of the first-color sub-pixel 201 close to the spacer 170, no partition structure is disposed at a position where the first spacer notch 1425 is located; the first spacer notch 1425 extends from a spacing between the first-color sub-pixel 201 and one second-color sub-pixel 202, passing through a spacing between the first-color sub-pixel 201 and the spacer 170, to a spacing between the first-color sub-pixel 201 and another second-color sub-pixel 202. That is to say, the second annular partition portion 142 on the outer side of the first-color sub-pixel 201 near the spacer includes only two strip-shaped partition portions. A second spacer notch 1435 is included at a position of a third annular partition portion 143 on an outer side of the third-color sub-pixel 203 close to the spacer 170, no partition structure is disposed at a position where the second spacer notch 1435 is located; the second spacer notch 1435 extends from a spacing between the third-color sub-pixel 203 and one second-color sub-pixel 202, passing through a spacing between the third-color sub-pixel 203 and the spacer 170, to a spacing between the third-color sub-pixel 203 and another second-color sub-pixel 202. That is to say, the third annular partition portion 143 on the outer side of the third-color sub-pixel 203 near the spacer includes only two strip-shaped partition portions. Thus, the display substrate may provide sufficient space for placing a spacer. Moreover, since the spacer itself also has a certain partition function, the aforementioned spacer notches will not cause crosstalk between the first-color sub-pixel and the third-color sub-pixel.

In some examples, as shown in FIG. 7, since the second annular partition portion 142 is provided with the aforementioned first spacer notch 1425, the third partition portion 143 is provided with the aforementioned second spacer notch 1435; two first annular partition portions 141 located on two sides of the spacer 170 are not provided with notches at positions close to the spacer 170, thus crosstalk between adjacent sub-pixels may be effectively avoided.

In some examples, as shown in FIG. 7, a size of the spacer 170 in the second direction Y is greater than a size of the spacer 170 in the first direction X.

Figure 8:
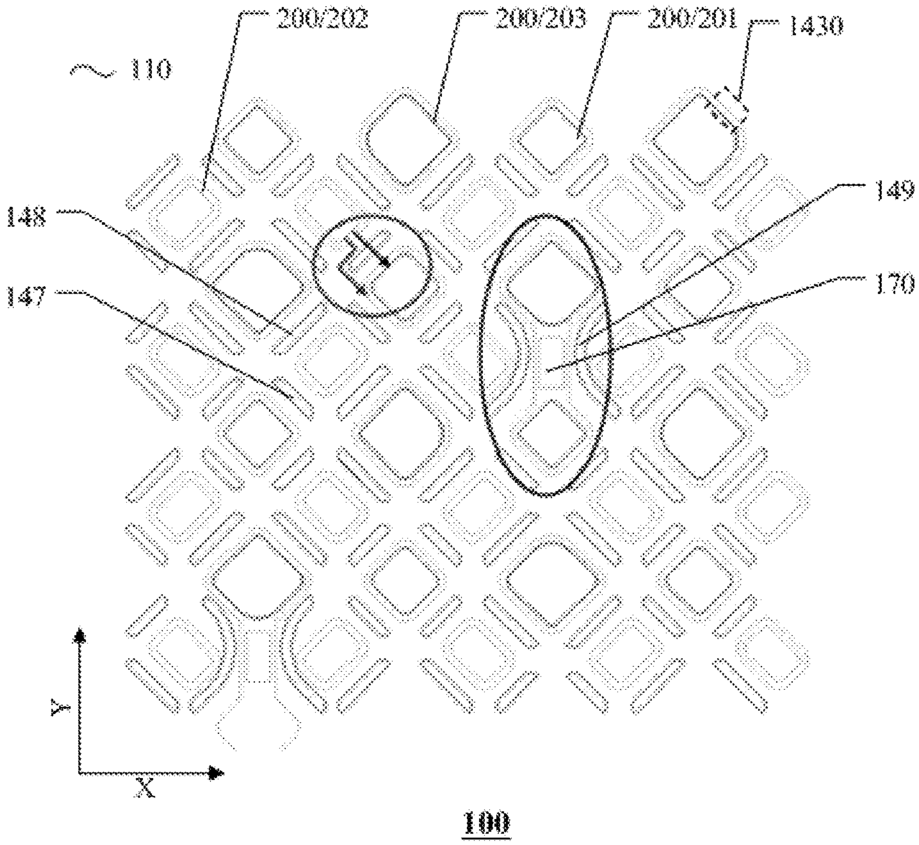
FIG. 8 is a schematic plan view of another display substrate according to an embodiment of the present disclosure.

FIG. 8 is a schematic plan view of another display substrate according to an embodiment of the present disclosure. As shown in FIG. 8, a plurality of sub-pixels 200 include a plurality of first-color sub-pixels 201, a plurality of second-color sub-pixels 202, and a plurality of third-color sub-pixels 203; the partition structure 140 includes a plurality of annular partition portions, each of the annular partition portions is disposed around one second-color sub-pixel 202, at least one of the annular partition portions is provided with a plurality of notches and includes two third strip-shaped partition portions 147 and two fourth strip-shaped partition portions 148; a third strip-shaped partition portion 147 is located between a first-color sub-pixel 201 and a second-color sub-pixel 202 which are adjacent; a fourth strip-shaped partition portion 148 is located between a third-color sub-pixel 203 and a second-color sub-pixels 202 which are adjacent; an extension direction of the third strip-shaped partition portion 147 intersects with an extension direction of the fourth strip-shaped partition portion 148.

In some examples, as shown in FIG. 8, the extension direction of the third strip-shaped partition portion 147 is perpendicular to a connection line between centers of effective light emitting regions of a first-color sub-pixel 201 and a second-color sub-pixel 202 which are adjacent; the extension direction of the fourth strip-shaped partition portion 148 is perpendicular to a connection line between centers of effective light emitting regions of a third-color sub-pixel 203 and a second-color sub-pixel 202 which are adjacent.

In some examples, as shown in FIG. 8, an orthographic projection of an effective light emitting region of a first-color sub-pixel 201 on the base substrate 110 is a rounded rectangle, and a size (i.e., length) of the third strip-shaped partition portion 147 in its extension direction is 0.8-1 times a side length of the effective light emitting region of the first-color sub-pixel 201.

In some examples, as shown in FIG. 8, an orthographic projection of an effective light emitting region of a third-color sub-pixel 203 on the base substrate 110 is a rounded rectangle, and a size (i.e., length) of the fourth strip-shaped partition portion 148 in its extension direction is 0.8-1 times a side length of the effective light emitting region of the third-color sub-pixel 203.

In some examples, as shown in FIG. 8, the display substrate 100 further includes a plurality of spacers 170 configured to support an evaporation mask for manufacturing the light emitting functional layer; a partition structure near a spacer 170 is different from a partition structure at another position. The spacer 170 is located between a first-color sub-pixel 201 and a third-color sub-pixel 203 which are adjacent and between two adjacent second-color sub-pixels 202, that is, the spacer 170 is surrounded by one first-color sub-pixel 201, two second-color sub-pixels 202, and one third-color sub-pixel 203; the first-color sub-pixel 201 and the third-color sub-pixel 203 are respectively disposed on two sides of the spacer 170 along the second direction Y; the two second-color sub-pixels 202 are respectively disposed on two sides of the spacer 170 along the first direction X. a notch is not disposed on a side, facing the spacer 170, of two of the annular partition portions close to the spacer 170.

In some examples, as shown in FIG. 8, the two of the annular partition portions close to the spacer 170 each include a third strip-shaped partition portion 147, a fourth strip-shaped partition portion 148, and an arc-shaped partition portion 149. The arc-shaped partition portion 149 is located between a second-color sub-pixel 202 and the spacer 170; moreover, the arc-shaped partition portion 149 extends from a spacing between the second-color sub-pixel 202 and the third-color sub-pixel 203 to a spacing between the second-color sub-pixel 202 and the first-color sub-pixel 201; that is to say, one end of the arc-shaped partition portion 149 is located between the second-color sub-pixel 202 and the third-color sub-pixel 203, and may function as the fourth strip-shaped partition portion 148; the other end of the arc-shaped partition portion 149 is located between the second-color sub-pixel 202 and the first-color sub-pixel 201 and may function as the third strip-shaped partition portion 147; an intermediate portion of the arc-shaped partition portion 149 is located between the second-color sub-pixel 202 and the spacer 170.

Figure 9:
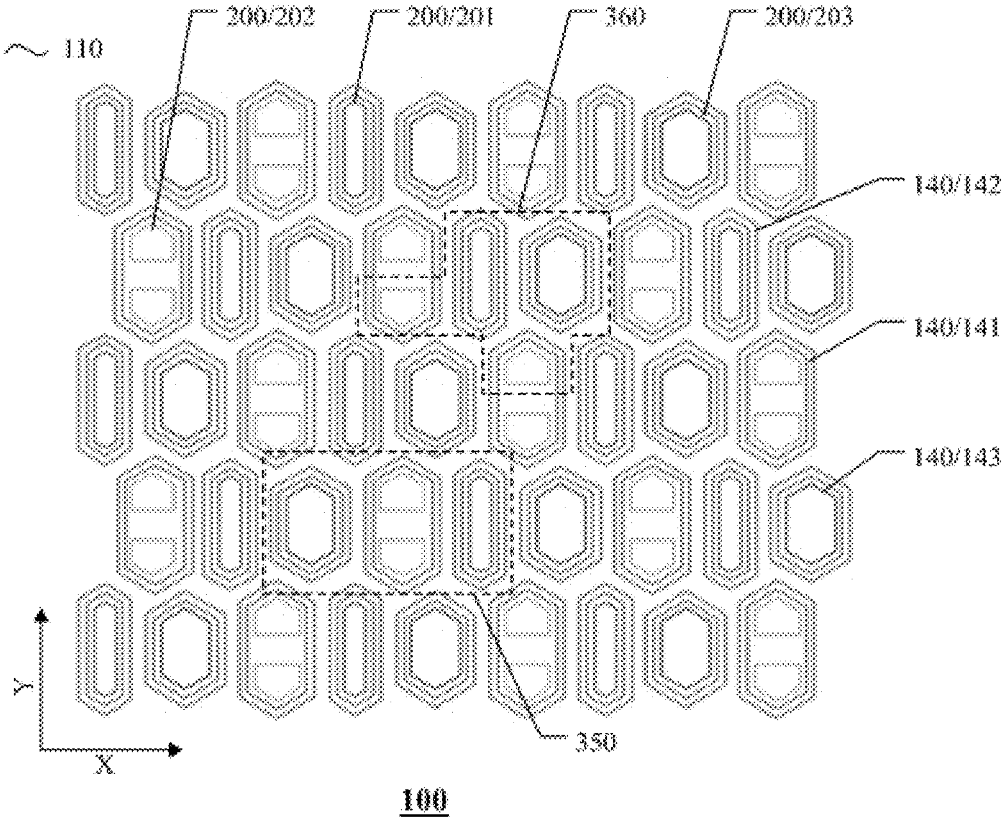
FIG. 9 is a schematic plan view of another display substrate according to an embodiment of the present disclosure.

FIG. 9 is a schematic plan view of another display substrate according to an embodiment of the present disclosure. As shown in FIG. 9, a plurality of sub-pixels 200 includes a plurality of first-color sub-pixels 201, a plurality of second-color sub-pixels 202, and a plurality of third-color sub-pixels 203; a partition structure 140 includes a plurality of first annular partition portions 141, a plurality of second annular partition portions 142, and a plurality of third annular partition portions 143; each first annular partition portion 141 is disposed around two adjacent second-color sub-pixels 202; each second annular partition portion 142 is disposed around one first-color sub-pixel 201; each third annular partition portion 143 is disposed around one third-color sub-pixel 203. Thereby, a charge generation layer 129 in a light emitting functional layer 120 may be disconnected at the first annular partition portion 141, the second annular partition portion 142, and the third annular partition portion 143, and the first annular partition portion 141 may separate two adjacent second-color sub-pixels 202 from other sub-pixels, thus crosstalk between a second-color sub-pixel and adjacent sub-pixels may be avoided; the second annular partition portion 142 may separate the first-color sub-pixel 201 from other sub-pixels, thus crosstalk between the first-color sub-pixel and adjacent sub-pixels may be avoided; the third annular partition portion 143 may separate the third-color sub-pixel 203 from other sub-pixels, thus crosstalk between the second-color sub-pixel and adjacent sub-pixels may be avoided.

In some examples, as shown in FIG. 9, two adjacent annular partition portions among the plurality of first annular partition portions 141, the plurality of second annular partition portions 142, and the plurality of third annular partition portions 143 may not have a common portion, in this way, a part of the two annular partition portions exists between two adjacent sub-pixels 200 of different colors, and thus crosstalk between adjacent sub-pixels of different colors may be further avoided.

In some examples, as shown in FIG. 9, the plurality of sub-pixels 200 are divided into a plurality of sub-pixel groups 350, each of the sub-pixel groups 350 includes one first-color sub-pixel 201, two second-color sub-pixels 202, and one third-color sub-pixel 203; in each sub-pixel group 350, the first-color sub-pixel 201 and the third-color sub-pixel 203 are arranged along the first direction, and the two second-color sub-pixels 202 are disposed adjacent in the second direction and are located between the first-color sub-pixel 201 and the third-color sub-pixel 203. In addition, a concept of the sub-pixel group described above is only used for describing a pixel arrangement structure of a plurality of sub-pixels, and does not limit a sub-pixel group to be used for displaying one pixel point, or to be driven by a same gate line.

In some examples, as shown in FIG. 9, a quantity of the second-color sub-pixels 202 is greater than a quantity of the first-color sub-pixels 201 and greater than a quantity of the third-color sub-pixels 203. The quantity of the second-color sub-pixels 202 may be twice the quantity of the first-color sub-pixels 201, and the quantity of the first-color sub-pixels 201 may be equal to the quantity of the third-color sub-pixels 203.

For example, as shown in FIG. 9, four sub-pixels in a dashed line box 360 may be driven by a same gate line. Of course, the embodiment of the present disclosure includes, but is not limited thereto, and drive of a sub-pixel may be set according to actual needs.

Figure 10:
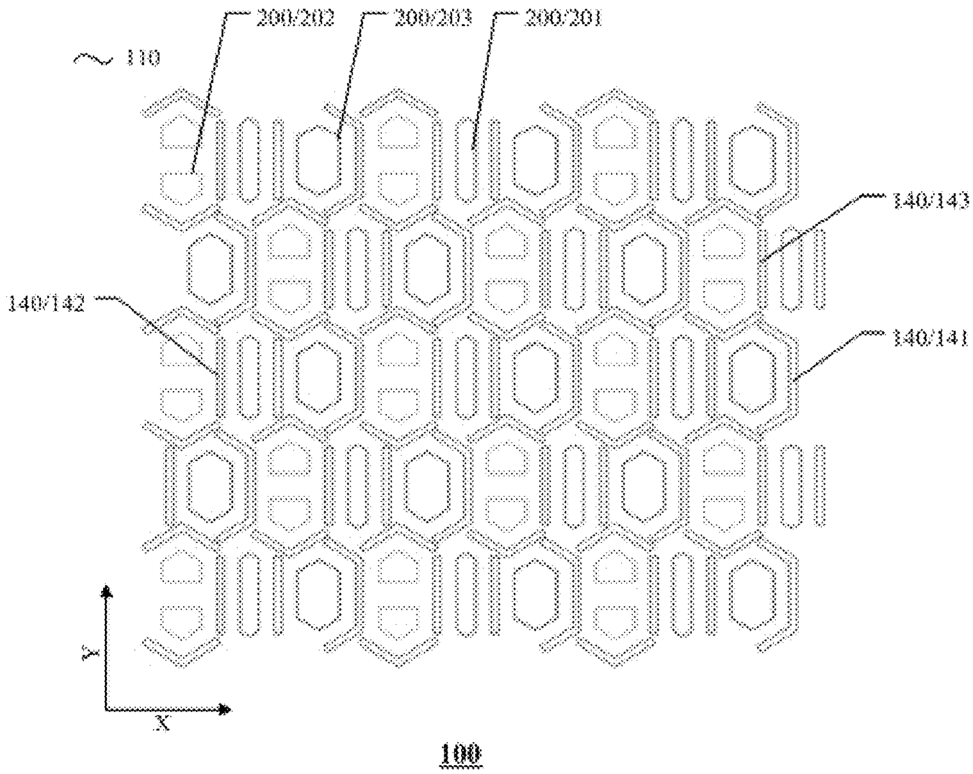
FIG. 10 is a schematic plan view of another display substrate according to an embodiment of the present disclosure.

FIG. 10 is a schematic plan view of another display substrate according to an embodiment of the present disclosure. As shown in FIG. 10, a plurality of sub-pixels 200 includes a plurality of first-color sub-pixels 201, a plurality of second-color sub-pixels 202, and a plurality of third-color sub-pixels 203. A partition structure 140 includes a plurality of first annular partition portions 141, a plurality of second annular partition portions 142, and a plurality of third annular partition portions 143; each first annular partition portion 141 is disposed around two adjacent second-color sub-pixels 202; each second annular partition portion 142 is disposed around one first-color sub-pixel 201; each third annular partition portion 143 is disposed around one third-color sub-pixel 203. Thereby, a charge generation layer 129 in a light emitting functional layer 120 may be disconnected at the first annular partition portion 141, the second annular partition portion 142, and the third annular partition portion 143, and the first annular partition portion 141 may separate two adjacent second-color sub-pixels 202 from other sub-pixels, thus crosstalk between a second-color sub-pixel and adjacent sub-pixels may be avoided; the second annular partition portion 142 may separate the first-color sub-pixel 201 from other sub-pixels, thus crosstalk between the first-color sub-pixel and adjacent sub-pixels may be avoided; the third annular partition portion 143 may separate the third-color sub-pixel 203 from other sub-pixels, thus crosstalk between the second-color sub-pixel and adjacent sub-pixels may be avoided.

In some examples, as shown in FIG. 10, two adjacent annular partition portions among the plurality of first annular partition portions 141, the plurality of second annular partition portions 142, and the plurality of third annular partition portions 143 may have a common portion, i.e., two adjacent annular partition portions may share a partition edge portion. Thereby, only one partition structure is disposed between two adjacent sub-pixels of different colors, thus a width of a spacing between two adjacent sub-pixels of different colors may be reduced to improve a pixel density. The first annular partition portion 141, the second annular partition portion 142, and the third annular partition portion 143 may each be provided with at least one notch.

Figure 11:
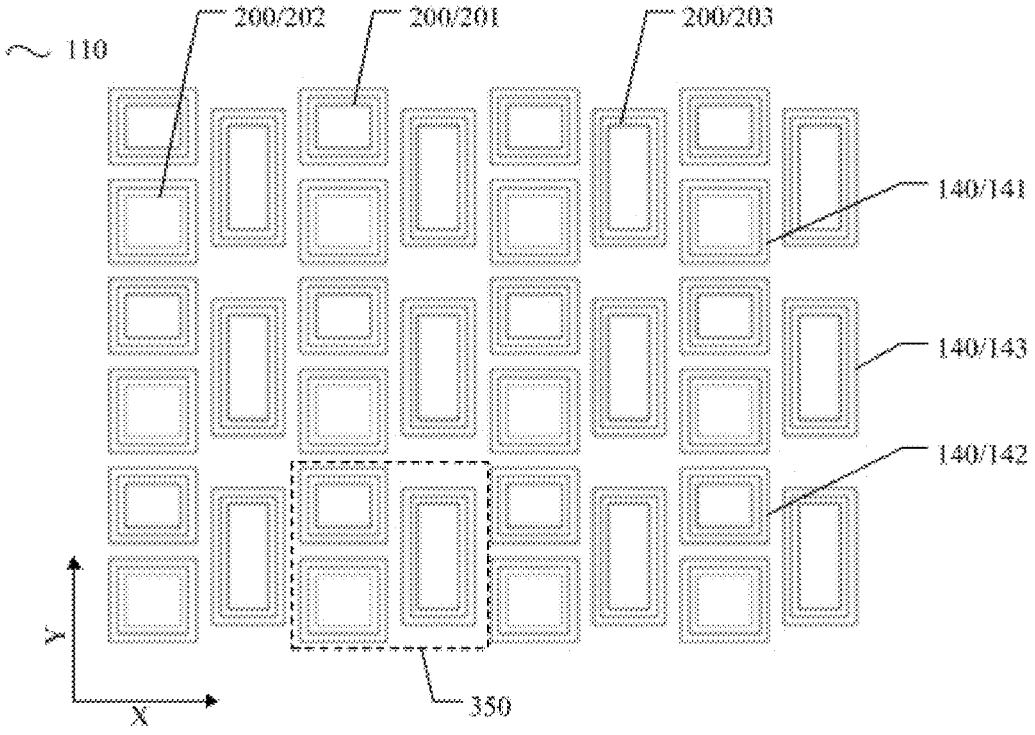
FIG. 11 is a schematic plan view of another display substrate according to an embodiment of the present disclosure.

FIG. 11 is a schematic plan view of another display substrate according to an embodiment of the present disclosure. As shown in FIG. 11, a plurality of sub-pixels 200 includes a plurality of first-color sub-pixels 201, a plurality of second-color sub-pixels 202, and a plurality of third-color sub-pixels 203; a partition structure 140 includes a plurality of first annular partition portions 141 and a plurality of second annular partition portions 142, each first annular partition portion 141 is disposed around one second-color sub-pixel 202, and each second annular partition portion 142 is disposed around one first-color sub-pixel 201.

In some examples, as shown in FIG. 11, the partition structure 140 includes a plurality of first annular partition portions 141, a plurality of second annular partition portions 142, and a plurality of third annular partition portions 143; each first annular partition portion 141 is disposed around one of the second-color sub-pixels 202; each second annular partition portion 142 is disposed around one first-color sub-pixel 201; each third annular partition portion 143 is disposed around one third-color sub-pixel 203. Thereby, a charge generation layer 129 in a light emitting functional layer 120 may be disconnected at the first annular partition portion 141, the second annular partition portion 142, and the third annular partition portion 143, and the first annular partition portion 141 may separate the second-color sub-pixel 202 from other sub-pixels, thus crosstalk between the second-color sub-pixel and adjacent sub-pixels may be avoided; the second annular partition portion 142 may separate the first-color sub-pixel 201 from other sub-pixels, thus crosstalk between the first-color sub-pixel and adjacent sub-pixels may be avoided; the third annular partition portion 143 may separate the third-color sub-pixel 203 from other sub-pixels, thus crosstalk between the third-color sub-pixel and adjacent sub-pixels may be avoided.

In some examples, as shown in FIG. 11, there are two annular partition portions between any two adjacent sub-pixels 200, thus crosstalk between adjacent sub-pixels may be further avoided.

In some examples, as shown in FIG. 11, the plurality of sub-pixels 200 are divided into a plurality of sub-pixel groups 350, each sub-pixel group 350 includes one first-color sub-pixel 201, one second-color sub-pixel 202, and one third-color sub-pixel 203; in each sub-pixel group 350, the first-color sub-pixel 201 and the third-color sub-pixel 203, and the second-color sub-pixel 202 and the third-color sub-pixel 203 are all arranged along the first direction X, the first-color sub-pixel 201 and the second-color sub-pixel 202 are arranged along the second direction Y, and the third-color sub-pixel 203 is located on a same side of the first-color sub-pixel 201 and the second-color sub-pixel 202.

In some examples, as shown in FIG. 11, a quantity of the second-color sub-pixels 202 may be equal to a quantity of the first-color sub-pixels 201 and equal to a quantity of the third-color sub-pixels 203.

Figure 12:
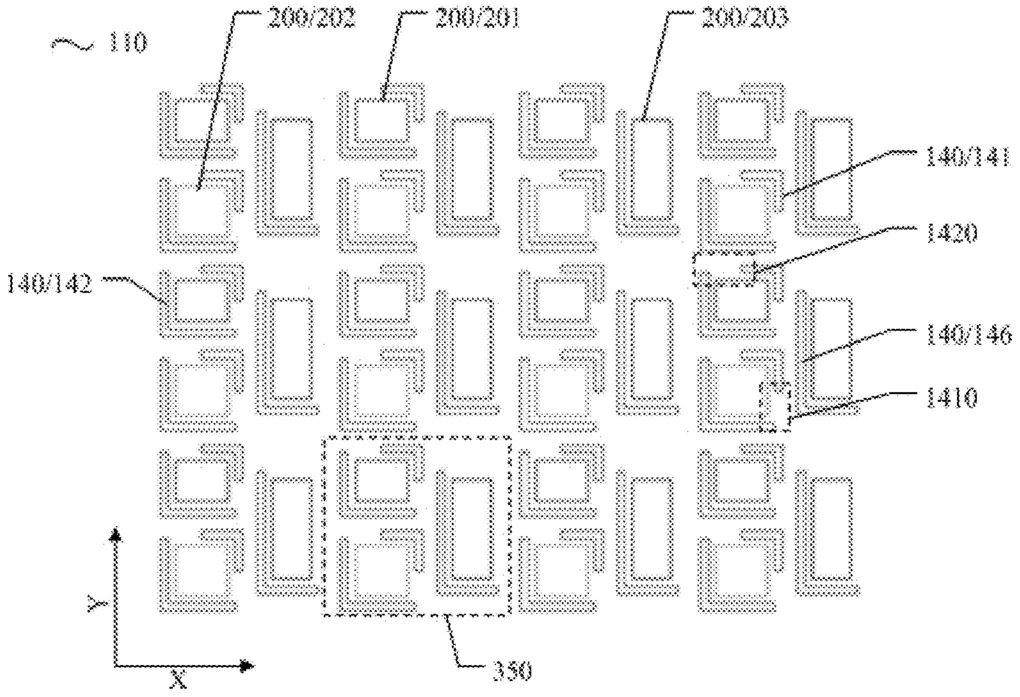
FIG. 12 is a schematic plan view of another display substrate according to an embodiment of the present disclosure.

FIG. 12 is a schematic plan view of another display substrate according to an embodiment of the present disclosure. As shown in FIG. 12, a plurality of sub-pixels 200 includes a plurality of first-color sub-pixels 201, a plurality of second-color sub-pixels 202, and a plurality of third-color sub-pixels 203; a partition structure 140 includes a plurality of first annular partition portions 141 and a plurality of second annular partition portions 142; the plurality of first annular partition portions 141 are disposed in one-to-one correspondence with the plurality of second-color sub-pixels 202, and each first annular partition portion 141 is disposed around one of the second-color sub-pixels 202; the plurality of second annular partition portions 142 are disposed in one-to-one correspondence with the plurality of first-color sub-pixels 201, and each second annular partition portion 142 is disposed around one first-color sub-pixel 201. Thus, a charge generation layer 129 in a light emitting functional layer 120 may be disconnected at positions of the first annular partition portion 141 and the second annular partition portion 142, the first annular partition portion 141 may separate the second-color sub-pixel 202 from other sub-pixels, thus crosstalk between the second-color sub-pixel and adjacent sub-pixels may be avoided; the second annular partition portion 142 may separate the first-color sub-pixel 201 from other sub-pixels, thus crosstalk between the first-color sub-pixel and adjacent sub-pixels may be avoided.

In some examples, as shown in FIG. 12, the plurality of sub-pixels 200 are divided into a plurality of sub-pixel groups 350, each sub-pixel group 350 includes one first-color sub-pixel 201, one second-color sub-pixel 202, and one third-color sub-pixel 203; in each sub-pixel group 350, the first-color sub-pixel 201 and the third-color sub-pixel 203, and the second-color sub-pixel 202 and the third-color sub-pixel 203 are all arranged along the first direction X, the first-color sub-pixel 201 and the second-color sub-pixel 202 are arranged along the second direction Y, and the third-color sub-pixel 203 is located on a same side of the first-color sub-pixel 201 and the second-color sub-pixel 202.

In some examples, as shown in FIG. 12, the first annular partition portion 141 includes at least one first notch 1410 and the second annular partition portion 142 includes at least one second notch 1420; at this time, the partition structure 140 further includes a plurality of L-shaped partition portions 146 disposed in one-to-one correspondence with a plurality of third-color sub-pixels 203, and each L-shaped partition portion 146 is disposed around one third-color sub-pixel 203. In each sub-pixel group 350, the L-shaped partition portion 146 is opposite to a first notch 1410 on the first annular partition portion 141 close to the third-color sub-pixel 203 and a second notch 1420 on the second annular partition portion 142 close to the third-color sub-pixel 203; that is to say, an orthographic projection of the L-shaped partition portion 146 on a reference line extending along the second direction Y is overlapped with an orthographic projection of the first notch 1410 on the first annular partition portion 141 close to the third-color sub-pixel 203 on the reference line and an orthographic projection of the second notch 1420 on the second annular partition portion 142 close to the third-color sub-pixel 203 on the reference line, respectively.

Figure 13:
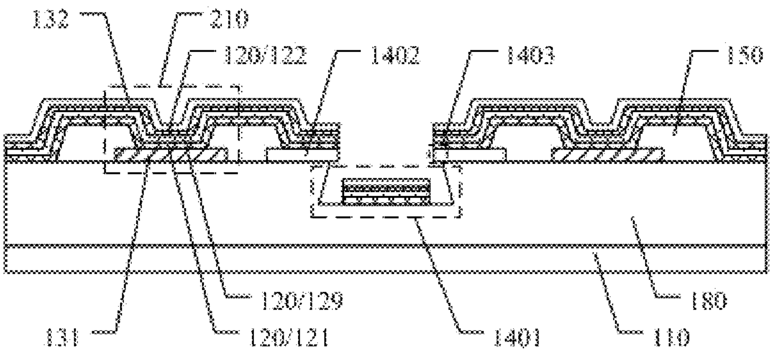
FIG. 13 is a partial sectional view of a display substrate according to an embodiment of the present disclosure.

FIG. 13 is a partial sectional view of a display substrate according to an embodiment of the present disclosure. As shown in FIG. 13, a partition structure 140 includes a groove 1401 and a shielding portion 1402; the shielding portion 1402 is located at an edge of the groove 1401 and projects into the groove 1401 to form a second projection portion 1403 covering a part of an opening of the groove 1401, and a conductive sub-layer 129 of a light emitting functional layer 120 is disconnected at the second projection portion 1403 of the shielding portion 1402.

For example, as shown in FIG. 13, the shielding portion 1402 projects into the groove 1401 with respect to the edge of the groove 1401 to form the second projection portion 1403; at this time, the second projection portion 1403 of the shielding portion 1402 is suspended and shields an edge portion of the opening of the groove 1401.

In some examples, as shown in FIG. 13, the groove 1401 is provided with shielding portions 1402 at two edges in an arrangement direction of two adjacent sub-pixels 200, respectively.

In some examples, as shown in FIG. 13, a second electrode 132 is disconnected at a position where the partition structure 140 is located or a thickness of the second electrode will become thinner at the position where the partition structure is located. In this way, continuity of the second electrode will be affected adversely, a resistance and voltage drop of the second electrode will be increased, thus affecting a display effect of a panel adversely and increasing power consumption of the panel.

In some examples, as shown in FIG. 13, the display substrate 100 further includes a planarization layer 180; the groove 1401 is disposed on a surface of the planarization layer 180 away from a base substrate 110; a part of the shielding portion 1402 other than the second projection portion 1403 may be at least partially located between the planarization layer 180 and a pixel definition layer 150.

For example, along a direction parallel to the base substrate 110, a ratio of a size of the second projection portion 1403 of the shielding portion 1402 projecting into the groove 1401 to a size of the shielding portion 1402 may be 0.1-0.5. For example, the ratio of the size of the second projection portion 1403 of the shielding portion 1402 projecting into the groove 1401 to the size of the shielding portion 1402 may be 0.2-0.4. For example, the size of the second projection portion 1403 of the shielding portion 1402 projecting into the groove 1401 is not less than 0.1 micron. For example, the size of the second projection portion 1403 of the shielding portion 1402 projecting into the groove 1401 is not less than 0.2 micron.

For example, a distance between two shielding portions 1402 located between adjacent sub-pixels may be 2 to 15 microns. For example, the distance between the two shielding portions 1402 located between adjacent sub-pixels may be 5 to 10 microns. For example, the distance between the two shielding portions 1402 located between adjacent sub-pixels may be 3 to 7 microns. For example, the distance between the two shielding portions 1402 located between adjacent sub-pixels may be 4 to 12 microns.

For example, as shown in FIG. 13, a part of the shielding portion 1402 other than the second projection portion 1403 is attached to the surface of the planarization layer 180 away from the base substrate 110.

For example, a material of the shielding portion 1402 may be the same as that of a first electrode 131, and the shielding portion 1402 and the first electrode 131 may be located in a same film layer. Thus, the shielding portion 1402 may be formed together in a process of patterning to form the first electrode 131, thereby saving a mask process. Of course, the embodiment of the present disclosure includes, but is not limited thereto, and the shielding portion may be made of another material such as an inorganic material.

For example, a material of the planarization layer 180 may be an organic material, such as one of or a combination of more of resin, acrylic or polyethylene terephthalate, polyimide, polyamide, polycarbonate, epoxy resin and the like.

In some examples, other film layers are also disposed between the planarization layer 180 and the base substrate 110, the other film layers may include a gate insulation layer, an interlayer dielectric layer, some film layers in a pixel circuit (e.g., including a structure such as a thin film transistor and a storage capacitor), film layers where a data line, a gate line, a power supply signal line, a reset power supply signal line, a reset control signal line, and a light emitting control signal line, etc., are located.

Figure 14:
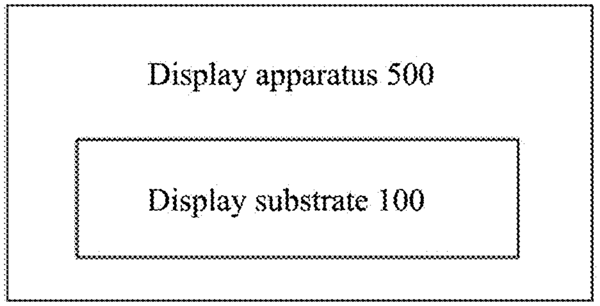
FIG. 14 is a schematic diagram of a display apparatus according to an embodiment of the present disclosure.

At least one embodiment of the present disclosure also provides a display apparatus. FIG. 14 is a schematic diagram of a display apparatus according to an embodiment of the present disclosure. As shown in FIG. 14, a display apparatus 500 also includes a display substrate 100. In the display substrate, crosstalk between adjacent sub-pixels caused by a charge generation layer with a relatively high conductivity is avoided by disposing a partition structure between adjacent sub-pixels and making the charge generation layer in a light emitting functional layer disconnect at a position where the partition structure is located. Thus, the display apparatus including the display substrate may also avoid crosstalk between adjacent sub-pixels, thus having a relatively high product yield and relatively high display quality.

On the other hand, in the display substrate, a pixel density may be improved while a double-layer light emitting (Tandem EL) design is adopted. Therefore, the display apparatus including the display substrate has advantages of long life, low power consumption, high brightness, high resolution, and the like.

For example, the display apparatus may be a display device such as an organic light emitting diode display apparatus and any product or component having a display function such as a television, a digital camera, a mobile phone, a watch, a tablet computer, a notebook computer, and a navigator, that includes a display apparatus, and the embodiment is not limited thereto.

Figure 15:
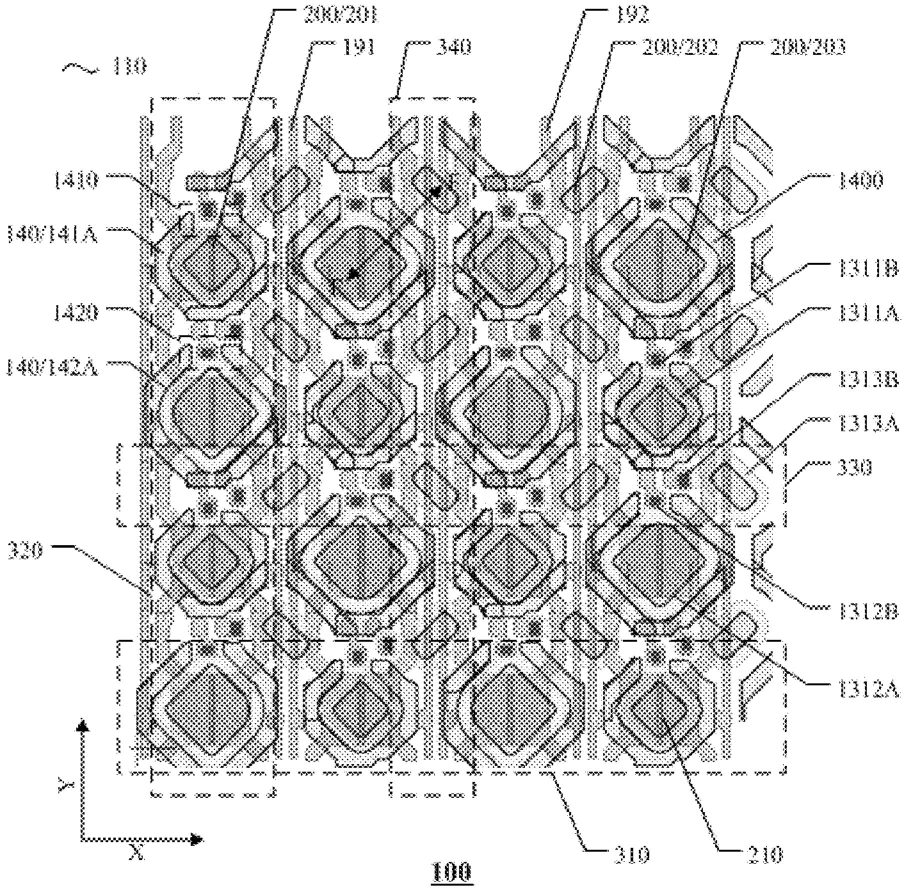
FIG. 15 is a schematic plan view of another display substrate according to an embodiment of the present disclosure.
Figure 16:
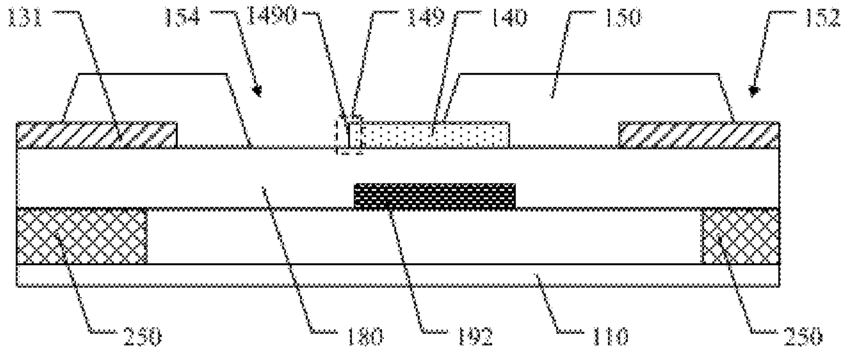
FIG. 16 is a schematic sectional view of a display substrate taken along an EF line in FIG. 15 according to an embodiment of the present disclosure.

In order to better ensure continuity of a second electrode while effectively isolating a charge generation layer of adjacent sub-pixels, an embodiment of the present disclosure also provides another display substrate. FIG. 15 is a schematic plan view of another display substrate according to an embodiment of the present disclosure; FIG. 16 is a schematic sectional view of a display substrate taken along an EF line in FIG. 15 according to an embodiment of the present disclosure.

As shown in FIG. 15 and FIG. 16, a display substrate 100 includes a base substrate 110 and a plurality of sub-pixels 200 located on the base substrate 110; the plurality of sub-pixels 200 are arranged in an array on the base substrate 110, and a sub-pixel 200 includes a light emitting element 210 and a pixel drive circuit 250 that drives the light emitting element 210 to emit light. The light emitting element 210 includes a light emitting functional layer, a first electrode, and a second electrode; the light emitting functional layer may include a plurality of sub-functional layers, and the plurality of sub-functional layers may include a charge generation layer with a relatively high conductivity. A sectional structure of the light emitting element may be referred to relevant description of FIG. 2 and will not be repeated here.

For example, the pixel drive circuit 250 may be electrically connected with a first electrode 131 in a correspondingly disposed light emitting element 210 so as to drive the light emitting element 210 to emit light. The first electrode 131 may be an anode, and a second electrode 132 may be a cathode; the plurality of sub-pixels 200 may share one second electrode 132, i.e., the plurality of sub-pixels 200 may share one cathode.

For example, the cathode may be formed of a material with a high conductivity and a low work function, for example, the cathode may be made of a metal material. For example, the anode may be formed of a transparent conductive material with a high work function.

As shown in FIG. 15 and FIG. 16, the display substrate 100 further includes a partition structure 140 that is located on the base substrate 110 and between adjacent sub-pixels 200; thereby, a charge generation layer in the light emitting functional layer is disconnected at a position where the partition structure 140 is located. The plurality of sub-pixels 200 includes a plurality of first-color sub-pixels 201, a plurality of second-color sub-pixels 202, and a plurality of third-color sub-pixels 203; the partition structure 140 includes a plurality of annular partition portions 1400, and an annular partition portion 1400 surrounds one of at least one first-color sub-pixel 201, at least one second-color sub-pixel 202, and at least one third-color sub-pixel 203; that is to say, the annular partition portion 1400 surrounds at least one first-color sub-pixel 201 or at least one second-color sub-pixel 202 or at least one third-color sub-pixel 203. In addition, the plurality of annular partition portions 1400 surround a plurality of sub-pixels of a same color or a plurality of sub-pixels of different colors; the aforementioned at least one annular partition portion 1400 may be in a closed ring shape or a non-closed ring shape, such as a ring shape including at least one notch.

In the display substrate according to the embodiment of the present disclosure, crosstalk between adjacent sub-pixels caused by a conductive sub-layer (such as a charge generation layer) with a relatively high conductivity may be avoided by disposing a partition structure between adjacent sub-pixels and making the conductive sub-layer (such as the charge generation layer) in a light emitting functional layer disconnect at a position where the partition structure is located. Moreover, since the partition structure includes a plurality of annular partition portions, an annular partition portion surrounds at least one first-color sub-pixel or at least one second-color sub-pixel or at least one third-color sub-pixel, the partition structure may achieve partition of most adjacent sub-pixels through a simple annular partition portion, thereby avoiding crosstalk between most adjacent sub-pixels. On the other hand, since the display substrate may avoid crosstalk between most adjacent sub-pixels through the partition structure, the display substrate may improve a pixel density while adopting a double-layer light emitting (Tandem EL) design. And the display substrate may have advantages of long life, low power consumption, high brightness, high resolution, and the like. In addition, since the partition structure may also partition a second electrode while partitioning the conductive sub-layer (such as the charge generation layer), at least one of the annular partition portions is provided with at least one notch (i.e., in a non-closed ring shape), in this way, the second electrode will not be partitioned at the notch, and continuity of the second electrode may be improved by disposing the notch, and the second electrode is prevented from being completely partitioned by an annular partition portion in a closed ring shape.

In some examples, as shown in FIG. 15 and FIG. 16, in the display substrate 100, a quantity of second-color sub-pixels 202 is greater than a quantity of first-color sub-pixels 201; or, the quantity of second-color sub-pixels 202 is greater than a quantity of third-color sub-pixels 203; or, the quantity of second-color sub-pixels 202 is greater than the quantity of first-color sub-pixels 201 and greater than the quantity of third-color sub-pixels 203. The plurality of annular partition portions 1400 may include a plurality of first annular pixel partition portions 141A and a plurality of second annular pixel partition portions 142A, an first annular pixel partition portion 141A surrounds one of the first-color sub-pixels 201, and an second annular pixel partition portion 142A surrounds one of the third-color sub-pixels 203; the first annular pixel partition portion 141A may be in a closed ring shape or provided with at least one first notch 1410, and the second annular pixel partition portion 142A may be in a closed ring shape or provided with at least one second notch 1420. Thus, in the embodiment, most adjacent sub-pixels on the display substrate may be separated by disposing the first annular pixel partition portion 141A on an outer side of first-color sub-pixels 201 with a smaller number and disposing the second annular pixel partition portion 142A on an outer side of third-color sub-pixels 203 with a smaller number, so that crosstalk between adjacent sub-pixels may be effectively avoided.

In some examples, as shown in FIG. 15 and FIG. 16, in the display substrate 100, the quantity of second-color sub-pixels 202 may be approximately twice the quantity of first-color sub-pixels 201 or third-color sub-pixels 203.

In some examples, as shown in FIG. 15 and FIG. 16, the partition structure 140 may separate a first-color sub-pixel and a third-color sub-pixel which are adjacent, and separate a first-color sub-pixel and a second-color sub-pixel which are adjacent, and separate a third-color sub-pixel and a second-color sub-pixel which are adjacent without disposing a strip-shaped partition portion as shown in FIG. 1.

In some examples, the light emitting functional layer includes a conductive sub-layer, and further includes a first emitting layer and a second emitting layer located on two sides of the conductive sub-layer in a direction perpendicular to the base substrate, and the conductive sub-layer is a charge generation layer. Therefore, the display substrate may achieve a double-layer light emitting (Tandem EL) design, and thus has advantages of long life, low power consumption, high brightness, and the like. A sectional structure of the light emitting functional layer may be referred to the relevant description of FIG. 2 and will not be repeated here.

In some examples, a conductivity of the conductive sub-layer is greater than a conductivity of the first emitting layer and a conductivity of the second emitting layer, and less than a conductivity of the second electrode.

In some examples, as shown in FIG. 15 and FIG. 16, the plurality of annular partition portions 1400 includes a plurality of first annular pixel partition portions 141A and a plurality of second annular pixel partition portions 142A, the plurality of first annular pixel partition portions 141A are disposed corresponding to the plurality of first-color sub-pixels 201, and the plurality of second annular pixel partition portions 142A are disposed corresponding to the plurality of third-color sub-pixels 203; each first annular pixel partition portion 141A surrounds one first-color sub-pixel 201 and each second annular pixel partition portion 142A surrounds one third-color sub-pixel 203. The first annular pixel partition portion 141A may be in a closed ring shape or provided with at least one first notch 1410, and the second annular pixel partition portion 142A may be in a closed ring shape or provided with at least one second notch 1420. Thus, in this embodiment, the plurality of first annular pixel partition portions 141A may separate the plurality of first-color sub-pixels 201 from other adjacent sub-pixels, and the plurality of second annular pixel partition portions 142A may separate the plurality of third-color sub-pixels 203 from other adjacent sub-pixels, thereby the display substrate may effectively avoid crosstalk between adjacent sub-pixels.

In some examples, as shown in FIG. 15 and FIG. 16, a partition structure 140 between a first-color sub-pixel 201 and a second-color sub-pixel 202 which are adjacent includes only a part of the first annular pixel partition portion 141A; a partition structure 140 between a third-color sub-pixel 203 and a second-color sub-pixel 202 which are adjacent includes only a part of the second annular pixel partition portion 142A. In this way, there is no need to dispose an annular partition structure around the second-color sub-pixel, and a second electrode may be continuously disposed around the second-color sub-pixel. Therefore, in the display substrate, through the above-mentioned partition structure, continuity of the second electrode may be maximized while effectively partitioning charge generation layers of adjacent sub-pixels, thereby facilitating transmission of a cathode signal.

In some examples, as shown in FIG. 15, the first annular pixel partition portion 141A may be provided with at least one first notch 1410 which may be located on an extension line of a diagonal of an effective light emitting region of a first-color sub-pixel 201. Among them, as shown in FIG. 15, a shape of the effective light emitting region of the first-color sub-pixel 201 may be a quadrilateral (for example, a rounded quadrilateral), and a diagonal of the quadrilateral is the diagonal of the effective light emitting region of the first-color sub-pixel 201. In another implementation mode, the shape of the effective light emitting region of the first-color sub-pixel may be another polygon (which may be a rounded polygon) such as a pentagon or a hexagon, and the first notch may be disposed opposite to a corner position of the effective light emitting region of the first-color sub-pixel.

In some examples, as shown in FIG. 15, a first electrode 131 of a first-color sub-pixel 201 includes a first main body portion 1311A and a first connection portion 1311B, the first connection portion 1311B is connected with the first main body portion 1311A and configured to be electrically connected with a pixel drive circuit 250; at least part of the first connection portion 1311B is located at a position where the first notch 1410 of the first annular pixel partition portion 141A is located.

In this case, the first notch of the first annular pixel partition portion may be used for disposing a first connection portion, and the first connection portion is used for being electrically connected with a corresponding pixel drive circuit. When a pixel density of the display substrate is relatively high and an arrangement of sub-pixels is relatively compact, space between opposite edges of effective light emitting regions of adjacent sub-pixels is relatively small and space between opposite corners of the effective light emitting regions of the adjacent sub-pixels is relatively large. The display substrate may fully utilize the space between the opposite corners of the effective light emitting regions of adjacent sub-pixels by disposing the first notch of the first annular pixel partition on the extension line of the diagonal of the effective light emitting region of the first-color sub-pixel. On the other hand, the display substrate may improve a density of pixel arrangement while avoiding crosstalk between adjacent sub-pixels through the above arrangement.

In some examples, as shown in FIG. 15 and FIG. 16, the first connection portion 1311B is located on an extension line of a diagonal of the first main body portion 1311A, that is, the first connection portion 1311B protrudes outward from one corner of the first main body portion 1311A.

In some examples, as shown in FIG. 15 and FIG. 16, a shape of an orthographic projection of the first body portion 1311A on the base substrate 110 includes a rounded rectangle, and the first connection portion 1311B protrudes outward from one rounded corner of the first body portion 1311A along an extension direction of a diagonal of the rounded rectangle.

In some examples, as shown in FIG. 15, the second annular pixel partition portion 142A is provided with at least one second notch 1420, and the second notch 1420 may be located on an extension line of a diagonal of an effective light emitting region of a third-color sub-pixel 203. Among them, as shown in FIG. 15, a shape of the effective light emitting region of the third-color sub-pixel 203 may be a quadrilateral (for example, a rounded quadrilateral), and a diagonal of the quadrilateral is the diagonal of the effective light emitting region of the third-color sub-pixel 203. In another implementation mode, the shape of the effective light emitting region of the third-color sub-pixel may be another polygon (which may be a rounded polygon) such as a pentagon or a hexagon, and the second notch may be disposed opposite to a corner position of the effective light emitting region of the third-color sub-pixel.

In some examples, as shown in FIG. 15, a first electrode 131 of a third-color sub-pixel 203 includes a second main body portion 1312A and a second connection portion 1312B, and the second connection portion 1312B is connected with the second main body portion 1312A and configured to be electrically connected with a pixel drive circuit 250; at least part of the second connection portion 1312B is located at a position where the second notch 1420 of the second annular pixel partition portion 142A is located.

In this case, the second notch of the second annular pixel partition portion may be used for disposing a second connection portion, and the second connection portion is used for being electrically connected with a corresponding pixel drive circuit. When a pixel density of the display substrate is relatively high and an arrangement of sub-pixels is relatively compact, space between opposite edges of effective light emitting regions of adjacent sub-pixels is relatively small and space between opposite corners of the effective light emitting regions of the adjacent sub-pixels is relatively large. The display substrate may fully utilize the space between the opposite corners of the effective light emitting regions of the adjacent sub-pixels by disposing the second notch of the second annular pixel partition portion on the extension line of the diagonal of the effective light emitting region of the third-color sub-pixel. On the other hand, the display substrate may improve a density of pixel arrangement while avoiding crosstalk between adjacent sub-pixels through the above arrangement.

In some examples, as shown in FIG. 15 and FIG. 16, the second connection portion 1312B is located on an extension line of a diagonal of the second main body portion 1312A, that is, the second connection portion 1312B protrudes outward from one corner of the second main body portion 1312A.

In some examples, as shown in FIG. 15 and FIG. 16, a shape of an orthographic projection of the second main body portion 1312A on the base substrate 110 includes a rounded rectangle, and the second connection portion 1312B protrudes outward from one rounded corner of the second main body portion 1312A along an extension direction of a diagonal of the rounded rectangle.

In some examples, as shown in FIG. 15 and FIG. 16, a direction in which the first connection portion 1311B protrudes from the first main body portion 1311A is the same as a direction in which the second connection portion 1312B protrudes from the second main body portion 1312A.

In some examples, as shown in FIG. 15 and FIG. 16, a first electrode 131 of a second-color sub-pixel 202 includes a third main body portion 1313A and a third connection portion 1313B, and the third connection portion 1313B is connected with the third main body portion 1313A and configured to be connected with a pixel drive circuit 250.

In some examples, as shown in FIG. 15 and FIG. 16, the third connection portion 1313B is located on an extension line of a diagonal of the third main body portion 1313A, that is, the third connection portion 1313B protrudes outward from one corner of the third main body portion 1313A.

In some examples, as shown in FIG. 15, a plurality of first notches 1410 are arranged in an array and form a first notch row and a first notch column along a first direction X and a second direction Y, respectively; the first notch row extends along the first direction X and the first notch column extends along the second direction Y; a plurality of second notches 1420 are arranged in an array and form a second notch row and a second notch column along the first direction X and the second direction Y, respectively; the second notch row extends along the first direction X, and the second notch column extends along the second direction Y; the first notch row and the second notch row are substantially parallel, and the first notch column and the second notch column are substantially parallel.

In some examples, as shown in FIG. 15, a first notch 1410 is located between a first-color sub-pixel 201 and a third-color sub-pixel 203, and a second notch 1420 is located between a first-color sub-pixel 201 and a third-color sub-pixel 203.

In some examples, as shown in FIG. 15 and FIG. 16, the display substrate 100 further includes a pixel definition layer 150 located on the base substrate 110; the pixel definition layer 150 is located on a side of a first electrode 131 away from the base substrate 110; the pixel definition layer 150 is provided with a plurality of pixel openings 152 and pixel spacing openings 154; the plurality of pixel openings 152 correspond in one-to-one correspondence with the plurality of sub-pixels 200 to define effective light emitting regions of the plurality of sub-pixels 200; a pixel opening 152 is configured to expose the first electrode 131, so that the first electrode 131 is in contact with a light emitting functional layer 120 which is subsequently formed. A pixel spacing opening 154 is located between adjacent first electrodes 131, and a part of the partition structure 140 is located between the pixel definition layer 150 and the base substrate 110 (that is to say, the part of the partition structure 140 is covered by the pixel definition layer 150), the pixel spacing opening 154 at least partially exposes an edge of the partition structure 140.

In an arrangement direction of adjacent sub-pixels, since at least part of the partition structure is located between the pixel definition layer and the base substrate, a charge generation layer in the light emitting functional layer is disconnected only once at a position where the partition structure is located outside the pixel definition layer (for example, at a position where a part of the partition structure located in the pixel spacing opening is located); likewise, a second electrode is also disconnected only once at a position where the partition structure is located outside the pixel definition layer, and not twice at positions on two sides of the partition structure in the arrangement direction of adjacent sub-pixels. Therefore, the second electrode may better maintain continuity, so that a cathode signal may be better transmitted. In addition, the second electrode is disconnected only once at the position where the partition structure is located outside the pixel definition layer, and formation of a tip structure of the second electrode may be reduced or even avoided, thereby avoiding a tip discharge phenomenon.

Herein, the arrangement direction of the adjacent sub-pixels is an extension direction of a connection line between brightness centers of effective light emitting regions of adjacent sub-pixels. A brightness center of a sub-pixel is a geometric center of an effective light emitting region of the sub-pixel (a region defined by a pixel opening corresponding to the sub-pixel), or a position where maximum light emitting brightness of the sub-pixel is located.

In some examples, as shown in FIG. 15 and FIG. 16, in the arrangement direction of adjacent sub-pixels, a side edge of the partition structure 140 is located between the pixel definition layer 150 and the base substrate 110 (i.e., the side edge of the partition structure 140 is covered by the pixel definition layer 150), and the other side edge is located in the pixel spacing opening 154. At this time, the second electrode is also disconnected only once at an edge of the partition structure located in the pixel spacing opening, and not twice at two side edges of the partition structure in the arrangement direction of the adjacent sub-pixels. Therefore, the second electrode may better maintain continuity, so that a cathode signal may be better transmitted.

In some examples, as shown in FIG. 15 and FIG. 16, in the arrangement direction of adjacent sub-pixels, at least one side of the partition structure 140 (such as one side located in the pixel spacing openings 154) includes a partition surface 1490, and an included angle between the partition surface 1490 and a plane where the base substrate 110 is located may be 80-100 degrees. Therefore, the partition surface may effectively disconnect the charge generation layer. Of course, another structure may also be adopted for the partition structure according to the embodiment of the present disclosure as long as the charge generation layer may be disconnected.

In some examples, as shown in FIG. 15 and FIG. 16, a size of the partition structure 140 in a direction perpendicular to the base substrate 110 may be 500 Å to 1500 Å. Of course, the embodiment of the present disclosure includes, but is not limited thereto, and the size of the partition structure in the direction perpendicular to the base substrate may be set according to an actual situation.

For example, a material of the pixel definition layer may include an organic material such as polyimide, acrylic, or polyethylene terephthalate.

In some examples, as shown in FIG. 15, a plurality of first-color sub-pixels 201 and a plurality of third-color sub-pixels 203 are alternately disposed along both the first direction and the second direction and form a plurality of first pixel rows 310 and a plurality of first pixel columns 320, and a plurality of second-color sub-pixels 202 are sequentially arranged along both the first direction and the second direction and form a plurality of second pixel rows 330 and a plurality of second pixel columns 340; the plurality of first pixel rows 310 and the plurality of second pixel rows 330 are alternately disposed along the second direction, and a plurality of sub-pixels of a first pixel row 310 and a plurality of sub-pixels of a second pixel row 330 are staggered in the first direction, and the plurality of first pixel columns 320 and the plurality of second pixel columns 340 are alternately disposed along the first direction, and a plurality of sub-pixels of a first pixel column 320 and a plurality of sub-pixels of a second pixel column 340 are staggered in the second direction.

In some examples, as shown in FIG. 15, the partition structure 140 is located between a first-color sub-pixel 201 and a third-color sub-pixel 203 which are adjacent, and/or, the partition structure 140 is located between a second-color sub-pixel 202 and a third-color sub-pixel 203 which are adjacent, and/or, the partition structure 140 is located between a first-color sub-pixel 201 and a second-color sub-pixel 202 which are adjacent.

In some examples, a light emitting efficiency of a third-color sub-pixel is less than a light emitting efficiency of a second-color sub-pixel.

For example, a first-color sub-pixel 201 is configured to emit red light, a second-color sub-pixel 202 is configured to emit green light, and a third-color sub-pixel 203 is configured to emit blue light. Of course, the embodiment of the present disclosure includes, but is not limited thereto.

In some examples, as shown in FIG. 15, an area of an orthographic projection of an effective light emitting region of a third-color sub-pixel 203 on the base substrate 110 is larger than an area of an orthographic projection of an effective light emitting region of a first-color sub-pixel 201 on the base substrate 110; and the area of the orthographic projection of the effective light emitting region of the first-color sub-pixel 201 on the base substrate 110 is larger than an area of an orthographic projection of an effective light emitting region of a second-color sub-pixel 202 on the base substrate 110. Of course, the embodiment of the present disclosure includes, but is not limited thereto and an area of an effective light emitting region of a sub-pixel may be set according to actual needs.

In some examples, as shown in FIG. 15 and FIG. 16, the display substrate 100 further includes a planarization layer 180, a plurality of data lines 191, and a plurality of power supply lines 192; the planarization layer 180 is located on a side of a first electrode 131 close to the base substrate 110, that is, the first electrode 131 is disposed on a side of the planarization layer 180 away from the base substrate 110; the plurality of data lines 191 are located between the planarization layer 180 and the base substrate 110, the plurality of data lines 191 extend along the first direction and are arranged along the second direction, and the first direction and the second direction intersect; the plurality of power supply lines 192 are located between the planarization layer 180 and the base substrate 110, the plurality of power supply lines 192 extend along the first direction and are arranged along the second direction; the partition structure 140 is overlapped with at least one of a data line 191 and a power supply line 192 along a direction perpendicular to the base substrate 110.

In some examples, as shown in FIG. 15, the plurality of data lines 191 and the plurality of power supply lines 192 are alternately arranged.

Figure 17A:
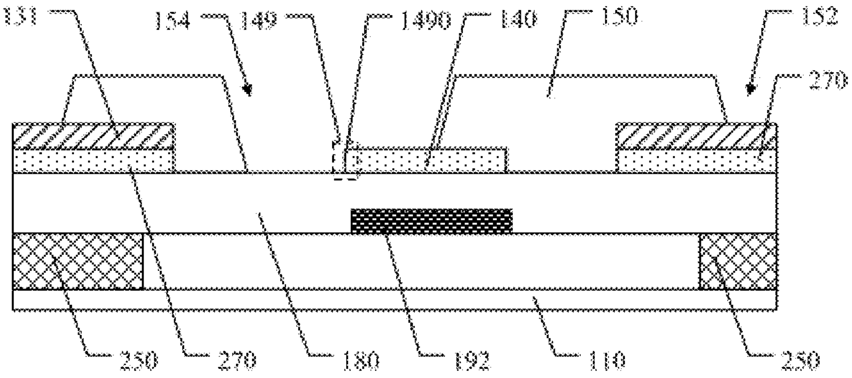
FIG. 17A is a partial sectional view of another display substrate according to an embodiment of the present disclosure.

FIG. 17A is a partial schematic sectional view of another display substrate according to an embodiment of the present disclosure. As shown in FIG. 17A, the display substrate 100 further includes a planarization layer 180 and a protective structure 270; the planarization layer 180 is located between the base substrate 110 and a first electrode 131; the protective structure 270 is located between the planarization layer 180 and the first electrode 131.

In a manufacturing process of the display substrate, a partition structure is formed after the planarization layer is formed, and an etching process is required; although the etching process is selective, the etching process still adversely affects flatness of the planarization layer, resulting in poor flatness of the first electrode formed on the planarization layer, thereby affecting a display effect adversely. However, in the display substrate shown in FIG. 17A, by forming the protective structure between the planarization layer and the first electrode, the planarization layer below the first electrode is protected from being etched in the etching process of the partition structure, so that flatness of the planarization layer below the first electrode may be ensured, and further flatness of the first electrode may be ensured and display quality may be improved.

In some examples, as shown in FIG. 17A, the protective structure 270 and the partition structure 140 may be disposed in a same layer and materials of the protective structure 270 and the partition structure 140 are the same. In this way, while forming the protective structure 270, the protective structure 270 may protect the planarization layer below the first electrode from being etched. In addition, the protective structure also does not need to add an additional film layer or mask process, so that a cost may also be reduced. In another implementation mode, the protective structure 270 and the partition structure 140 may be disposed in different layers, the protective structure 270 and the partition structure 140 may be formed through different processes and materials of the two may be different.

In some examples, the protective structure and the partition structure are made of a same material and are formed through a same patterning process.

In some examples, as shown in FIG. 17A, an orthographic projection of the first electrode 131 on the base substrate 110 falls within an orthographic projection of the protective structure 270 on the base substrate 110. Thus, the protective structure 270 may adequately protect the planarization layer below the first electrode, thereby ensuring flatness of the entire first electrode.

Figure 17B:
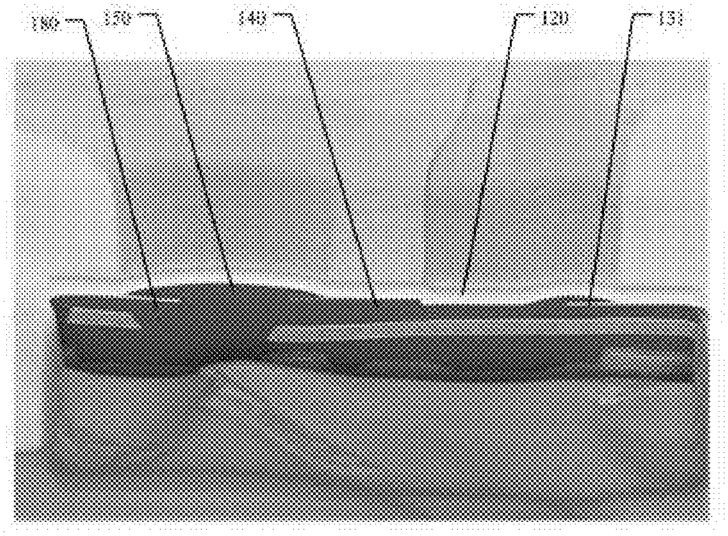
FIG. 17B is a sectional electron microscope view of a display substrate according to an embodiment of the present disclosure.

FIG. 17B is a sectional electron microscope view of a display substrate according to an embodiment of the present disclosure. As shown in FIG. 17B, in an arrangement direction of adjacent sub-pixels 200, a side edge of a partition structure 140 in the arrangement direction is located between a pixel definition layer 150 and a base substrate 110, and the other edge is located in a pixel spacing opening. At this time, a side edge of the partition structure may function as a partition, while the other edge is covered by a pixel definition layer. A second electrode is also disconnected only once at an edge of the partition structure located in the pixel spacing opening, and not twice at two sides of the partition structure in the arrangement direction of adjacent sub-pixels. Therefore, the second electrode may better maintain continuity, so that a cathode signal may be better transmitted.

Figure 18:
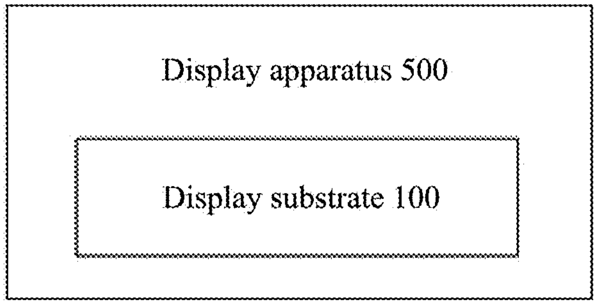
FIG. 18 is a schematic diagram of another display apparatus according to an embodiment of the present disclosure.

At least one embodiment of the present disclosure also provides a display apparatus. FIG. 18 is a schematic diagram of a display apparatus according to an embodiment of the present disclosure. As shown in FIG. 18, a display apparatus 500 also includes a display substrate 100. In the display substrate, crosstalk between adjacent sub-pixels caused by a charge generation layer with a relatively high conductivity is avoided by disposing a partition structure between adjacent sub-pixels and making the charge generation layer in a light emitting functional layer disconnect at a position where the partition structure is located. Therefore, for the display apparatus including the display substrate, crosstalk between adjacent sub-pixels may also be avoided, thus the display apparatus including the display substrate has a relatively high product yield and relatively high display quality.

On the other hand, since in the display substrate, a pixel density may be improved while adopting a double-layer light emitting (Tandem EL) design, the display apparatus including the display substrate has advantages of long life, low power consumption, high brightness, high resolution, and the like.

For example, the display apparatus may be a display device such as an organic light emitting diode display apparatus and any product or component having a display function such as a television, a digital camera, a mobile phone, a watch, a tablet computer, a notebook computer, and a navigator, that includes a display apparatus, and the embodiment is not limited thereto.

An embodiment of the present disclosure also provides a method for manufacturing a display substrate, which is used for manufacturing the above display substrate. The manufacturing method includes following acts: forming a plurality of first electrodes on a base substrate; forming a partition structure on the base substrate; forming a light emitting functional layer on a side of the partition structure and the plurality of first electrodes away from the base substrate, wherein the light emitting functional layer includes a conductive sub-layer; and forming a second electrode on a side of the light emitting functional layer away from the base substrate, wherein the second electrode, the light emitting functional layer, and the plurality of the first electrodes form light emitting elements of a plurality of sub-pixels; wherein the partition structure is located between sub-pixels which are adjacent, and the conductive sub-layer is disconnected at a position where the partition structure is located; the plurality of sub-pixels includes a plurality of first-color sub-pixels, a plurality of second-color sub-pixels, and a plurality of third-color sub-pixels, the partition structure includes a plurality of annular partition portions, an annular partition portion surrounds at least one of the first-color sub-pixels or at least one of the second-color sub-pixels or at least one of the third-color sub-pixels, and the plurality of annular partition portions surround a plurality of sub-pixels of a same color or a plurality of sub-pixels of different colors; at least one of the annular partition portions is in a closed ring shape, or/and at least one of the annular partition portions is provided with at least one notch.

Figure 19:
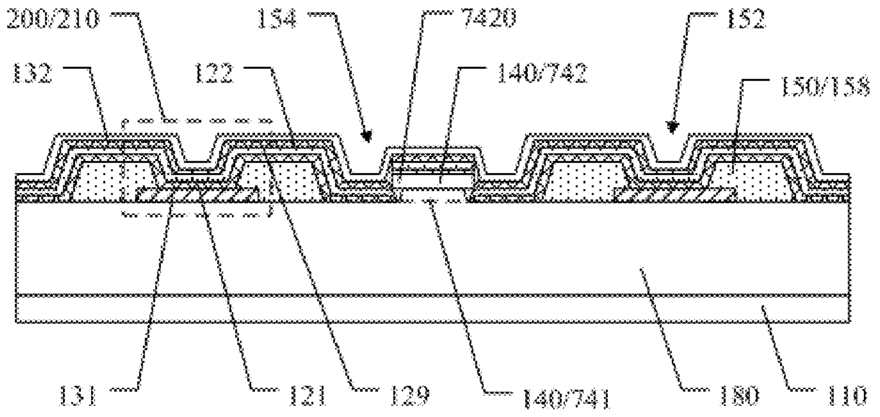
FIG. 19 is a partial sectional view of a display substrate according to an embodiment of the present disclosure.

An embodiment of the present disclosure provides a display substrate. FIG. 19 is a partial sectional view of a display substrate according to an embodiment of the present disclosure. As shown in FIG. 19, a display substrate 100 includes a base substrate 110 and a plurality of sub-pixels 200; the plurality of sub-pixels 200 are located on the base substrate 110, and a sub-pixel 200 includes a light emitting element 210; the light emitting element 210 includes a light emitting functional layer 120, and a first electrode 131 and a second electrode 132 located on two sides of the light emitting functional layer 120, the first electrode 131 is located between the light emitting functional layer 120 and the base substrate 110; the second electrode 132 is at least partially located on a side of the light emitting functional layer 120 away from the first electrode 131; that is to say, the first electrode 131 and the second electrode 132 are located on two sides in a direction perpendicular to the light emitting functional layer 120. The light emitting functional layer 120 includes a plurality of sub-functional layers, and the plurality of sub-functional layers include a conductive sub-layer 129 with a relatively high conductivity. The above light emitting functional layer includes not only the conductive sub-layer 129 and a film layer (an emitting layer) for directly emitting light, but also a functional film layer for assisting light emission, such as a hole transport layer and an electron transport layer.

For example, the conductive sub-layer 129 may be a charge generation layer. For example, the first electrode 131 may be an anode and the second electrode 132 may be a cathode. For example, the cathode may be formed of a material with a high conductivity and a low work function, for example, the cathode may be made of a metal material. For example, the anode may be formed of a transparent conductive material with a high work function.

As shown in FIG. 19, the display substrate 100 further includes a partition structure 140 which is located on the base substrate 110 and between adjacent sub-pixels 200; the charge generation layer 129 in the light emitting functional layer 120 is disconnected at a position where the partition structure 140 is located.

Herein, "adjacent sub-pixels" mean that no other sub-pixels are disposed between two sub-pixels.

In the display substrate according to the embodiment of the present disclosure, crosstalk between adjacent sub-pixels caused by a charge generation layer with a relatively high conductivity is avoided by disposing a partition structure between adjacent sub-pixels and making the charge generation layer in a light emitting functional layer disconnect at a position where the partition structure is located. On the other hand, since the display substrate may avoid crosstalk between adjacent sub-pixels through the partition structure, the display substrate may improve a pixel density while adopting a double-layer light emitting (Tandem EL) design. Therefore, the display substrate may have advantages of long life, low power consumption, high brightness, high resolution, and the like.

In some examples, as shown in FIG. 19, the partition structure 140 includes a first sub-partition structure (i.e., the first isolation portion 1405 described in FIG. 2) 741 and a second sub-partition structure (i.e., the second isolation portion 1406 described in FIG. 2) 742 that are stacked; the first sub-partition structure 741 is located between the second sub-partition structure 742 and the base substrate 110, and a material of the second sub-partition structure 742 includes an inorganic nonmetallic material.

In some examples, as shown in FIG. 19, along an arrangement direction of adjacent sub-pixels 200, an edge of the second sub-partition structure 742 in the partition structure 140 located between adjacent sub-pixels 200 projects (i.e., protrudes) relative to an edge of the first sub-partition structure 741 to form a partition projection portion (i.e., the first projection portion 1407 described in FIG. 2) 7420, and at least one of a plurality of sub-functional layers included in the light emitting functional layer 120 is disconnected at the partition projection portion 7420. In the embodiment of the present disclosure, by disposing the partition structure between adjacent sub-pixels in the display substrate, at least one layer of the light emitting functional layer may be disconnected at the partition projection portion of the second sub-partition structure, which is beneficial to reducing a probability of crosstalk between adjacent sub-pixels.

For example, as shown in FIG. 19, the plurality of sub-pixels 200 may include two adjacent sub-pixels 200. For example, at least one edge of the second sub-partition structure 742 projects relative to a corresponding edge of the first sub-partition structure 741 to form at least one partition projection portion 7420.

For example, as shown in FIG. 19, two side edges of the second sub-partition structure 742 each project relative to corresponding edges of the first sub-partition structure 741 to form two partition projection portions 7420.

FIG. 19 schematically shows that the partition structure 140 is disposed between two adjacent sub-pixels 200, the partition structure 140 includes two partition projection portions 7420, but is not limited thereto, and two or more partition structures may be disposed between two adjacent sub-pixels, each partition structure includes at least one partition projection portion, and at least one sub-functional layer of the light emitting functional layer may be disconnected by the partition structure by setting a quantity of partition structures and a quantity of partition projection portions.

For example, as shown in FIG. 19, an orthographic projection of a surface of the first sub-partition structure 741 facing the second sub-partition structure 742 on the base substrate 110 is completely within an orthographic projection of a surface on a side of the second sub-partition structure 742 facing the base substrate 110 on the base substrate 110. For example, a size of the second sub-partition structure 742 in an arrangement direction of adjacent sub-pixels is larger than a size of the surface of the first sub-partition structure 741 facing the second sub-partition structure 742 in the arrangement direction of adjacent sub-pixels.

For example, as shown in FIG. 19, a thickness of the first sub-partition structure 741 is greater than a thickness of the second sub-partition structure 742 in a direction perpendicular to the base substrate 110.

For example, as shown in FIG. 19, the light emitting functional layer 120 may include a first emitting layer 121, a Charge Generation Layer (CGL) 129, and a second emitting layer 122 that are stacked, and the charge generation layer 129 is located between the first emitting layer 121 and the second emitting layer 122. The charge generation layer has a relatively strong conductivity, which may enable the light emitting functional layer to have advantages of long life, low power consumption, and realizable high brightness. For example, compared with a light emitting functional layer without a charge generation layer, a sub-pixel may nearly double light emitting brightness by disposing the charge generation layer in the light emitting functional layer.

For example, in each sub-pixel 200, the light emitting functional layer 120 may also include a Hole Injection Layer (HIL), a Hole Transport Layer (HTL), an Electron Transport Layer (ETL), and an Electron Injection Layer (EIL).

For example, the hole injection layer, the hole transport layer, the electron transport layer, the electron injection layer, and the charge generation layer are all common film layers of a plurality of sub-pixels and may be referred to as common layers. For example, at least one sub-functional layer disconnected at a partition projection portion in the light emitting functional layer may be at least one of the above-mentioned common layers. By disconnecting at least one sub-functional layer in the above-mentioned common layers at a partition projection portion located between adjacent sub-pixels, it is beneficial to reducing a probability of crosstalk between adjacent sub-pixels.

For example, in a same sub-pixel 200, the first emitting layer 121 and the second emitting layer 122 may be emitting layers that emit light of a same color. For example, first emitting layers 121 (or second emitting layers 122) in sub-pixels 200 emitting light of different colors, emit light of different colors. Of course, the embodiment of the present disclosure is not limited thereto. For example, in a same sub-pixel 200, the first emitting layer 121 and the second emitting layer 122 may be emitting layers that emit light of different colors, light emitted by a plurality of emitting layers included in the sub-pixel 200 may be mixed into white light by disposing emitting layers that emit light of different colors in the same sub-pixel 200, and color of light emitted from each sub-pixel is adjusted by disposing a color film layer.

For example, in adjacent sub-pixels 200, emitting layers located on a same side of the charge generation layer 129 may be disposed at intervals from each other, or may be overlapped or be connected, at a spacing between two sub-pixels 200, and the embodiment of the present disclosure is not limited thereto.

For example, a material of the charge generation layer 129 may be the same as that of the electron transport layer. For example, the material of the electron transport layer may include aromatic heterocyclic compounds, for example, imidazole derivatives such as benzimidazole derivatives, imidazopyridine derivatives, and benzimidazole phenanthridine derivatives; azine derivatives such as pyrimidine derivatives and triazine derivatives; quinoline derivatives, isoquinoline derivatives, phenanthroline derivatives, and other compounds containing a nitrogen-containing six-membered ring structure (also including compounds having a phosphine oxide-based substituent on a heterocyclic ring), etc.

For example, the material of the charge generation layer 129 may be a material containing a phosphorus oxygen group or a material containing triazine.

For example, when the partition structure 140 is not disposed between the two adjacent sub-pixels 200 described above, common layers such as charge generation layers 129 in light emitting functional layers 120 of the two adjacent sub-pixels 200 may be connected or be a whole film layer. For example, the charge generation layer 129 has a relatively high conductivity, and for a display apparatus having a relatively high resolution, high conductivity of the charge generation layer 129 easily causes crosstalk between the adjacent sub-pixels 200.

In the display substrate according to the embodiment of the present disclosure, by disposing a partition structure with a partition projection portion between two adjacent sub-pixels, at least one layer of light emitting functional layers formed at the partition projection portion may be disconnected. At this time, at least one film layer (such as a charge generation layer) in the light emitting functional layer of the adjacent two sub-pixels is arranged at intervals, which may increase a resistance of a light emitting functional layer between the adjacent sub-pixels, thereby reducing a probability of crosstalk between the adjacent two sub-pixels without affecting normal display of sub-pixels.

For example, as shown in FIG. 19, a material of the second sub-partition structure 742 may include any one or more of silicon nitride, silicon oxide, or silicon oxynitride.

For example, as shown in FIG. 19, a second electrode 132 in a plurality of sub-pixels 200 may be a common electrode shared by the plurality of sub-pixels 200. When the partition structure 140 is not disposed between the two adjacent sub-pixels 200 described above, the second electrode 132 is a whole film layer.

For example, as shown in FIG. 19, a size of the partition projection portion 7420 along a direction parallel to the base substrate 110 may be in a range of 0.1-5 microns. For example, the size of the partition projection portion 7420 may be in a range of 0.2-2 microns.

For example, as shown in FIG. 19, a ratio of a thickness of the partition structure 140 to a thickness of the light emitting functional layer 120 along a direction perpendicular to the base substrate 110 is 0.8 to 1.2. For example, the ratio of the thickness of the partition structure 140 to the thickness of the light emitting functional layer 120 is 0.9 to 1.1. For example, a thickness of the second sub-partition structure 742 may be 100 to 10,000 angstroms along the direction perpendicular to the base substrate 110. For example, the thickness of the second sub-partition structure 742 may be 200 to 1500 angstroms. For example, a thickness of the first sub-partition structure 741 may be 100 to 10,000 angstroms along the direction perpendicular to the base substrate 110. For example, the thickness of the first sub-partition structure 741 may be 200 to 2000 angstroms. In an example of the embodiment of the present disclosure, by setting a thickness of a partition structure, for example, setting a ratio of the thickness of the partition structure to a thickness of a light emitting functional layer to 0.8 to 1.2, so that the light emitting functional layer 120 is disconnected at the partition projection portion 7420 of the partition structure 140, while the second electrode 132 remains continuous and non-partitioned, thereby preventing crosstalk between adjacent sub-pixels, while ensuring uniformity of display without partition of the second electrode.

For example, a thickness of the partition structure 140 may be 300 to 5000 angstroms, and the above-mentioned thickness (300 to 5000 angstroms) of the partition structure 140 may enable the light emitting functional layer 120 to be necessarily disconnected at an edge of the partition structure, and whether the second electrode 132 is disconnected or not is further determined according to the thickness of the partition structure 140.

In the embodiment of the present disclosure, by setting a thickness of a partition structure and a size of a partition projection portion, it may be achieved that at least one film layer of a light emitting functional layer is disconnected at the partition projection portion.

Figure 20:
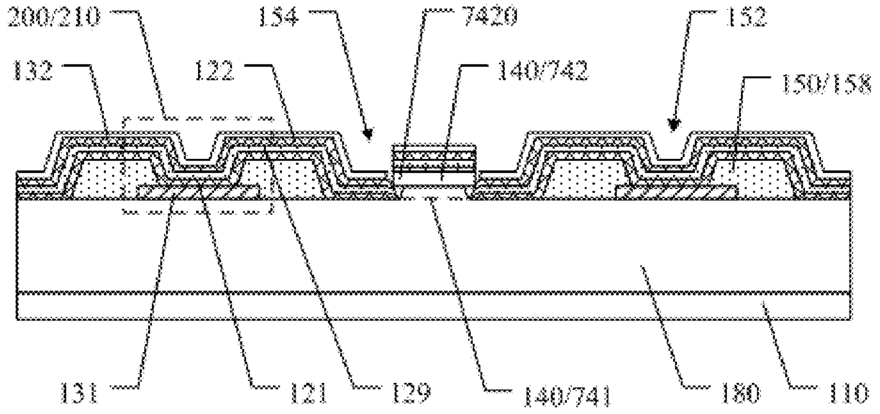
FIG. 20 is a schematic diagram of a partial sectional structure of a display substrate according to another example of an embodiment of the present disclosure.

FIG. 20 is a schematic diagram of a partial sectional structure of a display substrate according to another example of an embodiment of the present disclosure. The display substrate in the example shown in FIG. 20 is different from the display substrate in the example shown in FIG. 19 in that a thickness of a partition structures are different, and a thickness of a partition structure 140 in the display substrate shown in FIG. 20 is greater than the thickness of the partition structure 140 in the display substrate shown in FIG. 19. For example, as shown in FIG. 20, both a light emitting functional layer and a second electrode are disconnected at a partition projection portion of the partition structure by setting the thickness of the partition structure 140 larger (for example, a ratio of the thickness of the partition structure to a thickness of the light emitting functional layer is greater than 1.5).

For example, FIG. 19 schematically shows that all film layers included in the light emitting functional layer 120 are disconnected at the partition projection portion 7420 of the partition structure 140 and the second electrode 132 is not disconnected at the partition projection portion 7420 of the partition structure 140. But it is not limited thereto, in another example, by setting the thickness of the partition structure, a part of a film layer on a side close to the base substrate in the light emitting functional layer is disconnected at the partition projection portion, a part of the film layer on a side away from the base substrate in the light emitting functional layer is not disconnected at the partition projection portion, and the second electrode is not disconnected at the partition projection portion.

For example, as shown in FIG. 19, a material of the first sub-partition structure 741 includes an organic material.

For example, as shown in FIG. 19, the display substrate further includes an organic layer 180 located between the second sub-partition structure 742 and the base substrate 110. The organic layer 180 may serve as a planarization layer.

For example, as shown in FIG. 19, the first sub-partition structure 741 and the organic layer 180 are of an integral structure. For example, the first sub-partition structure 741 may be a part of the organic layer 180. For example, the first sub-partition structure 741 may be a part of the organic layer 180 that projects toward a side away from the base substrate 110.

For example, as shown in FIG. 19, the organic layer 180 includes a Planarization (PLN) layer. For example, a material of the first sub-partition structure 741 includes a material of a photoresist, a Polyimide (PI) resin, an acrylic resin, a silicon compound, or a polyacrylic resin.

For example, as shown in FIG. 19, a first cross section of the first sub-partition structure 741 taken by a plane along an arrangement direction of adjacent sub-pixels 200 and perpendicular to the base substrate 110 includes a rectangle. For example, the first cross section of the first sub-partition structure 741 taken by the plane along the arrangement direction of adjacent sub-pixels 200 and perpendicular to the base substrate 110 includes a trapezoid, and an included angle between a side edge of the trapezoid and a bottom edge of the trapezoid on a side close to the base substrate 110 is not greater than 90 degrees.

For example, as shown in FIG. 19, the first cross section of the first sub-partition structure 741 may be a trapezoid, an upper base of the trapezoid is located on a side of a lower base of the trapezoid away from the base substrate 110, and an included angle between the side edge of the trapezoid and the lower base is not greater than 90 degrees.

For example, as illustrated in FIG. 19, a length of an upper base of a trapezoidal cross section of the first sub-partition structure 741 is smaller than a length of a side of a cross section of the second sub-partition structure 742 on a side close to the base substrate 110, so that an edge of the second sub-partition structure 742 and an edge of the upper base of the first sub-partition structure 741 form an undercut structure, that is, the edge of the second sub-partition structure 742 includes the partition projection portion 7420.

FIG. 19 schematically shows that a side edge of the first sub-partition structure 741 is a straight edge, but is not limited thereto. In an actual process, the side edge of the first sub-partition structure 741 formed may also be a curved edge, for example, the curved edge is curved to a side away from a center of the first sub-partition structure 741 in which the curved edge is located, or the curved edge is curved to a side close to the center of the first sub-partition structure 741 in which the curved edge is located. At this time, an included angle between the curved edge and a lower base of the first sub-partition structure 741 may refer to an included angle between a tangent line at a midpoint of the curved edge and the lower base, or may refer to an included angle between a tangent line at an intersection point of the curved edge and the lower base, and the lower base.

For example, as shown in FIG. 19, a second cross section of the second sub-partition structure 742 taken by a plane along an arrangement direction of adjacent sub-pixels 200 and perpendicular to the base substrate 110 includes a rectangle or trapezoid. For example, FIG. 19 schematically shows that a shape of the second cross section of the second sub-partition structure 742 is a rectangle, and by setting a short side of the second cross section of the second sub-partition structure 742 such that an included angle between the short side and a long side of the second sub-partition structure 742 close to the base substrate 110 is a right angle or a substantially right angle (for example, a substantially right angle may mean that a difference between an included angle between two sides, and 90 degrees is not more than 10 degrees), it may be beneficial for the light emitting functional layer 120 to be disconnected at ah edge of the second sub-partition structure 742.

For example, a shape of a second cross section of the second sub-partition structure 742 taken by a plane along an arrangement direction of adjacent sub-pixels 200 and perpendicular to the base substrate 110 may be a trapezoid, and an included angle between a side edge of the trapezoid and a bottom edge of the trapezoid on a side away from the base substrate 110 is not less than 70 degrees. In the embodiment of the present disclosure, the light emitting functional layer 120 may be disconnected at an edge of the second sub-partition structure 742 by setting an included angle between a side edge of the second sub-partition structure 742 and the bottom edge of the trapezoid on a side away from the base substrate.

For example, the shape of the second cross section of the second sub-partition structure 742 may be a trapezoid, and a length of a bottom edge of the trapezoid on a side away from the base substrate 110 is smaller than a length of a bottom edge of the trapezoid on a side close to the base substrate 110.

Figure 21A:
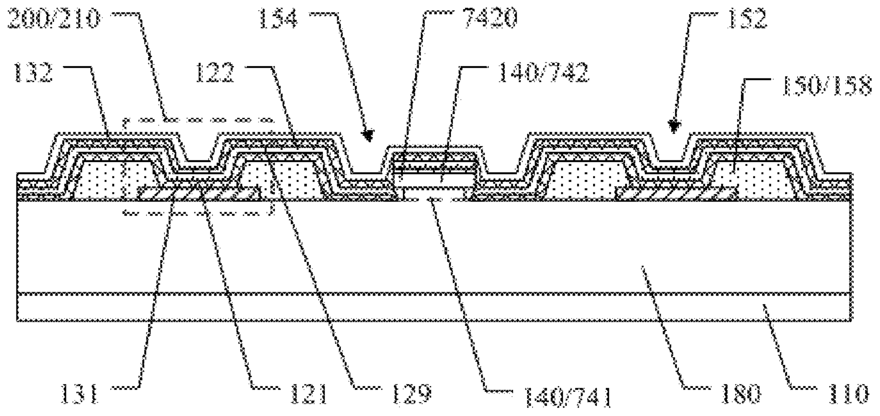
FIG. 21A is a schematic diagram of a partial sectional structure of a display substrate according to another example of an embodiment of the present disclosure.

FIG. 21A is a schematic diagram of a partial sectional structure of a display substrate according to another example of an embodiment of the present disclosure. The display substrate shown in FIG. 21A differs from the display substrate shown in FIG. 19 in that a shape of a first cross section of the first sub-partition structure 741 taken by a plane along an arrangement direction of adjacent sub-pixels 200 and perpendicular to the base substrate 110 is different. For example, as shown in FIG. 21A, a shape of a first cross section of the first sub-partition structure 741 taken by a plane perpendicular to the base substrate 110 may be a rectangle, and a shape of a second cross section of the second sub-partition structure 742 taken by the plane perpendicular to the base substrate 110 may also be a rectangle, which may be beneficial for the light emitting functional layer 120 to be disconnected at an edge of the partition structure 140.

Figure 21B:
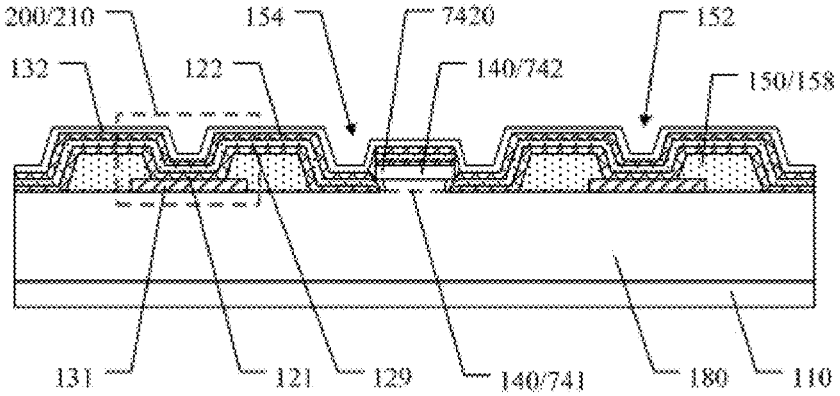
FIG. 21B is a schematic diagram of a partial sectional structure of a display substrate according to another example of an embodiment of the present disclosure.

FIG. 21B is a schematic diagram of a partial sectional structure of a display substrate according to another example of an embodiment of the present disclosure. The display substrate shown in FIG. 21B differs from the display substrate shown in FIG. 21A in that a shape of a first cross section of the first sub-partition structure 741 taken by a plane along an arrangement direction of adjacent sub-pixels 200 and perpendicular to the base substrate 110 is different. For example, as shown in FIG. 21B, a shape of a first cross section of the first sub-partition structure 741 taken by a plane perpendicular to the base substrate 110 may be a trapezoid, and a length of a bottom edge of the trapezoid on a side away from the base substrate 110 is larger than a length of a bottom edge of the trapezoid on a side close to the base substrate 110, which may be beneficial for the light emitting functional layer 120 to be disconnected at an edge of the partition structure 140.

For example, as shown in FIG. 19 to FIG. 21B, the first electrode 131 is in contact with a surface of the organic layer 180 on a side away from the base substrate 110. For example, the first electrode 131 may be an anode and the second electrode 132 may be a cathode. For example, the cathode may be formed of a material with a high conductivity and a low work function, for example, the cathode may be made of a metal material. For example, the anode may be formed of a transparent conductive material with a high work function.

For example, as shown in FIG. 19 to FIG. 21B, the display substrate further includes a pixel definition layer 150 located on a side of the organic layer 180 away from the base substrate 110, the pixel definition layer 150 includes a plurality of first openings 152 disposed in one-to-one correspondence with a plurality of sub-pixels 200 to define light emitting regions of the plurality of sub-pixels 200, a first opening 152 is configured to expose the first electrode 131. For example, at least part of the first electrode 131 is located between the pixel definition layer 150 and the base substrate 110. For example, when the light emitting functional layer 120 is formed in the first opening 152 of the pixel definition layer 150, the first electrode 131 and the second electrode 132 located on two sides of the light emitting functional layer 120 may drive the light emitting functional layer 120 in the first opening 152 to emit light. For example, the above-mentioned light emitting regions may refer to regions where sub-pixels effectively emit light and a shape of a light emitting region may refer to a two-dimensional shape, for example, the shape of the light emitting region may be the same as a shape of the first opening 152 of the pixel definition layer 150.

For example, as shown in FIG. 19 to FIG. 21B, a part of the pixel definition layer 150 other than the first opening 152 is a pixel definition portion, and a material of the pixel definition portion may include polyimide, acrylic, or polyethylene terephthalate, etc.

For example, as shown in FIG. 19 to FIG. 21B, the pixel definition layer 150 further includes a plurality of second openings 154, and a second opening 154 is configured to expose the partition structure 140. For example, a spacing is disposed between the partition structure 140 and the pixel definition portion of the pixel definition layer 150.

For example, as shown in FIG. 19 to FIG. 21B, the second sub-partition structure 742 includes at least one layer of partition layer. For example, the second sub-partition structure 742 may include a single layer of partition layer, and a material of the single layer of film layer may be silicon oxide or silicon nitride. For example, the second sub-partition structure 742 may include two layers of partition layers, materials of the two layers of partition layers are silicon oxide and silicon nitride respectively. The embodiment of the present disclosure is not limited thereto, the second sub-partition structure may include three or more layers of partition layers, and a quantity of partition layers included in the second sub-partition structure may be set according to product requirements.

For example, as shown in FIG. 19 to FIG. 21B, along a direction perpendicular to the base substrate 110, a thickness of the partition structure 140 is smaller than a thickness of the pixel definition portion.

For example, as shown in FIG. 19 to FIG. 21B, along a direction parallel to the base substrate 110, a size of the partition projection portion 7420 is not less than 0.01 micron. For example, the size of the partition projection portion 7420 is not less than 0.1 micron along the direction parallel to the base substrate 110. For example, the size of the partition projection portion 7420 along the direction parallel to the base substrate 110 may be 0.01 to 5 microns. For example, the size of the partition projection portion 7420 along the direction parallel to the base substrate 110 may be 0.05 to 4 microns. For example, the size of the partition projection portion 7420 along the direction parallel to the base substrate 110 may be 0.1 to 2 microns.

For example, as shown in FIG. 19 to FIG. 21B, a second cross section of the second sub-partition structure 742 taken by a plane along an arrangement direction of adjacent sub-pixels 200 and perpendicular to the base substrate 110 includes a rectangle or trapezoid. For example, a shape of the second cross section of the second sub-partition structure 742 is a rectangle, and by setting a short side of the second cross section of the second sub-partition structure 742 such that an included angle between the short side and a long side of the second sub-partition structure 742 on a side close to the base substrate 110 is a right angle or a substantially right angle (for example, a substantially right angle may mean that a difference between an included angle between two sides, and 90 degrees is not more than 10 degrees), it may be beneficial for light emitting functional layer 120 to be disconnected at an edge of the second sub-partition structure 742.

For example, a second cross section of the second sub-partition structure 742 may be a trapezoid, and an included angle between a side edge of the trapezoid and a bottom edge of the trapezoid on a side close to the base substrate 110 not less than 70 degrees. For example, the second cross section may be a trapezoid, and the included angle between the side edge of the trapezoid and the bottom edge of the trapezoid on the side close to the base substrate 110 is not less than 90 degrees, such that an included angle between a side edge of the second sub-partition structure 742 and the bottom edge of the trapezoid on the side away from the base substrate 110 is an acute angle, which may be beneficial for the light emitting functional layer 120 to be disconnected at an edge of the second sub-partition structure 742.

For example, the display substrate further includes a pixel circuit (i.e., a pixel drive circuit), and a first electrode 131 of an organic light emitting element 210 may be connected with one of a source electrode and a drain electrode of a thin film transistor in the pixel circuit through a via penetrating through a film layer such as an organic layer 180. For example, the pixel circuit further includes a storage capacitor. For example, a gate insulation layer, an interlayer dielectric layer, some film layers in the pixel circuit, a film layer where a data line, a gate line, a power supply signal line, a reset power supply signal line, a reset control signal line, a light emitting control signal line, and the like are located may also be disposed between the organic layer 180 and the base substrate 110. For example, a film layer between the organic layer 180 and the base substrate 110 may include one layer of power supply signal lines or two layers of power supply signal lines. For example, a surface of the organic layer 180 on a side facing the base substrate 110 may be in contact with the interlayer dielectric layer.

For example, a side of the pixel definition portion of the pixel definition layer 150 away from the base substrate 110 may also be provided with a spacer configured to support an evaporation mask for manufacturing an emitting layer.

For example, an embodiment of the present disclosure provides a manufacturing method for forming the display substrate shown in FIG. 19, which includes forming a plurality of sub-pixels 200 on a base substrate 110, wherein forming the sub-pixels 200 includes sequentially forming a first electrode 131, a light emitting functional layer 120, and a second electrode 132 which are stacked in a direction perpendicular to the base substrate 110; forming a first material layer on the base substrate 110; forming a second material layer on the first material layer, wherein the second material layer is an inorganic nonmetallic material layer; and patterning the first material layer and the second material layer simultaneously to form a partition structure 140. Forming the partition structure 140 includes patterning the second material layer to form a second sub-partition structure 742 while a part of the first material layer directly located below the second sub-partition structure 742 forms a first sub-partition structure 74; an edge of the second sub-partition structure 742 in the partition structure 140 located between adjacent sub-pixels 200 projects relative to an edge of the first sub-partition structure 741 along an arrangement direction of the adjacent sub-pixels 200 to form a partition projection portion 7420; the light emitting functional layer 120 is formed after the partition structure 140 is formed and includes a plurality of film layers, at least one of the plurality of film layers is disconnected at the partition projection portion 7420.

For example, the first material layer is an organic material layer, and patterning the first material layer and the second material layer simultaneously to form the partition structure 140 includes: etching the second material layer using dry etching to form the second sub-partition structure 742 while the organic material layer is also etched, and a part of the organic material layer directly located below the second sub-partition structure 742 forms the first sub-partition structure 741 after dry etching.

For example, FIG. 22A to FIG. 22D are flowcharts of a method for manufacturing a display substrate before the display substrate shown in FIG. 19 is formed. As shown in FIG. 19 and FIG. 22A to FIG. 22D, the method for manufacturing the display substrate includes: forming a plurality of sub-pixels 200 on a base substrate 110, wherein forming the sub-pixels 200 includes: sequentially forming a first electrode 131, a light emitting functional layer 120, and a second electrode 132 that are stacked in a direction perpendicular to the base substrate 110; forming an organic material layer 180 (i.e., a first material layer) on the base substrate 110; forming an inorganic nonmetallic material layer 030 (i.e., a second material layer) on the organic material layer 180; while patterning the inorganic nonmetallic material layer 030 to form a second sub-partition structure 742, the organic material layer 180 is also etched, and a part of the organic material layer 180 directly located below the second sub-partition structure 742 forms a first sub-partition structure 741 after etching. A partition structure 140 includes the first sub-partition structure 741 and the second sub-partition structure 742, along an arrangement direction of adjacent sub-pixels 200, an edge of the second sub-partition structure 742 in the partition structure 140 located between the adjacent sub-pixels 200 projects relative to an edge of the first sub-partition structure 741 to form a partition projection portion 7420; the light emitting functional layer 120 is formed after the partition structure 140 is formed and includes a plurality of film layers, at least one of the plurality of film layers is disconnected at the partition projection portion 7420.

Figure 22A:
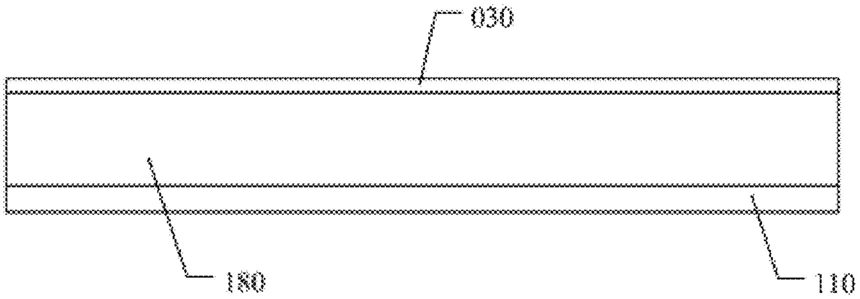
FIG. 22A to FIG. 22D are flowcharts of a method for manufacturing a display substrate before the display substrate shown in FIG. 19 is formed.

For example, as shown in FIG. 19 and FIG. 22A, the method for manufacturing the display substrate may include: preparing a base substrate 110 on a glass carrier plate, and sequentially forming a drive structure layer (the drive structure layer is not shown in FIG. 22A), an organic material layer 180, and an inorganic nonmetallic material layer 030 on the base substrate 110.

For example, the base substrate 110 may be a flexible base substrate. For example, forming the base substrate 110 may include: sequentially forming a first flexible material layer, a first inorganic material layer, a semiconductor layer, a second flexible material layer, and a second inorganic material layer stacked on the glass carrier plate. Materials of the first flexible material layer and the second flexible material layer are Polyimide (PI), Polyethylene Terephthalate (PET), or a surface-treated polymer soft film, or the like. Materials of the first inorganic material layer and the second inorganic material layer are Silicon Nitride (SiNx) or Silicon Oxide (SiOx), etc., which are used for improving water and oxygen resistance of the base substrate. The first inorganic material layer and the second inorganic material layer are also referred to as Barrier layers.

For example, before the organic material layer 180 is formed, a drive structure layer of a pixel circuit (i.e., a pixel drive circuit) may be formed on the base substrate 110 (the drive structure layer is not shown in FIG. 22A). The drive structure layer includes a plurality of pixel circuits, and each pixel circuit includes a plurality of transistors and at least one storage capacitor. For example, the pixel circuit may be of a design of 2T1C, 3T1C, or 7T1C. For example, forming the drive structure layer may include: sequentially depositing a first insulation thin film and an active layer thin film on the base substrate 110, patterning the active layer thin film through a patterning process (or a process of patterning) to form a first insulation layer covering the entire base substrate 110, and a pattern of an active layer disposed on the first insulation layer, the pattern of the active layer includes at least the active layer. For example, a second insulation thin film and a first metal thin film are sequentially deposited, and the first metal thin film is patterned through a patterning process to form a second insulation layer covering the pattern of the active layer and a pattern of a first gate metal layer disposed on the second insulation layer, the pattern of the first gate metal layer includes at least a gate electrode and a first capacitor electrode. For example, a third insulation thin film and a second metal thin film are sequentially deposited, the second metal thin film is patterned through a patterning process to form a third insulation layer covering the first gate metal layer and a pattern of a second gate metal layer disposed on the third insulation layer, the pattern of the second gate metal layer includes at least a second capacitor electrode, and a position of the second capacitor electrode corresponds to a position of the first capacitor electrode. Subsequently, a fourth insulation thin film is deposited, and the fourth insulation thin film is patterned through a patterning process to form a fourth insulation layer covering the second gate metal layer, wherein at least two first vias are disposed on the fourth insulation layer, and the fourth insulation layer, the third insulation layer, and the second insulation layer within the two first vias are etched away to expose a surface of the active layer of the pattern of the active layer. Subsequently, a third metal thin film is deposited, the third metal thin film is patterned through a patterning process, and a pattern of a source-drain metal layer is formed on the fourth insulation layer, wherein the pattern of the source-drain metal layer includes at least a source electrode and a drain electrode located in a display region. The source electrode and the drain electrode may be connected with the active layer in the pattern of the active layer through a first via, respectively.

For example, the first insulation layer, the second insulation layer, the third insulation layer, and the fourth insulation layer described above may be made of any one or more of Silicon Oxide (SiOx), Silicon Nitride (SiNx), and Silicon Oxynitride (SiON), and may be a single layer, a multi-layer, or a composite layer. The first insulation layer may be a buffer layer, which is used for improving water and oxygen resistance of the base substrate 110; the second insulation layer and the third insulation layer may be Gate Insulator (GI) layers; and the fourth insulation layer may be an Interlayer Dielectric (ILD) layer. The first metal thin film, the second metal thin film, and the third metal thin film are made of metal materials, such as any one or more of Argentum (Ag), Copper (Cu), Aluminum (Al), Titanium (Ti), and Molybdenum (Mo), or an alloy material of the above-mentioned metals, such as an Aluminum-Neodymium alloy (AlNd) or a Molybdenum-Niobium alloy (MoNb), and may be of a single-layer structure, or a multi-layer composite structure such as Ti/Al/Ti. The active layer thin film is made of one or more of materials such as amorphous Indium Gallium Zinc Oxide (a-IGZO), Zinc Oxynitride (ZnON), Indium Zinc Tin Oxide (IZTO), amorphous Silicon (a-Si), poly Silicon (p-Si), hexathiophene, or polythiophene, that is, the present disclosure is applicable to transistors that are manufactured based on an oxide technology, a silicon technology, and an organic matter technology.

Figure 22B:
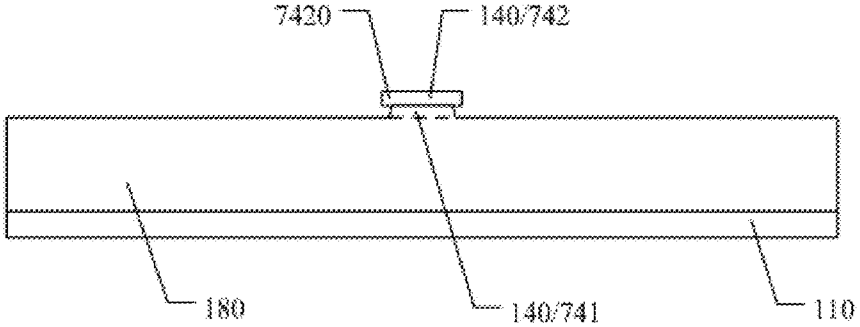

For example, as shown in FIG. 22A and FIG. 22B, after the inorganic nonmetallic material layer 030 is formed, the inorganic nonmetallic material layer 030 is patterned. For example, patterning the inorganic nonmetallic material layer 030 includes: etching the inorganic nonmetallic material layer 030 using dry etching to form the second sub-partition structure 742 while the organic material layer 180 is also etched, and a part of the organic material layer 180 directly located below the second sub-partition structure 742 forms the first sub-partition structure 741 after dry etching. For example, the inorganic nonmetallic material layer 030 at a position where the second sub-partition structure 742 is to be formed may be shielded using a mask, so that the inorganic nonmetallic material layer 030 at a position other than the position where the second sub-partition structure 742 is to be formed is etched and removed. In a process of dry etching the inorganic nonmetallic material layer 030, an etching gas etches a part of the organic material layer 180 that is not shielded by the mask to a certain thickness, so that the organic material layer with an original thickness is retained directly below the inorganic nonmetallic material layer retained after etching (i.e., the second sub-partition structure 742), so that a projection portion directly below the second sub-partition structure 742 is formed on a side of the organic material layer 180 away from the base substrate 110, and the projection portion is the first sub-partition structure 741. The etched organic material layer 180 is a planarization layer 180, and a projection portion (i.e., the first sub-partition structure 741) is formed on a side of the planarization layer 180 away from the base substrate 110. The planarization layer 180 is also formed with a second via, and the second via is configured such that a first electrode formed subsequently is connected with a pixel drive circuit of the drive structure layer through the second via; the etched inorganic nonmetallic material layer 030 forms the second sub-partition structure 742; the first sub-partition structure 741 and the second sub-partition structure 742 constitute the partition structure 140.

For example, as shown in FIG. 22A and FIG. 22B, in a process of dry etching the inorganic nonmetallic material layer 030, the organic material layer 180 is etched with a thickness that may be 100 to 10,000 angstroms, and a thickness of the first sub-partition structure 741 formed may be 100 to 10,000 angstroms. For example, in a process of dry etching the inorganic nonmetallic material layer 030, the organic material layer 180 is etched with a thickness that may be 200 to 2000 angstroms, and a thickness of the first sub-partition structure 741 formed may be 200 to 2000 angstroms.

Figure 22C:
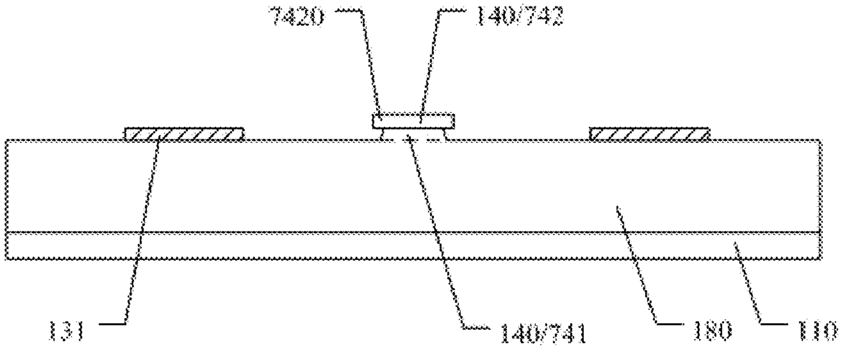

For example, as shown in FIG. 19 and FIG. 22C, after the partition structure 140 is formed, a first electrode 131 of a sub-pixel is formed on the planarization layer 180. For example, the first electrode 131 is connected with a drain electrode of a transistor in the pixel drive circuit through the second via in the planarization layer 180.

For example, the first electrode 131 may be made of a metal material, such as any one or more of Magnesium (Mg), Argentum (Ag), Copper (Cu), Aluminum (Al), Titanium (Ti), and Molybdenum (Mo), or an alloy of the above metals, such as an Aluminum Neodymium alloy (AlNd) or a Molybdenum Nniobium alloy (MoNb), which may be of a single-layered structure or a multi-layer composite structure, such as Ti/Al/Ti, or may be of a stacked structure formed by a metal and a transparent conductive material, e.g., a reflective material, such as ITO/Ag/ITO and Mo/AlNd/ITO.

Figure 22D:
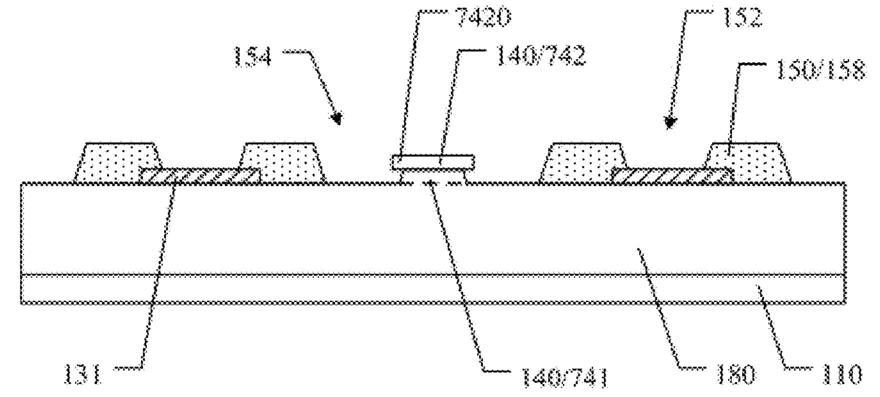

For example, as shown in FIG. 19 and FIG. 22D, after the first electrode 131 is formed, a pixel definition layer 150 may be formed. For example, a pixel definition thin film is coated on the base substrate 110 on which the above-mentioned patterns are formed, and the pixel definition layer 150 is formed through mask, exposure, and development processes. For example, the pixel definition layer 150 of the display region includes a plurality of pixel definition portions 158, a first opening 152 or a second opening 154 is formed between adjacent pixel definition portions 401, a pixel definition film within the first opening 152 and the second opening 154 is developed, the first opening 152 exposes at least part of surfaces of first electrodes 131 of a plurality of sub-pixels, and the second opening 154 exposes the partition structure 140.

For example, after the pixel definition layer 150 is formed, a spacer may be formed on the pixel definition portion. For example, an organic material thin film is coated on the base substrate 110 on which the above-mentioned patterns are formed, and the spacer is formed through mask, exposure, and development processes. The spacer may be used as a support layer and is configured to support a Fine Metal Mask (FMM) during an evaporation process.

For example, as shown in FIG. 19, after the spacer is formed, a light emitting functional layer 120 and a second electrode 132 are sequentially formed. For example, the second electrode 132 may be a transparent cathode. Light may be emitted from a side of the light emitting functional layer 120 away from the base substrate 110 through the transparent cathode so as to achieve top emission. For example, the second electrode 132 may be made of any one or more of Magnesium (Mg), Argentum (Ag), and Aluminum (Al), or an alloy made of any one or more of the above metals, or a transparent conductive material, such as Indium Tin Oxide (ITO), or be of a multi-layer composite structure of a metal and a transparent conductive material.

For example, forming the light emitting functional layer 120 may include sequentially evaporating to form a hole injection layer and a hole transport layer using an open mask; sequentially evaporating to form a first emitting layer 121 emitting light of different colors, such as a blue-light emitting layer, a green-light emitting layer, and a red-light emitting layer using an FMM; sequentially evaporating to form an electron transport layer, a charge generation layer 129, and a hole transport layer using an open mask; sequentially evaporating to form a second emitting layer 122 emitting light of different colors, such as a blue-light emitting layer, a green-light emitting layer, and a red-light emitting layer using an FMM; sequentially evaporating to form an electron transport layer, a second electrode, and an optical coupling layer using an open mask. For example, the hole injection layer, the hole transport layer, the electron transport layer, the charge generation layer, the second electrode, and the optical coupling layer are all common layers of a plurality of sub-pixels.

For example, as shown in FIG. 19, the formed light emitting functional layer 120 may be disconnected at the partition projection portion 7420 of the partition structure 140, so that one part of the light emitting functional layer 120 located within the second opening 154 of the pixel definition layer 150 is located on the partition structure 140 and the other part is located on the organic layer 180.

For example, after forming the second electrode 132, the method for manufacturing the display substrate further includes: forming an encapsulation layer which may include a first encapsulation layer, a second encapsulation layer, and a third encapsulation layer that are stacked. The first encapsulation layer is made of an inorganic material, and covers the second electrode 132 in the display region. The second encapsulation layer is made of an organic material. The third encapsulation layer is made of an inorganic material, and covers the first encapsulation layer and the second encapsulation layer. However, this embodiment is not limited thereto. For example, the encapsulation layer may also be of a five-layer structure of inorganic/organic/inorganic/organic/inorganic.

For example, relative to the display substrate with no partition structure formed, in the display substrate formed with the partition structure according to the embodiment of the present disclosure, only one mask process is added, which has a relatively low influence on process productivity.

Figure 23:
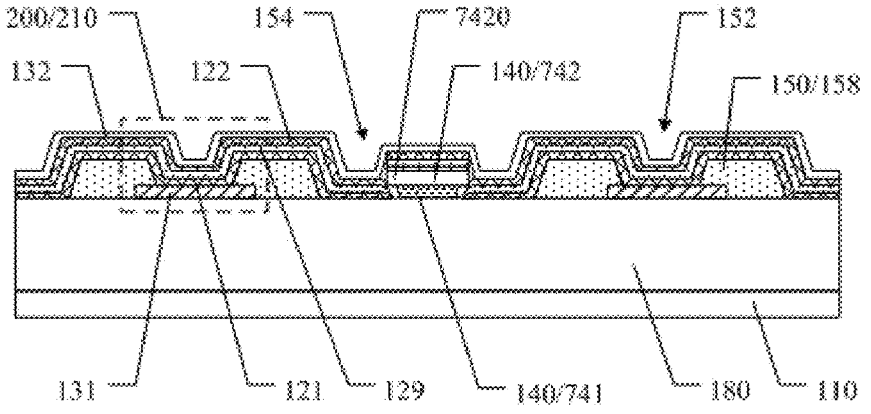
FIG. 23 is a schematic diagram of a partial sectional structure of a display substrate according to another example of an embodiment of the present disclosure.

FIG. 23 is a schematic diagram of a partial sectional structure of a display substrate according to another example of an embodiment of the present disclosure. The display substrate in the example shown in FIG. 23 differs from the display substrate in the example shown in FIG. 19 in that a material of a first sub-partition structure 741 in the display substrate shown in FIG. 23 includes an inorganic nonmetallic material. A sub-pixel 200, a base substrate 110, and a pixel definition layer 150 in the display substrate shown in FIG. 23 may have same characteristics as the sub-pixel 200, the base substrate 110, and the pixel definition layer 150 in the display substrate in any example shown in FIG. 19 to FIG. 21B, which will not be repeated here.

For example, as shown in FIG. 23, a material of the first sub-partition structure 741 is different from a material of the second sub-partition structure 742. For example, the material of the second sub-partition structure 742 may include any one or more of silicon nitride, silicon oxide, or silicon oxynitride, and the material of the first sub-partition structure 741 may also include any one or more of silicon nitride, silicon oxide, or silicon oxynitride, and the material of the first sub-partition structure 741 is different from that of the second sub-partition structure 742.

For example, as shown in FIG. 23, a plurality of sub-pixels 200 may include two adjacent sub-pixels 200 arranged along an arrangement direction of adjacent sub-pixels. For example, at least one edge of the second sub-partition structure 742 projects relative to a corresponding edge of the first sub-partition structure 741 to form at least one partition projection portion 7420. For example, as shown in FIG. 23, edges on two sides of the second sub-partition structure 742 each project relative to corresponding edges of the first sub-partition structure 741 to form two partition projection portions 7420. For example, the two partition projection portions 7420 are arranged along the arrangement direction of adjacent sub-pixels.

For example, FIG. 23 schematically shows that a partition structure 140 is disposed between two adjacent sub-pixels 200, and the partition structure 140 includes two partition projection portions 7420. However, it is not limited to this. Two or more partition structures may also be disposed between two adjacent sub-pixels, and each partition structure includes at least one partition projection portion. By setting a quantity of partition structures and a quantity of partition projection portions, it is beneficial for at least one layer of a light emitting functional layer to have a better disconnection effect.

For example, as shown in FIG. 23, an orthographic projection of a surface of the first sub-partition structure 741 facing the second sub-partition structure 742 on the base substrate 110 is completely within an orthographic projection of a surface of the second sub-partition structure 742 on a side facing the base substrate 110 on the base substrate 110.

For example, as shown in FIG. 23, a thickness of the first sub-partition structure 741 is greater than a thickness of the second sub-partition structure 742 in a direction perpendicular to the base substrate 110.

For example, as shown in FIG. 23, a thickness of the partition structure 140 is smaller than a thickness of a pixel definition portion 401 in the direction perpendicular to the base substrate 110. For example, a spacing is disposed between the partition structure 140 and the pixel definition portion 401.

For example, as shown in FIG. 23, a surface of an organic layer 180, on a side away from the base substrate 110, exposed by a second opening 154 of the pixel definition layer 150 may be a flat surface, that is, the surface of the organic layer 180 on the side away from the base substrate 110 does not include a projection portion. For example, as shown in FIG. 23, the first sub-partition structure 741 is disposed on the surface of the organic layer 180 on the side away from the base substrate 110.

For example, as shown in FIG. 23, a thickness of the second sub-partition structure 742 is not greater than a thickness of a light emitting functional layer 120 in the direction perpendicular to the base substrate 110. For example, the thickness of the second sub-partition structure 742 may be 500 to 8000 angstroms.

For example, as shown in FIG. 23, a ratio of a thickness of the partition structure 140 to a thickness of the light emitting functional layer 120 along a direction perpendicular to the base substrate 110 is 0.8 to 1.2. For example, the ratio of the thickness of the partition structure 140 to the thickness of the light emitting functional layer 120 is 0.9 to 1.1. in an example of the embodiment of the present disclosure, by setting the thickness of the partition structure, for example, setting the ratio of the thickness of the partition structure to the thickness of the light emitting functional layer to 0.8 to 1.2, the light emitting functional layer 120 is disconnected at the partition projection portion 7420 of the partition structure 140, while the second electrode 132 remains continuous and non-partitioned, thereby crosstalk between adjacent sub-pixels is prevented while the second electrode is not partitioned and uniformity of display is ensured.

For example, FIG. 23 schematically shows that all film layers included in the light emitting functional layer 120 are disconnected at the partition projection portion 7420 of the partition structure 140. However, it is not limited to this. It may also be that a part of the films layer of the light emitting functional layer 120 is disconnected at the partition projection portion 7420 of the partition structure 140, and another part of the film layers is continuous at the partition projection portion 7420. A film layer disconnected at the partition projection portion 7420 may be regarded as a film layer with dislocation, by disposing the film layer to be in a staggered manner at the partition projection portion 7420, it is beneficial to reduce lateral crosstalk of film layers.

Of course, the example shown in FIG. 23 is not limited thereto, and a thickness of the partition structure may also be set larger than a thickness of the light emitting functional layer, so that both the light emitting functional layer and the second electrode are disconnected at an edge of the partition structure.

For example, as shown in FIG. 23, a first cross section of the first sub-partition structure 741 taken by a plane along an arrangement direction of adjacent sub-pixels 200 and perpendicular to the base substrate 110 includes a rectangle or a trapezoid. For example, the first cross section is a trapezoid, and a length of a bottom edge of the trapezoid on a side away from the base substrate 110 is larger than a length of a bottom edge of the trapezoid on a side close to the base substrate 110. For example, an included angle between a side edge of the trapezoid and the bottom edge of the trapezoid on the side close to the base substrate 110 is not less than 70 degrees. For example, a size of the partition projection portion 7420 along a direction parallel to the base substrate 110 is not less than 0.01 micron. For example, the size of the partition projection portion 7420 along the direction parallel to the base substrate 110 is not less than 0.1 micron.

For example, as shown in FIG. 23, a size of the partition projection portion 7420 may be in a range of 0.01 to 5 microns. For example, the included angle between the side edge of the trapezoid and the bottom edge of the trapezoid on the side close to the base substrate 110 is not less than 90 degrees. For example, the size of the partition projection portion 7420 may be in a range of 0.1 to 2 microns.

For example, a side edge of the first sub-partition structure 741 may be a straight edge or a curved edge. For example, the curved edge is curved toward a side close to a center of the first sub-partition structure 741 in which the curved edge is located. At this time, an included angle between the curved edge of the first sub-partition structure 741 and a bottom edge on a side close to the base substrate 110 may refer to an included angle between a tangent line at a midpoint of the curved edge and the bottom edge, or an included angle between a tangent line at an intersection of the curved edge and the bottom edge, and the bottom edge.

In the embodiment of the present disclosure, by setting a thickness of a partition structure, a size of a partition projection portion, and an angle of a side edge of a first sub-partition structure, it may be achieved that at least one film layer of a light emitting functional layer is disconnected at the partition projection portion.

For example, as shown in FIG. 23, a second cross section of the second sub-partition structure 742 taken by a plane along an arrangement direction of adjacent sub-pixels 200 and perpendicular to the base substrate 110 includes a rectangle or trapezoid. For example, a shape of the second cross section of the second sub-partition structure 742 is a rectangle, and by setting a short side of the second cross section of the second sub-partition structure 742 such that an included angle between the short side and a long side of the second sub-partition structure 742 on a side close to the base substrate 110 is a right angle or a substantially right angle (for example, a substantially right angle may mean that a difference between an included angle between two sides and 90 degrees is not more than 10 degrees), it may be beneficial for the light emitting functional layer 120 to be disconnected at an edge of the second sub-partition structure 742.

For example, the second cross section of the second sub-partition structure 742 may be a trapezoid, and an included angle between a side edge of the trapezoid and a bottom edge of the trapezoid on a side close to the base substrate 110 not less than 70 degrees. For example, the second cross section may be a trapezoid, and an included angle between the side edge of the trapezoid and the bottom edge of the trapezoid on the side close to the base substrate 110 is not less than 90 degrees, so that an included angle between a side edge of the second sub-partition structure 742 and a bottom edge of the trapezoid on a side away from the base substrate 110 is an acute angle, which may be beneficial for the light emitting functional layer 120 to be disconnected at an edge of the second sub-partition structure 742.

For example, FIG. 23 schematically shows that the first sub-partition structure 741 includes one layer of film layer and the second sub-partition structure 742 includes one layer of film layer. However, it is not limited to this. At least one of the first sub-partition structure 741 and the second sub-partition structure 742 may include a plurality of layers of film layers, and at least an edge of the second sub-partition structure 742 protrudes relative to an edge of the first sub-partition structure 741 to form a partition projection portion for disconnecting at least one layer of the light emitting functional layer.

When an angle of a side edge of a partition structure is relatively large (such as an included angle between a side edge of a first cross section and a bottom edge of the first cross section on a side close to the base substrate, and/or an included angle between a side edge of a second cross section and a bottom edge of the second cross section on a side close to the base substrate), a deposited thickness of the light emitting functional layer is reduced as a whole, and at least one film layer of the light emitting functional layer located between adjacent sub-pixels is disconnected, so that a resistance of the film layer is increased, and crosstalk between adjacent sub-pixels is further reduced.

For example, an embodiment of the present disclosure provides a manufacturing method for forming the display substrate shown in FIG. 23, which includes forming a plurality of sub-pixels 200 on a base substrate 110, wherein forming the sub-pixels 200 includes sequentially forming a first electrode 131, a light emitting functional layer 120, and a second electrode 132 that are stacked in a direction perpendicular to the base substrate 110; forming a first material layer on the base substrate 110; forming a second material layer on the first material layer, wherein the second material layer is an inorganic nonmetallic material layer; and patterning the first material layer and the second material layer simultaneously to form a partition structure 140. Forming the partition structure 140 includes patterning the second material layer to form a second sub-partition structure 742 while the first material layer is also etched, and a part of the first material layer directly located below the second sub-partition structure 742 forms a first sub-partition structure 741 after etching; along an arrangement direction of adjacent sub-pixels 200, an edge of the second sub-partition structure 742 in the partition structure 140 located between the adjacent sub-pixels 200 protrudes relative to an edge of the first sub-partition structure 741 to form a partition projection portion 7420; the light emitting functional layer 120 is formed after the partition structure 140 is formed and includes a plurality of film layers, and at least one of the plurality of film layers is disconnected at the partition projection portion 7420.

For example, the first material layer is an inorganic material layer, and simultaneously patterning the first material layer and the second material layer to form the partition structure 140 includes simultaneously etching the first material layer and the second material layer with an etching liquid having different etching selectivity ratios for the first material layer and the second material layer, wherein an etching selectivity ratio of the etching liquid for the first material layer is greater than an etching selectivity ratio of the etching liquid for the second material layer, so that the edge of the first sub-partition structure 741 formed after the first material layer is etched is inwardly contracted relative to the edge of the second sub-partition structure 742 formed after the second material layer is etched to form an undercut structure.

For example, FIG. 24A to FIG. 24D are flowcharts of a method for manufacturing a display substrate before the display substrate shown in FIG. 23 is formed. As shown in FIG. 23 and FIG. 24A to FIG. 24D, the method for manufacturing the display substrate includes forming a plurality of sub-pixels 200 on a base substrate 110, wherein forming the sub-pixels 200 includes sequentially forming a first electrode 131, a light emitting functional layer 120, and a second electrode 132 that are stacked in a direction perpendicular to the base substrate 110; forming an organic material layer 180 on the base substrate 110; forming an inorganic nonmetallic material layer 030 on the organic material layer 180, wherein the inorganic nonmetallic material layer 030 includes at least two layers of film layers, such as a first film layer 031 (i.e., a first material layer) and a second film layer 032 (i.e., a second material layer); and patterning the inorganic nonmetallic material layer 030 to form a partition structure 140. The partition structure 140 includes a first sub-partition structure 741 and a second sub-partition structure 742, the first sub-partition structure 741 is located between the second sub-partition structure 742 and the base substrate 110; along an arrangement direction of adjacent sub-pixels 200, an edge of the second sub-partition structure 742 in the partition structure 140 located between the adjacent sub-pixels 200 protrudes relative to an edge of the first sub-partition structure 741 to form a partition projection portion 7420; the light emitting functional layer 120 is formed after the partition structure 140 is formed and includes a plurality of film layers, and at least one of the plurality of film layers is disconnected at the partition projection portion 7420.

For example, the manufacturing method for forming structures such as the base substrate 110, the sub-pixels 200, and the pixel definition layer 150 in the display substrate shown in FIG. 23 may be the same as the manufacturing method for forming structures such as the base substrate 110, the sub-pixels 200, and a pixel definition layer 150 in the display substrate shown in FIG. 22A to FIG. 22D, and will not be repeated here.

Figure 24A:
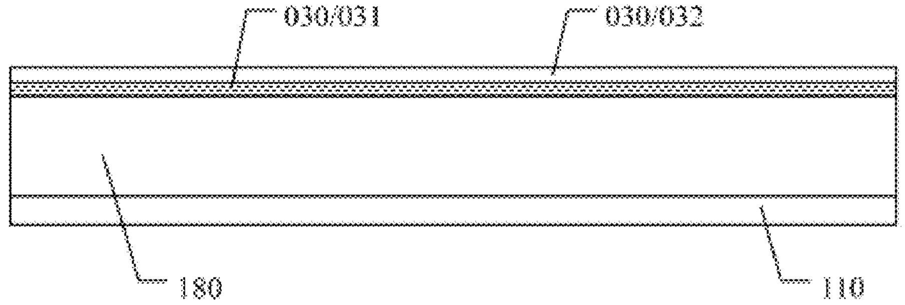
FIG. 24A to FIG. 24D are flowcharts of a method for manufacturing a display substrate before the display substrate shown in FIG. 23 is formed.
Figure 24B:
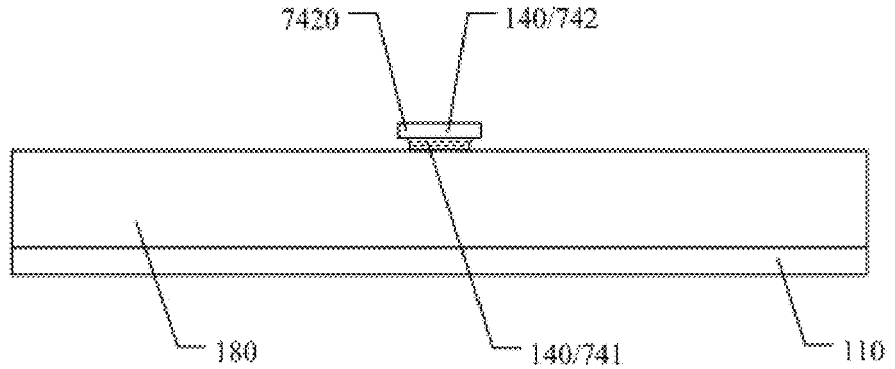

For example, as shown in FIG. 24A and FIG. 24B, after the inorganic nonmetallic material layer 030 is formed, the inorganic nonmetallic material layer 030 is patterned. For example, the inorganic non-metallic material layer 030 may include two layers of film layers, such as a first inorganic non-metallic material layer 031 and a second inorganic non-metallic material layer 032. Patterning the inorganic non-metallic material layer 030 includes etching the two layers of film layers included in the inorganic non-metallic material layer 030 using a wet etching process, and an etching selectivity ratio of an etching liquid or etching gas for the first inorganic non-metallic material layer 031 is greater than an etching selectivity ratio for the second inorganic non-metallic material layer 032, so that an edge of the first sub-partition structure 741 formed by etching the first inorganic non-metallic material layer 031 is inwardly contracted relative to an edge of the second sub-partition structure 742 formed by etching the second inorganic non-metallic material layer 032 to form an undercut structure, i.e., to form the partition projection portion 7420.

Figure 24C:
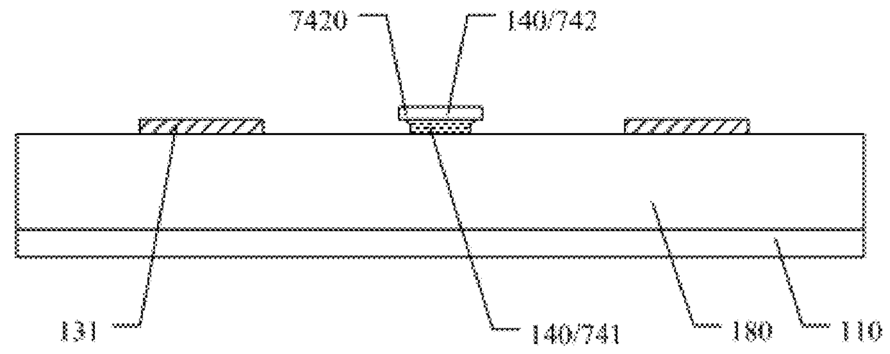

For example, as shown in FIG. 24C, after the partition structure 140 is formed, a first electrode 131 of an organic light emitting element 210 of a sub-pixel is formed by patterning on the planarization layer 180. A method and material for forming the first electrode 131 in this example, may be the same as that for forming the first electrode 131 shown in FIG. 22C and will not be repeated here.

Figure 24D:
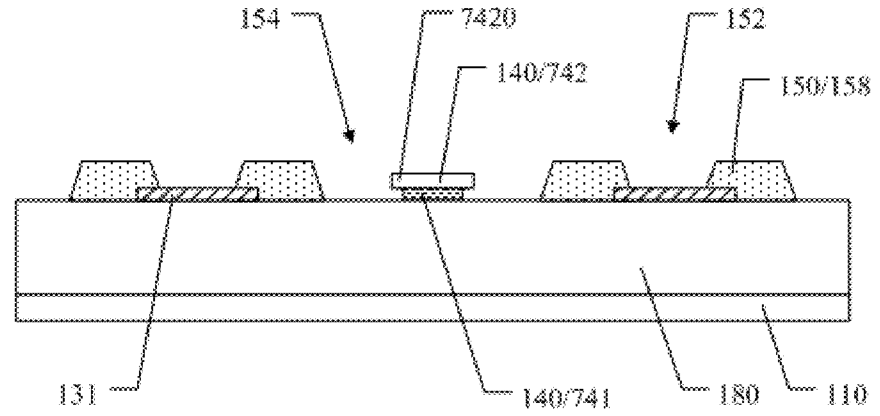

For example, as shown in FIG. 24D, after the first electrode 131 is formed, a pixel definition layer 150 may be formed. A method and material for forming the pixel definition layer 150 in this example may be the same as that for forming the pixel definition layer 150 shown in FIG. 22D and will not be repeated here. For example, acts after forming the pixel definition layer in this example may be the same as acts after forming the pixel definition layer inn the display substrate shown in FIG. 19 and will not be repeated here.

Figure 25:
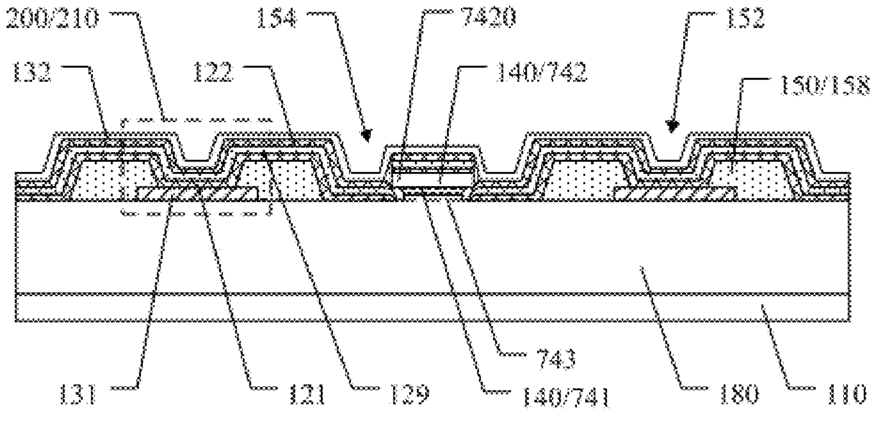
FIG. 25 is a schematic diagram of a partial sectional structure of a display substrate according to another example of an embodiment of the present disclosure.

For example, FIG. 25 is a schematic diagram of a partial sectional structure of a display substrate according to another example of an embodiment of the present disclosure. The display substrate in the example shown in FIG. 25 differs from the display substrate in the example shown in FIG. 23 in that the partition structure 140 further includes a third sub-partition structure 743. The sub-pixels 200, the base substrate 110, and the pixel definition layer 150 in the display substrate shown in FIG. 25 may have same characteristics as the sub-pixels 200, the base substrate 110, and the pixel definition layer 150 in the display substrate in any of examples shown in FIG. 19 to FIG. 21B and FIG. 23, and will not be repeated here. Materials, shapes, and a dimensional relationship of the first sub-partition structure 741 and the second sub-partition structure 742 in the display substrate shown in FIG. 25 may be the same as materials, shapes, and a dimensional relationship of the first sub-partition structure 741 and the second sub-partition structure 742 in the display substrate shown in FIG. 5, and will not be repeated here.

For example, as shown in FIG. 25, the third sub-partition structure 743 is located between the first sub-partition structure 741 and the base substrate 110. Along an arrangement direction of adjacent sub-pixels 200, an edge of the first sub-partition structure 741 in the partition structure 140 located between the adjacent sub-pixels 200 protrudes relative to an edge of the third sub-partition structure 743, and the third sub-partition structure 743 and the organic layer 180 are of an integral structure.

For example, as shown in FIG. 25, the third sub-partition structure 743 may be a part in the organic layer 180. For example, the third sub-partition structure 743 may be a part in the organic layer 180 that protrudes toward a side away from the base substrate 110. For example, the first sub-partition structure 741 may be located on a part in the organic layer 180 that protrudes toward a side away from the base substrate 110.

For example, as shown in FIG. 25, a material of the third sub-partition structure 743 includes a material of a photoresist, a Polyimide (PI) resin, an acrylic resin, a silicon compound, or a polyacrylic resin.

For example, as shown in FIG. 25, a thickness of the third sub-partition structure 743 may be 100 to 10,000 angstroms. For example, the thickness of the third sub-partition structure 743 may be 200 to 2000 angstroms.

For example, a cross section of the third sub-partition structure 743 taken by a plane along an arrangement direction of adjacent sub-pixels 200 and perpendicular to the base substrate 110 includes a rectangle. For example, a cross section of the third sub-partition structure 743 taken by a plane along an arrangement direction of adjacent sub-pixels 200 and perpendicular to the base substrate 110 includes a trapezoid, and an included angle between a side edge of the trapezoid and a bottom edge (a lower base of the trapezoid) the trapezoid on a side close to the base substrate 110 is not greater than 90 degrees.

For example, as shown in FIG. 25, a length of an upper base of a trapezoidal cross section of the third sub-partition structure 743 (a bottom edge of the trapezoidal cross section on a side away from the base substrate 110) is smaller than a length of a side of a cross-section of the first sub-partition structure 741 on a side close to the base substrate 110.

For example, a side edge of the third sub-partition structure 743 may be a straight edge or a curved edge. For example, the curved edge is curved toward a side away from a center of the third sub-partition structure 743 in which the curved edge is located, or the curved edge is curved toward a side close to the center of the third sub-partition structure 743 in which the curved edge is located, at this time, an included angle between the curved edge of the third sub-partition structure 743 and a lower base may refer to an included angle between a tangent line at a midpoint of the curved edge and the lower base, or an included angle between a tangent line at an intersection of the curved edge and the lower base, and the lower base.

For example, formation of the partition structure shown in FIG. 25 differs from formation of the partition structure shown in FIG. 23 in that the inorganic nonmetallic material layer 030 is etched using dry etching to form the first sub-partition structure 741 and the second sub-partition structure 742, while a part of the organic material layer 180, located directly below the first sub-partition structure 741, in the organic material layer 180 is dry etched to form the third sub-partition structure 743. For example, the inorganic nonmetallic material layer 030 at positions where the first sub-partition structure 741 and the second sub-partition structure 742 are to be formed may be shielded using a mask so that the inorganic nonmetallic material layer 030 at a position other than the positions where the first sub-partition structure 741 and the second sub-partition structure 742 are to be formed is etched. In a process of dry etching the inorganic nonmetallic material layer 030, a part of the organic material layer 180 that is not shielded by the mask will be etched to a certain thickness by an etching gas, so that the organic material layer with an original thickness is retained directly below the inorganic nonmetallic material layer retained after etching (i.e., the first sub-partition structure 741 and the second sub-partition structure 742), so that a side of the organic material layer 180 away from the base substrate 110 forms a projection portion directly below the first sub-partition structure 741 and the second sub-partition structure 742, and the projection portion is the third sub-partition structure 743. The example is not limited thereto and the first sub-partition structure 741 and the second sub-partition structure 742 may be formed using a wet etching process and then the third sub-partition structure 743 may be formed using a dry etching process; or, the first sub-partition structure 741, the second sub-partition structure 742, and the third sub-partition structure 743 described above are formed using a dry etching process first and then using a wet etching process.

For example, as shown in FIG. 22A and FIG. 22B, in a process of dry etching the inorganic nonmetallic material layer 030, the organic material layer 180 is etched with a thickness that may be 100 to 10,000 angstroms, and a thickness of the formed third sub-partition structure 743 may be 100 to 10,000 angstroms. For example, in a process of dry etching the inorganic nonmetallic material layer 030, the organic material layer 180 is etched with a thickness that may be 200 to 2000 angstroms, and a thickness of the formed third sub-partition structure 743 may be 200 to 2000 angstroms.

Figure 26:
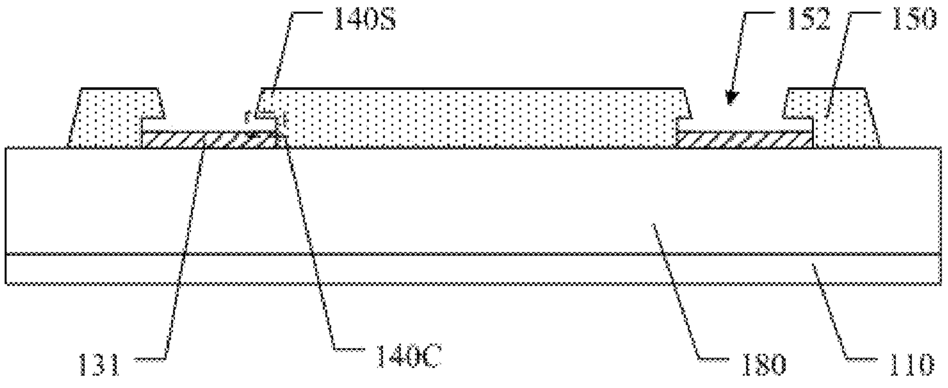
FIG. 26 is a schematic diagram of a structure of another display substrate according to an embodiment of the present disclosure.

At least one embodiment of the present disclosure also provides a display substrate. FIG. 26 is a schematic diagram of a structure of another display substrate according to an embodiment of the present disclosure. As shown in FIG. 26, a display substrate 100 includes a base substrate 110 and a plurality of sub-pixels (not shown); the plurality of sub-pixels are located on the base substrate 110, and a sub-pixel includes a light emitting element; the light emitting element includes a light emitting functional layer and a first electrode 131 and a second electrode (not shown) that are located on two sides of the light emitting functional layer, the first electrode 131 is located between the light emitting functional layer and the base substrate 110; the second electrode is at least partially located on a side of the light emitting functional layer away from the first electrode 131. Specific structures of the sub-pixels, the light emitting element, and the light emitting functional layer may be referred to FIG. 1 and FIG. 2, which will not be repeated in the present disclosure.

As shown in FIG. 26, the display substrate 100 further includes a pixel partition structure 140 which is located on the base substrate 110 and between adjacent sub-pixels; at least one of a plurality of sub-functional film layers in the light emitting functional layer is disconnected at a position where the pixel partition structure 140 is located. The display substrate 100 further includes a pixel definition layer 150; the pixel definition layer 150 is located on a side of the first electrode 131 away from the base substrate 110; the pixel definition layer 150 includes a plurality of pixel openings 152; the plurality of pixel openings 152 correspond in one-to-one correspondence with the plurality of sub-pixels 200 to define effective light emitting regions of the plurality of sub-pixels 200; a pixel opening 152 is configured to expose the first electrode 131 so that the first electrode 131 is in contact with the light emitting functional layer 120 which is subsequently formed.

As shown in FIG. 26, the pixel partition structure 140 includes a concave structure 140C and a shielding portion 140S, the concave structure 140C is located at an edge of the first electrode 131 and recessed into the pixel definition layer 150, and the shielding portion 140S is located on a side of the concave structure 140C away from the base substrate 110 and is a part of the pixel definition layer 150. That is, one part of a circumferential side wall of the pixel opening 152 close to the base substrate 110 is recessed into the pixel definition layer 150 to form the concave structure 140C, the concave structure 140C may expose an edge of a surface of the first electrode 131 away from the base substrate 110, and accordingly, the other part of the circumferential side wall of the pixel opening 152 protrudes into the pixel opening 152, and a protruding part forms the shielding portion 1405. Thereby, a conductive sub-layer of the light emitting functional layer is disconnected at a position where the shielding portion is located. Therefore, by disposing the above pixel partition structure between adjacent sub-pixels, in the display substrate, crosstalk between adjacent sub-pixels caused by a sub-functional layer with a relatively high conductivity in the light emitting functional layer may be avoided.

On the other hand, since crosstalk between adjacent sub-pixels in the display substrate may be avoided through the pixel partition structure, a pixel density may be improved in the display substrate while using a double-layer light emitting (Tandem EL) design. Therefore, the display substrate may have advantages of long life, low power consumption, high brightness, high resolution, and the like.

In some examples, as shown in FIG. 26, an orthographic projection of the concave structure 140C on the base substrate 110 is overlapped with an orthographic projection of the shielding portion 140S on the base substrate 110.

Figure 27:
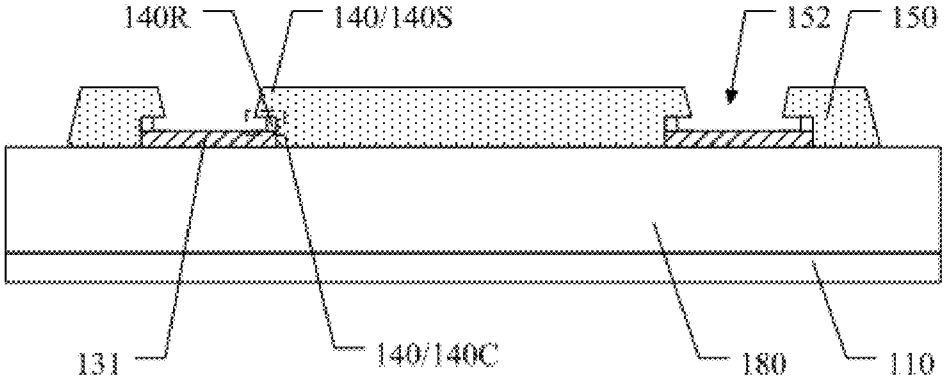
FIG. 27 is a schematic diagram of a structure of another display substrate according to an embodiment of the present disclosure.

FIG. 27 is a schematic diagram of a structure of another display substrate according to an embodiment of the present disclosure. As shown in FIG. 27, a residual structure 140R may be disposed within a concave structure 140C, and the residual structure 140R may be located at a position of the concave structure 140C close to the pixel definition layer 150 (i.e., at a position of the concave structure 140C away from a center of a pixel opening 152).

In some examples, as shown in FIG. 27, a material of the residual structure 140R includes a metal such as silver.

Figure 28:
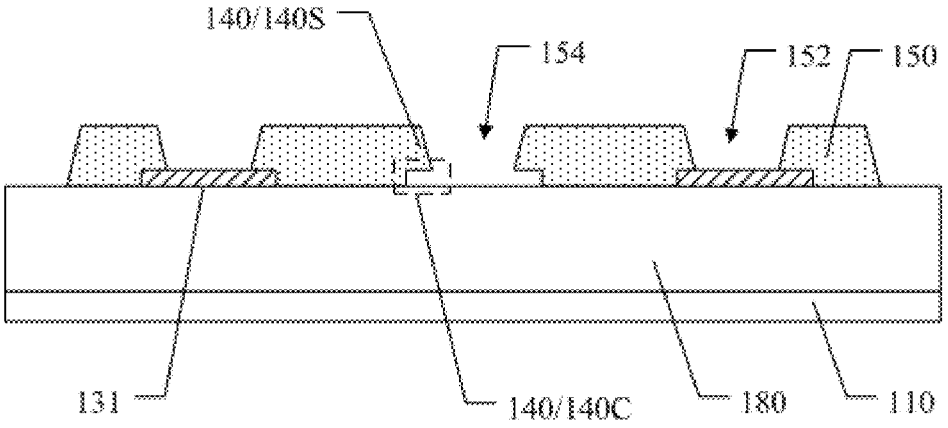
FIG. 28 is a schematic diagram of a structure of another display substrate according to an embodiment of the present disclosure.

An embodiment of the present disclosure also provides a display substrate. FIG. 28 is a schematic diagram of a structure of another display substrate according to an embodiment of the present disclosure. In the display substrate shown in FIG. 28, another pixel partition structure is provided. As shown in FIG. 28, the display substrate 100 further includes a pixel definition layer 150 on a base substrate 110; the pixel definition layer 150 is located on a side of a first electrode 131 away from the base substrate 110; the pixel definition layer 150 includes a plurality of pixel openings 152 and pixel spacing openings 154; the plurality of pixel openings 152 correspond in one-to-one correspondence with a plurality of sub-pixels 200 to define effective light emitting regions of the plurality of sub-pixels 200; a pixel opening 152 is configured to expose the first electrode 131 so that the first electrode 131 is in contact with a light emitting functional layer 120 which is subsequently formed. A pixel spacing opening 154 is located between adjacent first electrodes 131 and at least part of a partition structure 140 is located within the pixel spacing opening 154.

As shown in FIG. 28, a pixel partition structure 140 includes a concave structure 140C and a shielding portion 140S, and the concave structure 140C is located at an edge of the pixel spacing opening 154 and recessed into the pixel definition layer 150. For example, the concave structure 140C may be recessed into the pixel definition layer 150 along a direction parallel to the base substrate 110. The shielding portion 140S is located on a side of the concave structure 140C away from the base substrate 110 and is a part of the pixel definition layer 150. That is, one part of a circumferential side wall of the pixel spacing opening 154 close to the base substrate 110 is recessed into the pixel definition layer 150 to form the concave structure 140C, and accordingly, the other part of the circumferential side wall of the pixel spacing opening 154 protrudes into the pixel spacing opening 154, and the protruding part forms the shielding portion 140S. Thereby, a conductive sub-layer of the light emitting functional layer is disconnected at a position where the shielding portion is located. Therefore, by disposing the above pixel partition structure between adjacent sub-pixels, in the display substrate crosstalk between adjacent sub-pixels caused by a sub-functional layer with a relatively high conductivity in the light emitting functional layer may be avoided.

Figure 29:
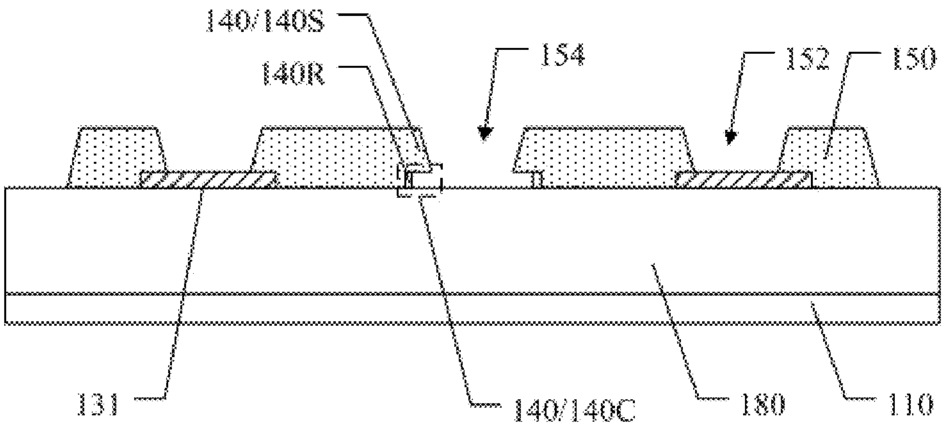
FIG. 29 is a schematic diagram of a structure of another display substrate according to an embodiment of the present disclosure.

FIG. 29 is a schematic diagram of a structure of another display substrate according to an embodiment of the present disclosure. As shown in FIG. 29, a residual structure 140R may be disposed within the concave structure 140C, and the residual structure 140R may be located at a position of the concave structure 140C close to a pixel definition layer 150 (i.e., at a position of the concave structure 140C away from a center of a pixel spacing opening 154).

In some examples, as shown in FIG. 29, a material of the residual structure 140R includes at least one of a metal, a metal oxide, an organic material; the above metal may be silver, the above metal oxide may be indium zinc oxide, and the above organic material may be an amino polymer.

In some examples, when a material of the residual structure 140R is an amino polymer, since a material of a planarization layer includes a material of a photoresist, a Polyimide (PI) resin, an acrylic resin, a silicon compound, or a polyacrylic resin, a solvent of the planarization layer is mainly composed of a non-fluorinated organic solvent. Although these photoresists may contain a small amount of fluorination, they are not basically soluble in fluorinated liquid or a perfluorinated solvent. Therefore, their orthogonal characteristics (a solution and a solvent do not react with each other) may be utilized to form the above-mentioned pixel partition structure using an etching process.

Figure 30A:
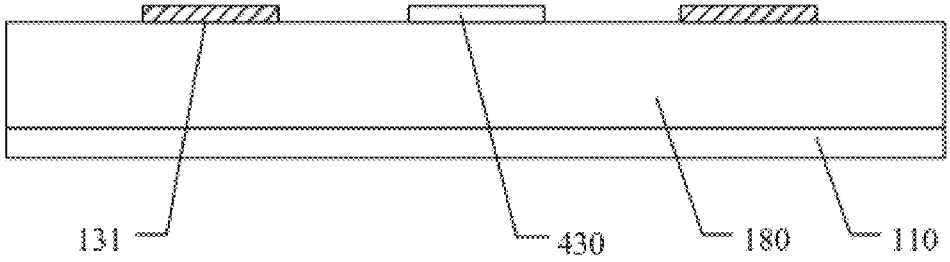
FIG. 30A to FIG. 30C are schematic diagrams of acts of another method for manufacturing a display substrate according to an embodiment of the present disclosure.
Figure 30B:
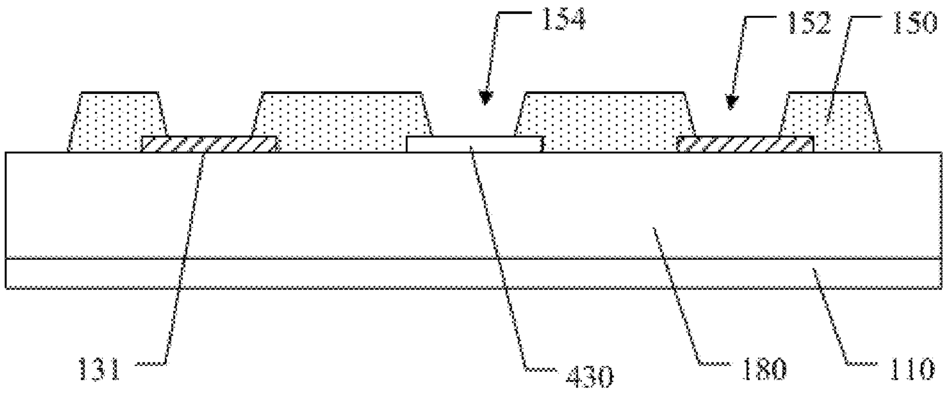
Figure 30C:
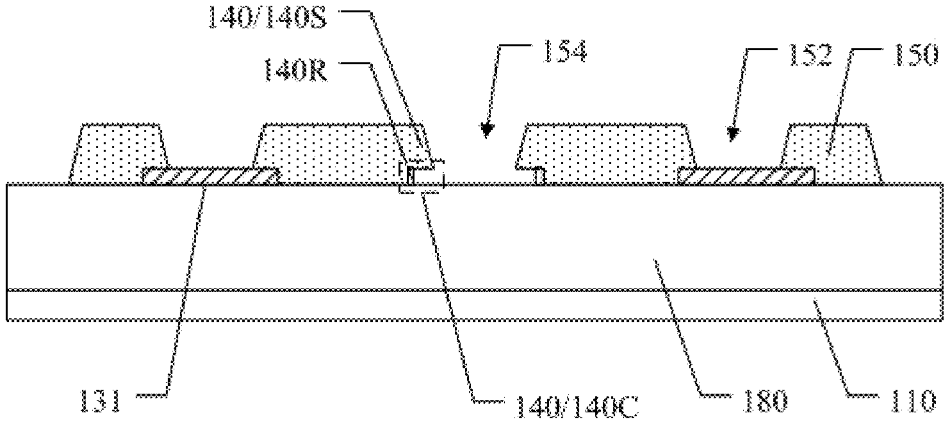

FIG. 30A to FIG. 30C are schematic diagrams of acts of another method for manufacturing a display substrate according to an embodiment of the present disclosure. The method for manufacturing the display substrate includes following acts.

As shown in FIG. 30A, a first electrode 131 and a sacrificial structure 430 are formed on a side of a planarization layer 180 away from a base substrate 110. The above residual structure may be a part of the sacrificial structure.

As shown in FIG. 30B, a pixel definition layer 150 is formed on a side of the first electrode 131 and the sacrificial structure 430 away from the base substrate 110. The pixel definition layer 150 includes a plurality of pixel openings 152 and pixel spacing openings 154; the plurality of pixel openings 152 are disposed in one-to-one correspondence with a plurality of first electrodes 131; a pixel opening 152 is configured to expose a first electrode 131 so that the first electrode 131 is in contact with a light emitting functional layer 120 which is subsequently formed. A pixel spacing opening 154 is located between adjacent first electrodes 131 and the sacrificial structure 430 is partially exposed by the pixel spacing opening 154.

As shown in FIG. 30C, the sacrificial structure 430 is etched with the pixel definition layer 150 as a mask to partially or completely remove the sacrificial structure 430 to form the pixel partition structure 140 described above. When the sacrificial structure 430 is completely removed, the pixel partition structure 140 of FIG. 28 is formed; when the sacrificial structure 430 is partially removed, a remaining part of the sacrificial structure 430 forms the residual structure 140R of FIG. 29, thereby forming the pixel partition structure 140 of FIG. 29.

Figure 31A:
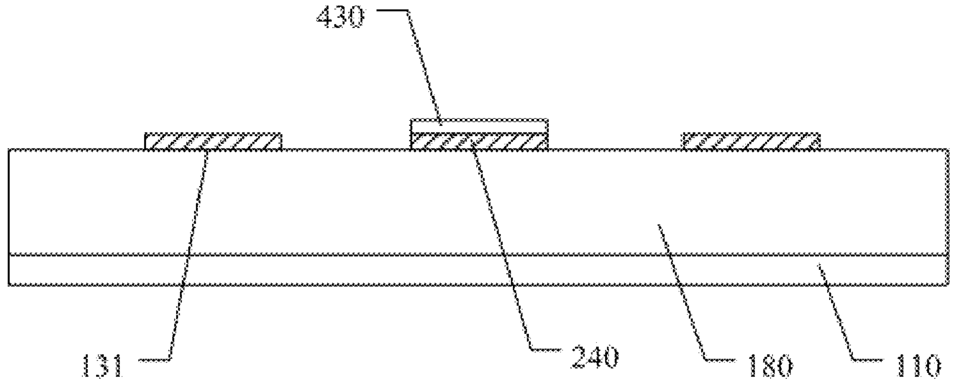
FIG. 31A to FIG. 31C are schematic diagrams of acts of another method for manufacturing a display substrate according to an embodiment of the present disclosure.
Figure 31B:
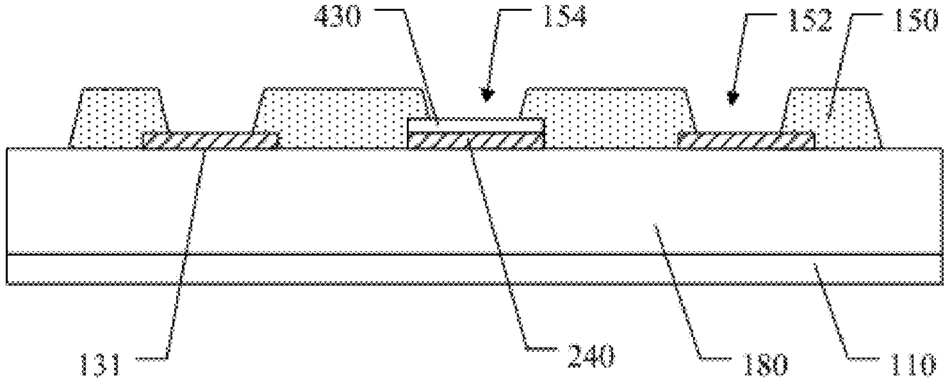
Figure 31C:
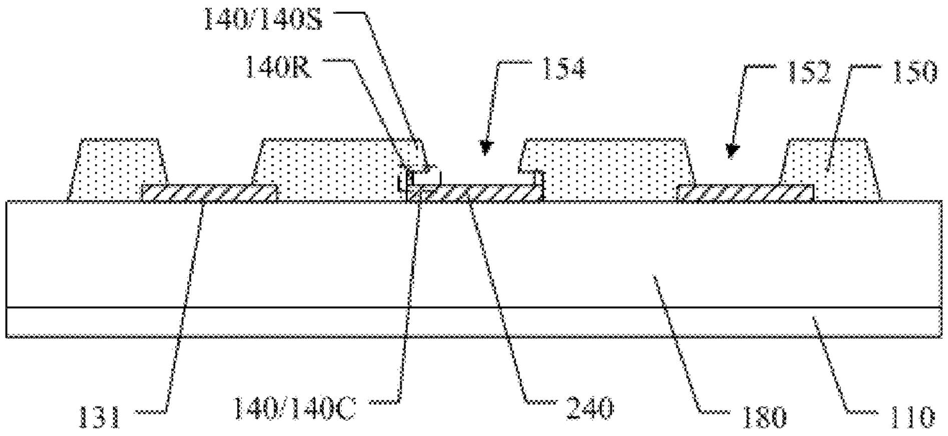

FIG. 31A to FIG. 31C are schematic diagrams of acts of another method for manufacturing a display substrate according to an embodiment of the present disclosure. The method for manufacturing the display substrate includes following acts.

As shown in FIG. 31A, a first electrode 131, a protective structure 240, and a sacrificial structure 430 are formed on a side of a planarization layer 180 away from a base substrate 110, the protective structure 240 is disposed in a same layer as the first electrode 131. A material of the protective structure 240 is the same as that of the first electrode 131, and the sacrificial structure 430 is located on a side of the protective structure 240 away from the base substrate 110, and the material of the protective structure 240 is different from that of the sacrificial structure 430.

As shown in FIG. 31B, a pixel definition layer 150 is formed on a side of the first electrode 131 and the sacrificial structure 430 away from the base substrate 110. The pixel definition layer 150 includes a plurality of pixel openings 152 and pixel spacing openings 154; the plurality of pixel openings 152 are disposed in one-to-one correspondence with a plurality of first electrodes 131; a pixel opening 152 is configured to expose a first electrode 131 so that the first electrode 131 is in contact with a light emitting functional layer 120 which is subsequently formed. A pixel spacing opening 154 is located between adjacent first electrodes 131 and the sacrificial structure 430 is partially exposed by the pixel spacing opening 154.

As shown in FIG. 31C, the sacrificial structure 430 is etched with the pixel definition layer 150 as a mask to partially or completely remove the sacrificial structure 430 to form the pixel partition structure 140 described above.

Figure 32:
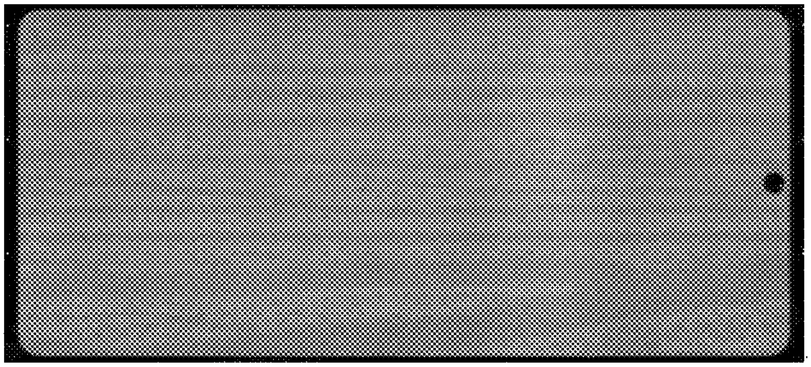
FIG. 32 is an electron microscope view of a display substrate generating a ripple Mura phenomenon according to some embodiments.
Figure 33:
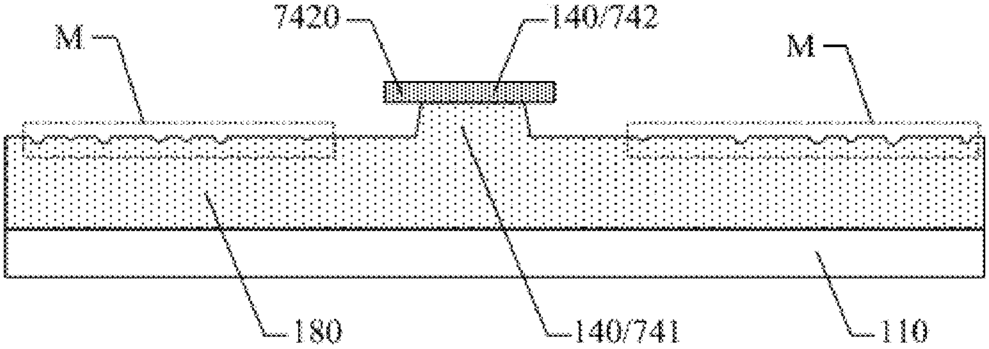
FIG. 33 is a schematic diagram of a partial sectional structure of a display substrate after a partition structure is formed according to some embodiments.
Figure 34:
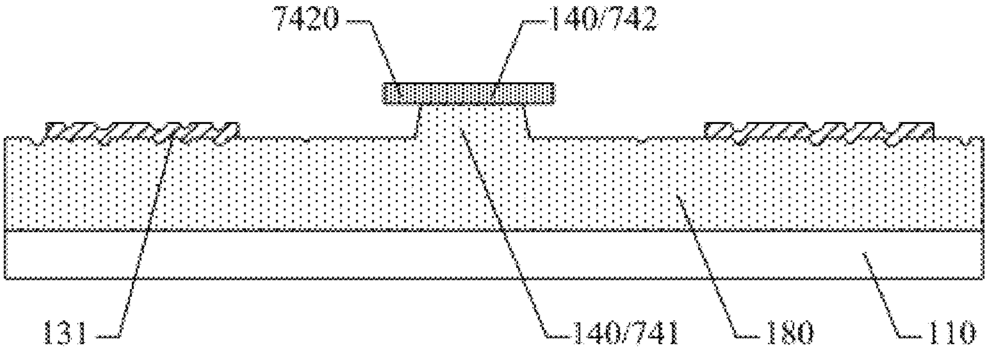
FIG. 34 is a schematic diagram of a partial sectional structure of a display substrate after a first electrode is formed according to some embodiments.
Figure 35A:
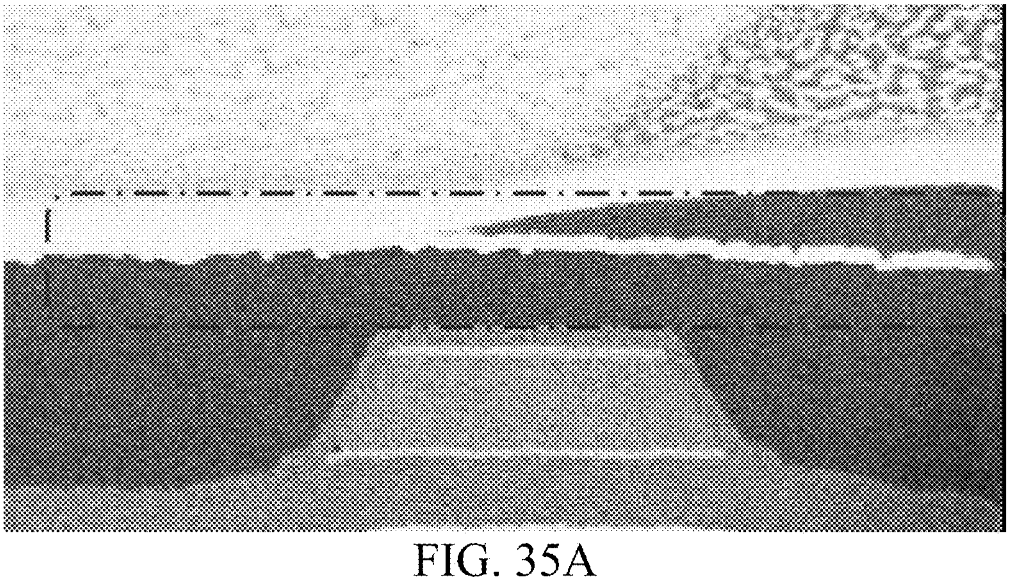
FIG. 35A is a sectional electron microscope view of a display substrate generating a ripple Mura phenomenon.
Figure 35B:
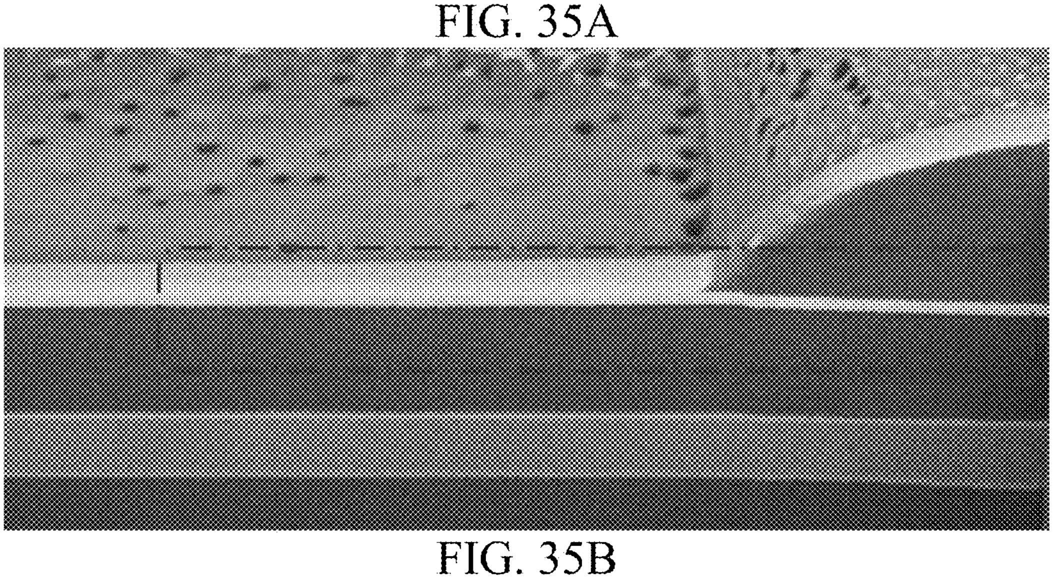
FIG. 35B is a sectional electron microscope view of a display substrate without a ripple Mura phenomenon.

In actual production, it is found that the display substrate of the example of FIG. 19 previously prepared using the method of FIG. 22A to FIG. 22D produces a ripple Mura phenomenon (i.e., a brightness non-uniformity phenomenon in which light and dark stripes are ripple-shaped), as shown in FIG. 32, which is an electron microscope view of the display substrate generating a ripple Mura phenomenon according to some embodiments. Inventors of the present application have found through research that a reason why the above-mentioned ripple Mura phenomenon occurs on the display substrate is that after dry etching the inorganic nonmetallic material layer 030 and the organic material layer 180 to form the partition structure 140, a surface of the formed planarization layer 180 has many pits, resulting in the surface of the planarization layer 180 having a uneven topography (sawtooth topography), as shown in FIG. 33, there are many pits on the surface of the planarization layer 180 illustrated within two dashed line boxes M in FIG. 33, so that a surface of a first electrode 131 that is subsequently formed directly on the surface of the planarization layer 180 also has a uneven topography, as shown in FIG. 34. A difference in surface roughness of first electrodes 131 in different regions is finally manifested as a difference in brightness, which causes uneven display, and thus ultimately leads to the ripple Mura phenomenon on the display substrate. As shown in FIG. 35A and FIG. 35B, FIG. 35A is a sectional electron microscope view of a display substrate generating a ripple Mura phenomenon, and it may be seen from FIG. 35A that the surface of the first electrode has a serrated uneven topography (at a position shown by a dashed line box); FIG. 35B is a sectional electron microscope view of a display substrate without a ripple Mura phenomenon, it may be seen from FIG. 35B that the surface of the first electrode has no serrated uneven topography (at a position shown by a dashed line box); it may be seen from this that a reason for the ripple Mura phenomenon on the display substrate is that the surface of the first electrode has an uneven topography. In addition, surface roughness of a first electrode in a display substrate sample with a ripple Mura phenomenon is relatively large, and Ra is about 10 (9.8 to 10.8); surface roughness of a first electrode in a display substrate sample without a ripple Mura phenomenon is relatively small, and Ra is about 1 (0.917 to 1.16).

Figure 36A:
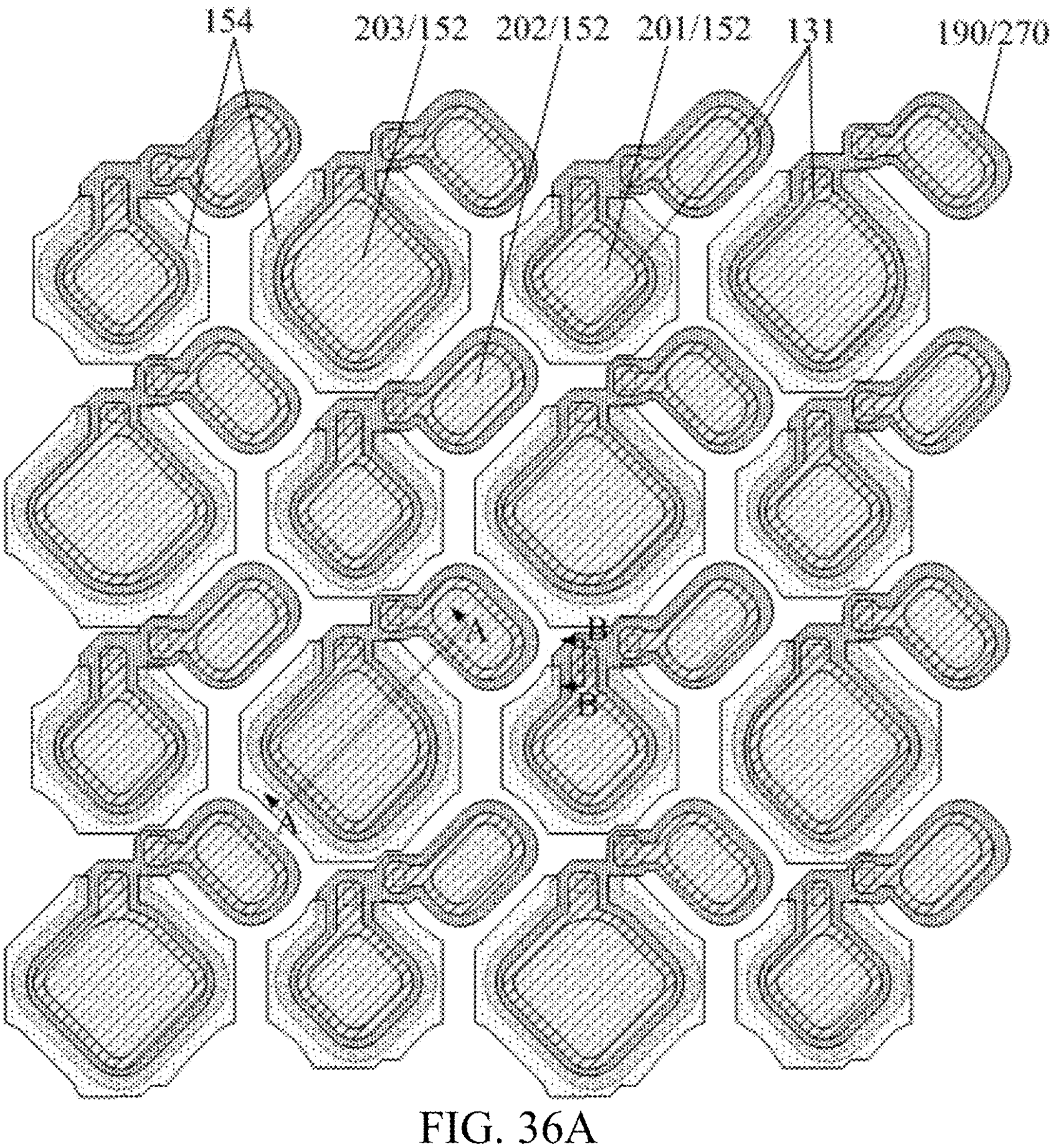
FIG. 36A is a schematic diagram of a planar structure of another display substrate according to an embodiment of the present disclosure.
Figure 36B:
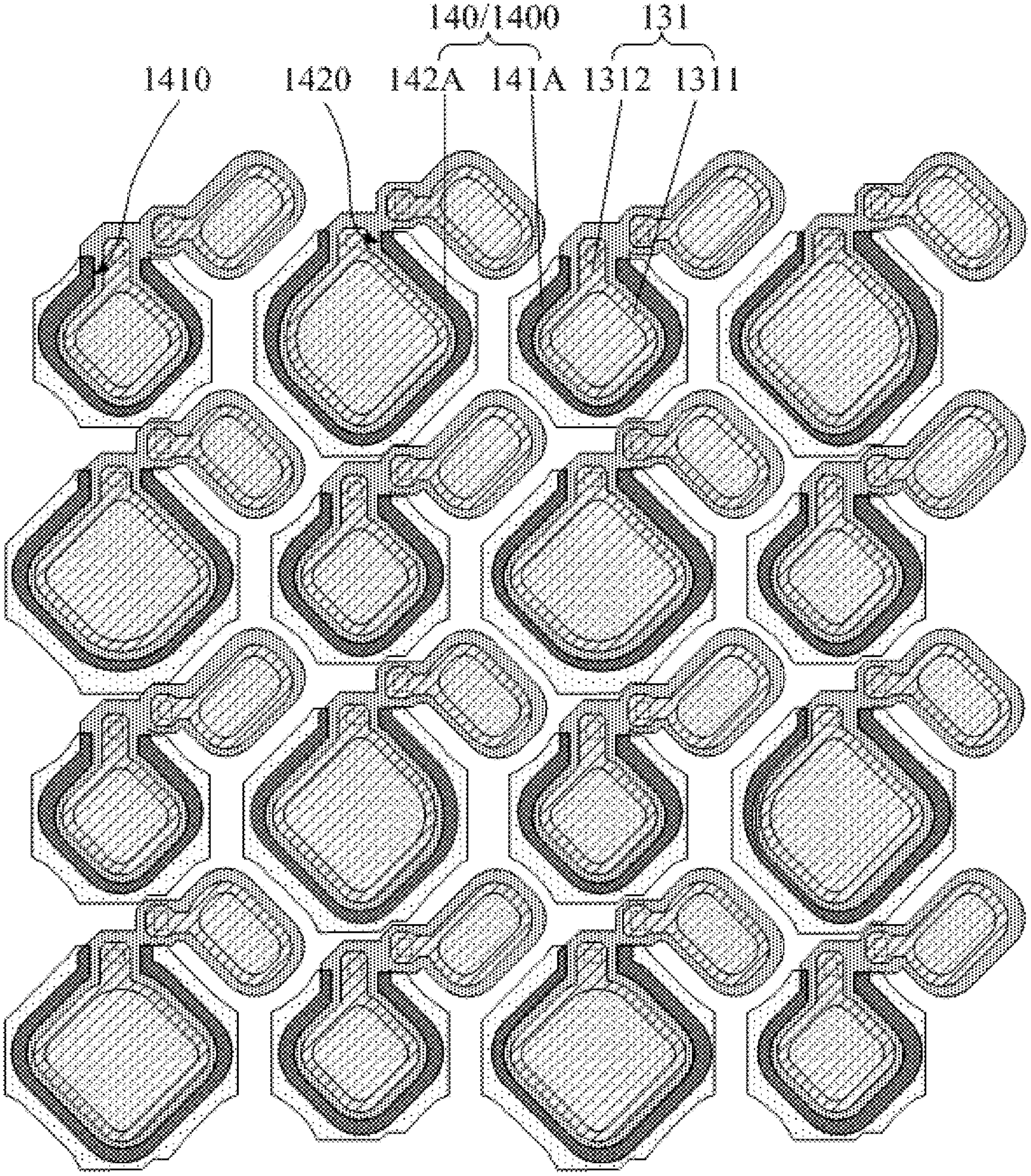
FIG. 36B is a schematic diagram of a planar structure in which a partition structure is highlighted in the display substrate of FIG. 36A.
Figure 37A:
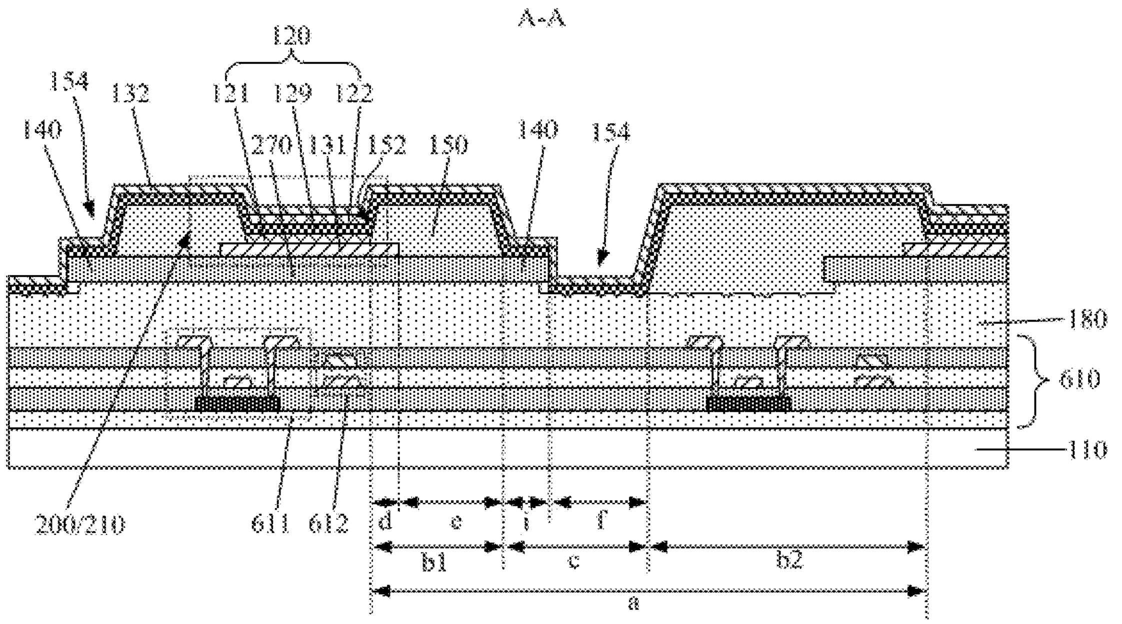
FIG. 37A is a schematic diagram of a sectional structure of A-A in FIG. 36A.

An embodiment of the present disclosure provides another display substrate, as shown in FIG. 36A, FIG. 36B, and FIG. 37A, wherein FIG. 36A is a schematic diagram of a planar structure of another display substrate according to an embodiment of the present disclosure, FIG. 36B is a schematic diagram of a planar structure in which a partition structure is highlighted in the display substrate of FIG. 36A, and FIG. 37A is a schematic diagram of a sectional structure of A-A in FIG. 36A, wherein the display substrate includes a base substrate 110, a plurality of sub-pixels 200 disposed on the base substrate 110 and a partition structure 140; a sub-pixel 200 includes a light emitting element 210; the light emitting element 210 includes a light emitting functional layer 120 and a first electrode 131 and a second electrode 132 that are located on two sides of the light emitting functional layer 120, the first electrode 131 is located between the light emitting functional layer 120 and the base substrate 110; the light emitting functional layer 120 includes a plurality of sub-functional layers including a conductive sub-layer 129 with a relatively high conductivity, a first emitting layer 121 located on a side of the conductive sub-layer 129 close to the base substrate 110, and a second emitting layer 122 located on a side of the conductive sub-layer 129 away from the base substrate 110; the partition structure 140 is located between adjacent sub-pixels 200 and the conductive sub-layer 129 is disconnected at a position where the partition structure 140 is located.

Exemplarily, the conductive sub-layer 129 may be a charge generation layer. The light emitting functional layer 120 may further include a functional film layer for assisting light emission, such as a hole injection layer, a hole transport layer, an electron transport layer, an electron injection layer and the like. For example, the first electrode 131 may be an anode and the second electrode 132 may be a cathode.

Exemplarily, as shown in FIG. 36A, the plurality of sub-pixels include a plurality of first-color sub-pixels 201, a plurality of second-color sub-pixels 202, and a plurality of third-color sub-pixels 203; a quantity of second-color sub-pixels 202 is approximately twice a quantity of first-color sub-pixels 201, and the quantity of first-color sub-pixels 201 is the same as a quantity of third-color sub-pixels 203. In this example, an arrangement of the plurality of sub-pixels is the same as an arrangement of the plurality of sub-pixels in previous examples of FIG. 1 and FIG. 15.

Exemplarily, as shown in FIG. 36B, the partition structure 140 includes a plurality of annular partition portions 1400 that may include a plurality of first annular pixel partition portions 141A and a plurality of second annular pixel partition portions 142A, a first annular pixel partition portion 141A surrounds one of the first-color sub-pixels 201, and a second annular pixel partition portion 142A surrounds one of the third-color sub-pixels 203; the first annular pixel partition portion 141A may be in a closed ring shape or provided with at least one first notch (one first notch is disposed in this example) 1410, and the second annular pixel partition portion 142A may be in a closed ring shape or provided with at least one second notch (one second notch is disposed in this example) 1420. In this example, a planar structure of the partition structure 140 may be the same as that of the example of FIG. 15.

Exemplarily, as shown in FIG. 36A, FIG. 36B, and FIG. 37A, the display substrate includes a drive structure layer 610 and a planarization layer 180 that are sequentially stacked on the base substrate 110; the drive structure layer 610 includes a plurality of pixel drive circuits (including a plurality of thin film transistors 611 and a storage capacitor 612), a pixel drive circuit is connected with the first electrode 131 and configured to drive the light emitting element 210 to emit light; the display substrate further includes a protective layer 190 disposed on a side of the planarization layer 180 away from the base substrate 110, the protective layer 190 includes a protective structure 270 and the partition structure 140, and the first electrode 131 is disposed on a side of the protective structure 270 away from the base substrate 110.

The display substrate further includes a pixel definition layer 150 disposed on a side of a plurality of first electrodes 131 away from the base substrate 110. The pixel definition layer 150 is provided with a plurality of pixel openings 152 and pixel spacing openings 154, a pixel opening 15 exposes the first electrode 131 and a pixel spacing opening 154 is located between two adjacent first electrodes 131 and partially exposes an edge of the partition structure 140 (the edge of the partition structure 140 is an effective partition position).

In this embodiment, as shown in FIG. 36A and FIG. 37A, a protective layer 190 is disposed on a side of the planarization layer 180 away from the base substrate 110, the protective layer 190 includes a protective structure 270 and the partition structure 140, and the first electrode 131 is disposed on a side of the protective structure 270 away from the base substrate 110. Thus, in a process of forming the partition structure 140 and the protective structure 270 using an etching process, a film layer forming the planarization layer 180 will not be etched at a position corresponding to the partition structure 140 and the protective structure 270 and may retain an original thickness and an original flat and smooth topography, while remaining positions will be etched to a certain thickness without protection of the partition structure 140 and the protective structure 270 (in order to ensure that the protective layer 190 formed after etching has no etching residue, there is often a certain degree of over-etching, so the film layer forming the planarization layer 180 will also be etched in a process of etching to form the protective layer 190), and surfaces of these remaining positions will form an uneven topography due to etching; and since subsequently the first electrode 131 is formed on a side of the protective structure 270 away from the base substrate 110, rather than directly formed on an etched surface of the planarization layer 180, a surface of the first electrode 131 may achieve a flat and smooth topography, avoiding a problem of the uneven surface of the first electrode 131 caused by the first electrode 131 being directly formed on the etched uneven surface of the planarization layer 180 in a previous example of FIG. 19, thereby improving the ripple Mura phenomenon caused by the uneven surface of the first electrode 131 in the display substrate of the example of FIG. 19, and improving display uniformity of the display substrate.

Exemplarily, as shown in FIG. 36A, FIG. 36B, and FIG. 37A, the protective structure 270 and the partition structure 140 are connected into an integral structure. That is, a part of the protective structure 270, exposed by a pixel spacing opening 154, close to an edge forms the partition structure 140. In this example, since the protective structure 270 is disposed between the first electrode 131 and the planarization layer 180, and the protective layer 190 and the first electrode 131 are stacked and there is an overlapping region, therefore, compared with the display substrate of a previous example of FIG. 16, on one hand, the ripple Mura phenomenon of the display substrate may be improved and on the other hand, a coverage area of the protective layer 190 and the first electrode 131 on the planarization layer 180 in this example, is smaller than a coverage area of the partition structure 140 and the first electrode 131 on the planarization layer 180 in the example of FIG. 16, thus facilitating release of water and oxygen absorbed in the planarization layer 180 in a preparation process of the display substrate, reducing a damage of water and oxygen to a material of an emitting layer of a light emitting element, and prolonging life of a panel.

Figure 37B:
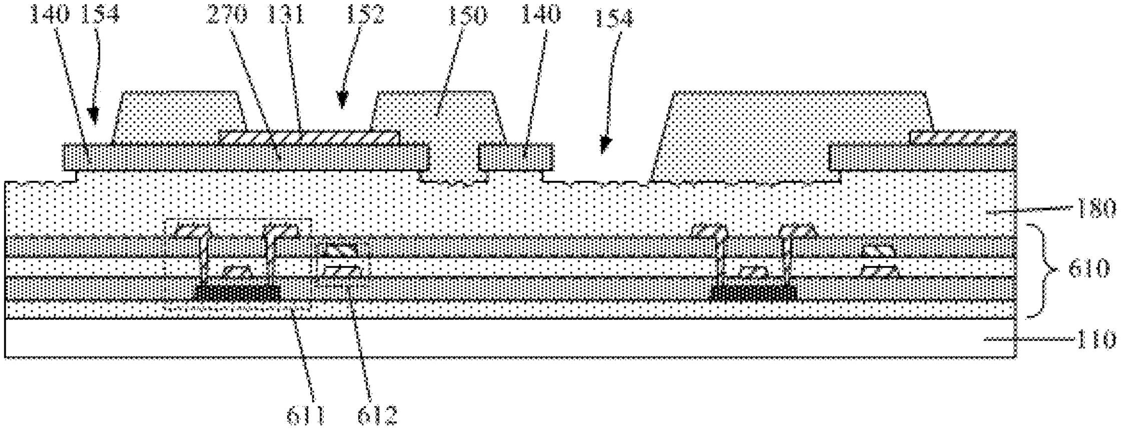
FIG. 37B is a schematic diagram of a sectional structure of another display substrate according to an embodiment of the present disclosure.

In another implementation mode, as shown in FIG. 37B, FIG. 37 B is a schematic diagram of a sectional structure of another display substrate according to an embodiment of the present disclosure, the protective structure 270 and the partition structure 140 may not be connected, the protective structure 270 and the partition structure 140 may be formed through a same patterning process, and materials of the protective structure 270 and the partition structure 140 are the same; or, the partition structure 140 may include a plurality of unconnected parts, one part of the partition structure 140 and the protective structure 270 are connected into an integral structure, and the other part of the partition structure 140 and the protective structure 270 are not connected.

Exemplarily, as shown in FIG. 36A and FIG. 36B, a part of the partition structure 140 exposed by the pixel spacing opening 154 forms the annular partition portion 1400. In this example, the pixel spacing opening 154 is in a shape of a ring with a notch, and is disposed around the first electrode 131, and an edge of the part of the partition structure 140 exposed by the pixel spacing opening 154 is continuous within the pixel spacing opening 154, so that the formed annular partition portion 1400 is in a shape of a ring with a notch (the notch of the annular partition portion 1400 is formed at the notch of the pixel spacing opening 154). In another implementation mode, the pixel spacing opening 154 may be in a shape of a ring with two or more notches disposed around a first electrode 131, and the edge of the part of the partition structure 140 exposed by the pixel spacing opening 154 may be discontinuous within the pixel spacing opening 154 (notches of the annular partition portion 1400 are formed at discontinuous places), then the formed annular partition portion 1400 is in a shape of a ring with a plurality of notches.

Exemplarily, as shown in FIG. 36A, the protective layer 190 may include a plurality of protective structures 270, each of the first electrodes 131 is disposed on a side of a corresponding one of the protective structures 270 away from the base substrate 110. Among the plurality of protective structures 270, at least two of the protective structures 270 are connected into an integral structure, and at least two of the protective structures 270 are not connected. Exemplarily, as shown in FIG. 36A and FIG. 36B, each first-color sub-pixel 201 and two protective structures 270 corresponding to two first electrodes 131 of a second-color sub-pixel 202 adjacent thereto are connected into an integral structure, each third-color sub-pixel 203 and two protective structures 270 corresponding to two first electrodes 131 of a second-color sub-pixel 202 adjacent thereto are connected into an integral structure, and two protective structures 270 corresponding to two first electrodes 131 of the first-color sub-pixel 201 and the third-color sub-pixel 203 are not connected. In another implementation mode, any two of the protective structures may not be connected; or, all of the protective structures may be connected into an integral structure.

Exemplarily, as shown in FIG. 37A, in a plane parallel to the base substrate, along an arrangement direction of a third-color sub-pixel and a second-color sub-pixel which are adjacent, a distance between pixel openings of the third-color sub-pixel and the second-color sub-pixel is a, a distance between a pixel opening of the third-color sub-pixel and a pixel spacing opening is b1, a distance between a pixel opening of the second-color sub-pixel and a pixel spacing opening is b2, a width of a pixel spacing opening between the third-color sub-pixel and the second-color sub-pixel is c, a width of a part of a first electrode covered by a pixel definition layer is d, a distance between an edge of the first electrode and a pixel spacing opening is e, a width of a part of a protective structure exposed by a pixel spacing opening (i.e., a partition structure) is i, and a gap between an edge of the partition structure and a circumferential side wall of the pixel spacing opening is f; it may be set as follows: a=15 microns to 25 microns, such as a=20 microns, b1=3.5 microns to 5.5 microns, such as b1=4.5 microns, b2=8 microns to 10 microns, such as b2=9 microns, c=5.05 microns to 6.5 microns, d=1.5 microns to 2.5 microns, e=1.5 microns to 2.0 microns, i=1.9 microns to 2.5 microns, and f=1.8 microns to 4 microns.

Figure 36C:
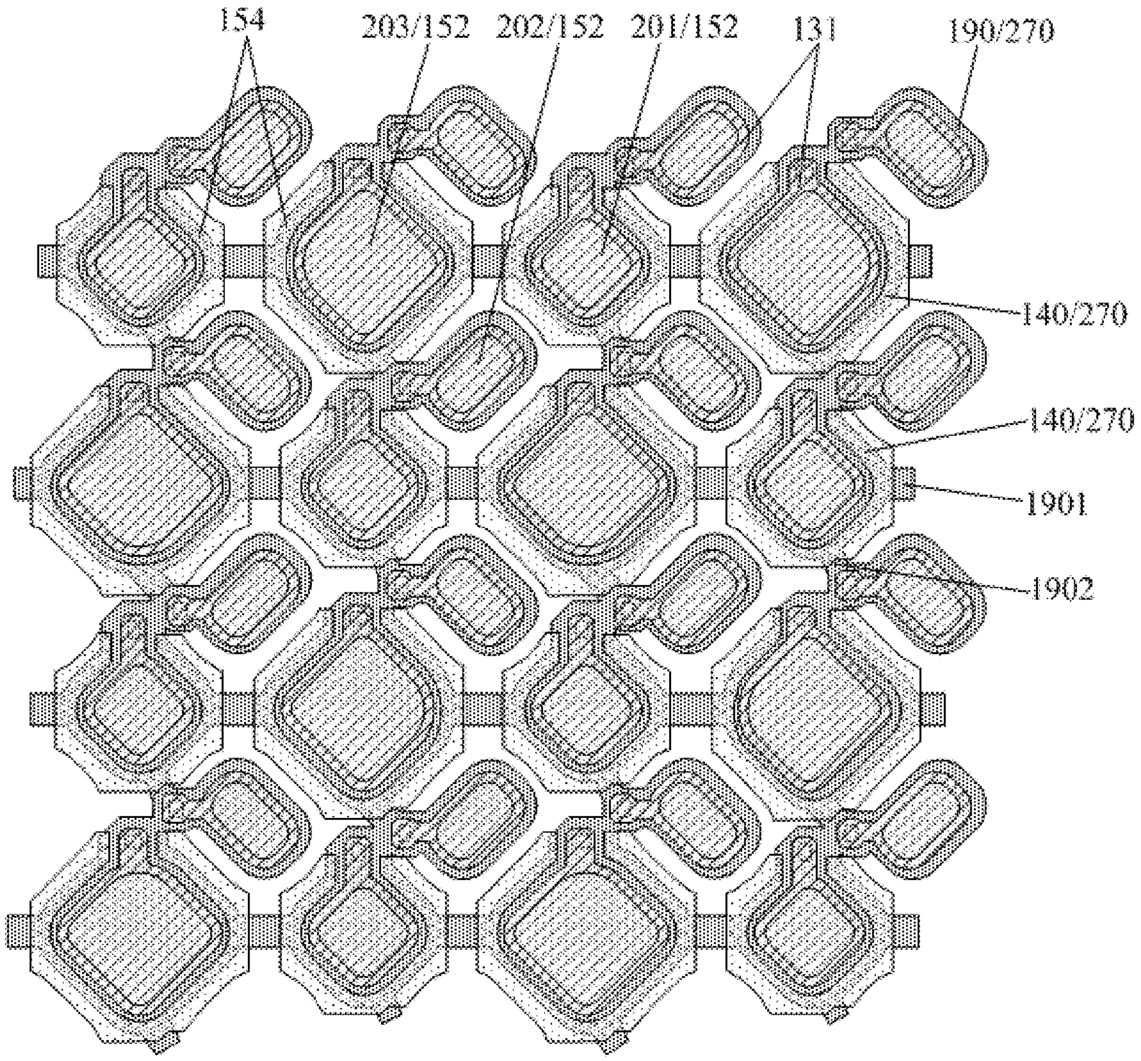
FIG. 36C is a schematic diagram of a planar structure of another display substrate according to an embodiment of the present disclosure.
Figure 36D:
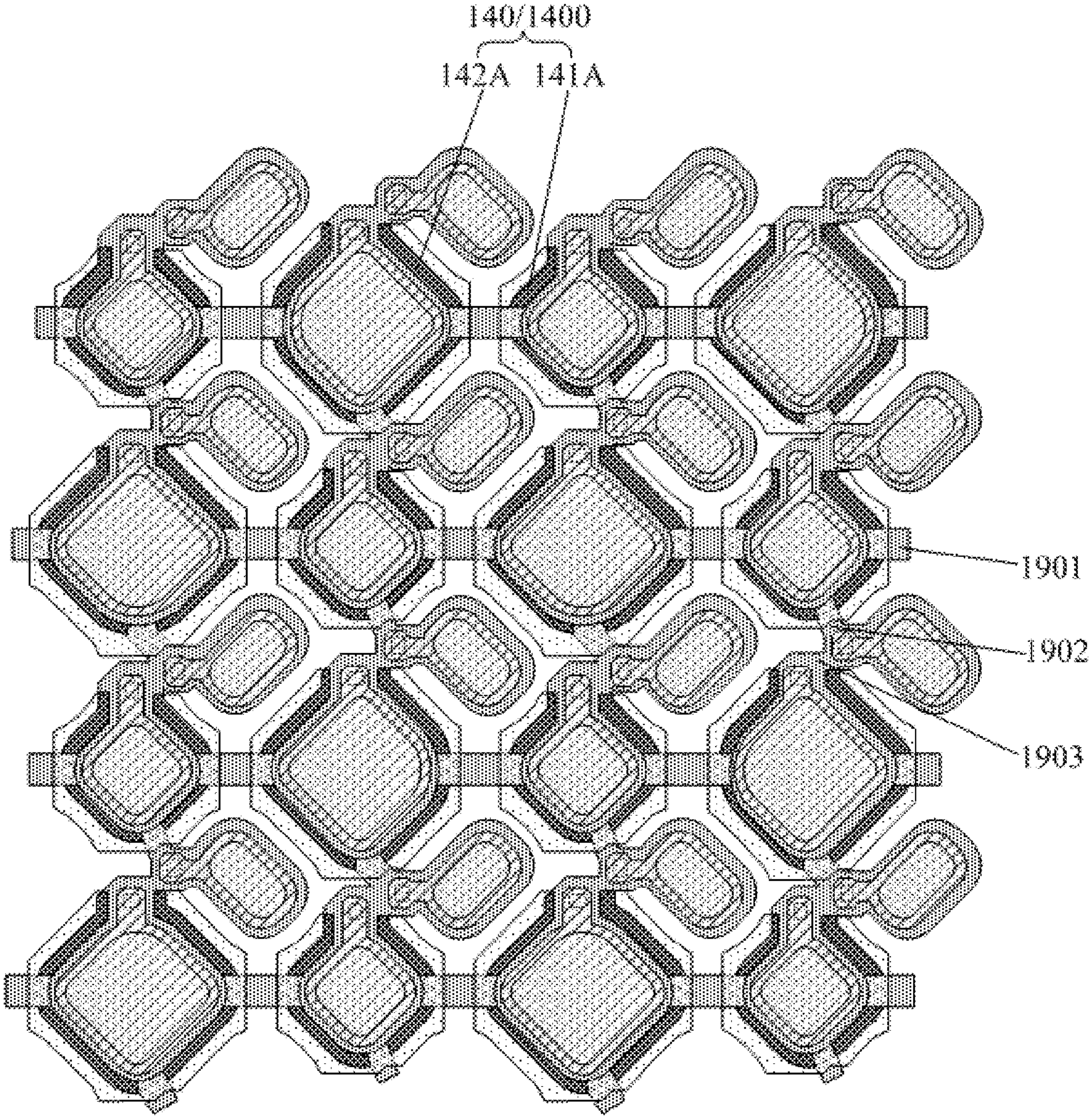
FIG. 36D is a schematic diagram of a planar structure in which a partition structure is highlighted in the display substrate of FIG. 36C.

Exemplarily, as shown in FIG. 36C and FIG. 36D, FIG. 36C is a schematic diagram of a planar structure of another display substrate according to an embodiment of the present disclosure, FIG. 36D is a schematic diagram of a planar structure in which a partition structure is highlighted in the display substrate of FIG. 36C, the protective layer 190 includes a protective structure 270 and the partition structure 140, and the first electrode 131 is disposed on a side of the protective structure 270 away from the base substrate 110. The protective layer 190 is of an integral structure, that is, the protective structure 270 and the partition structure 140 are connected into an integral structure, so that a part of the protective structure 270, exposed by the pixel spacing opening 154, close to an edge forms the partition structure 140. In this example, the protective layer 190 is of an integral structure, which may reduce a peeling risk of the protective layer 190.

Exemplarily, as shown in FIG. 36C and FIG. 36D, the protective layer 190 may include a plurality of protective structures 270, a plurality of first connection portions 1901, a plurality of second connection portions 1902, and a plurality of third connection portions 1903; each of the first electrodes 131 is disposed on a side of a corresponding one of the protective structures 270 away from the base substrate 110, and a part of the protective structure 270, exposed by the pixel spacing opening 154, close to the edge forms the partition structure 140. Two protective structures 270 corresponding to two first electrodes 131 of a first-color sub-pixel 201 and a third-color sub-pixel 203 adjacent in the first direction are connected through a first connection portion 1901; in the two protective structures 270 corresponding to two first electrodes 131 of the first-color sub-pixel 201 and the third-color sub-pixel 203 adjacent in the second direction, one of the protective structures 270 is connected with a protective structure 270 corresponding to a first electrode 131 of one second-color sub-pixel 202 through a second connection portion 1902, and the protective structure 270 corresponding to the first electrode 131 of the second-color sub-pixel 202 is connected with the other protective structure 270 through a third connection portion 1903.

Exemplarily, as shown in FIG. 36C and FIG. 36D, the part of the partition structure 140, exposed by the pixel spacing opening 154, close to the edge form the annular partition portion 1400. A plurality of annular partition portions 1400 may include a plurality of first annular pixel partition portions 141A and a plurality of second annular pixel partition portions 142A, a first annular pixel partition portion 141A surrounds one of the first-color sub-pixels 201, and a second annular pixel partition portion 142A surrounds one of the third-color sub-pixels 203. The pixel spacing opening 154 is in a ring shape with a notch, which is disposed around a first electrode 131; an edge of the part of the partition structure 140 exposed by the pixel spacing opening 154 is discontinuous within the pixel spacing opening 154 (disconnected at two first connection portions 1901, and at a second connection portion 1902 or a third connection portion 1903), therefore, the first annular pixel partition portion 141A has four notches, respectively at the notch of the pixel spacing opening 154, at the two first connection portions 1901 and at the second connection portion 1902; the second annular pixel partition portion 142A has four notches, at the notch of the pixel spacing opening 154, at the two first connection portions 1901, and at the third connection portion 1903, respectively. In this example, the first annular pixel partition portion 141A and the second annular pixel partition portion 142A each have a plurality of notches, in this way, continuity of a second electrode may be improved, a resistance and voltage drop of the second electrode may be reduced, and thus power consumption of a panel may be reduced.

Exemplarily, as shown in FIG. 36A, a circumferential edge of the protective structure 270 may protrude from a circumferential edge of the first electrode 131 in a direction parallel to the base substrate.

Figure 38:
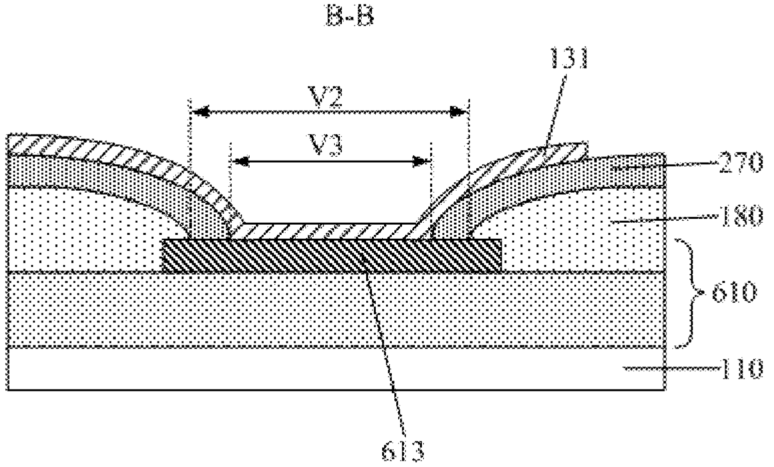
FIG. 38 is a schematic diagram of a sectional structure of B-B in FIG. 36A.

Exemplarily, as shown in FIG. 38, FIG. 38 is a schematic diagram of a sectional structure of B-B in FIG. 36A, the pixel drive circuit may include a connection electrode 613 connected with the first electrode 131. The planarization layer 180 is provided with a second via V2 which exposes the connection electrode 613; the protective structure 270 is provided with a third via V3, and an orthographic projection of the third via V3 on the base substrate 110 falls within an orthographic projection of the second via V2 on the base substrate 110; the first electrode 131 is connected with the connection electrode 613 through the second via V2 and the third via V3, that is, the first electrode 131 is connected with the pixel drive circuit through the second via V2 and the third via V3. Exemplarily, a part of the protective structure 270 is disposed on a hole wall of the second via V2 and may lap with the connection electrode 613. In this example, the third via V3 of the protective structure 270 is located within the second via V2 of the planarization layer 180, that is, a part of the protective structure 270 extends into the second via V2 of the planarization layer 180, in this way, when the first electrode 131 is deposited, the first electrode 131 may be prevented from being partitioned at a circumferential edge of the third via V3 of the protective structure 270, and an effective connection between the first electrode 131 and the connection electrode 613 may be ensured.

Figure 39:
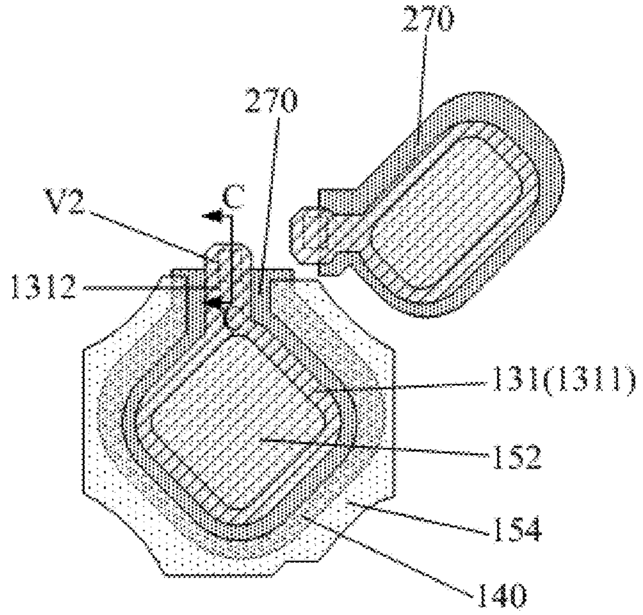
FIG. 39 is a schematic diagram of a partial structure of another display substrate according to an embodiment of the present disclosure.
Figure 40:
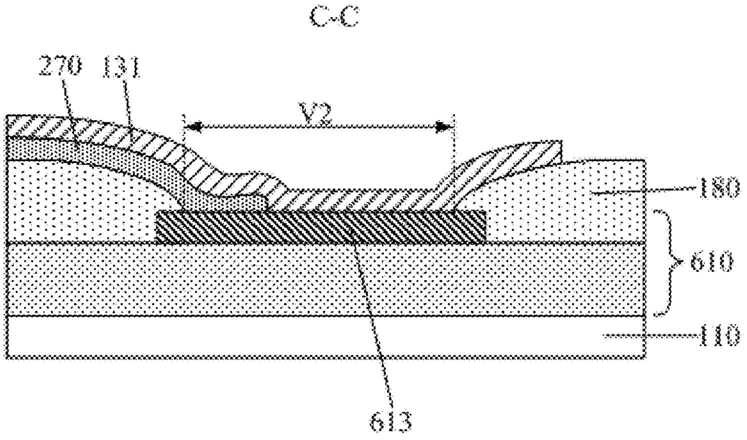
FIG. 40 is a schematic diagram of a sectional structure of C-C in FIG. 39.

Exemplarily, as shown in FIG. 39 and FIG. 40, FIG. 39 is a schematic diagram of a partial structure of another display substrate according to an embodiment of the present disclosure, and FIG. 40 is a schematic diagram of a sectional structure of C-C in FIG. 39. The protective layer 190 includes a plurality of protective structures 270, and each of the first electrodes 131 is disposed on a side of a corresponding one of the protective structures 270 away from the base substrate 110; any two of the protective structures 270 are not connected. A part of the protective structure 270, exposed by the pixel spacing opening 154, close to an edge forms the partition structure 140.

Exemplarily, as shown in FIG. 39 and FIG. 40, the pixel drive circuit includes a connection electrode 613 connected with the first electrode 131, the planarization layer 180 is provided with a second via V2 exposing the connection electrode 613, a part of the protective structure 270 is located within the second via V2 and covers a part of the connection electrode 613; the first electrode 131 includes a main body portion 1311 and a connection portion 1312 connected with the main body portion 1311, the main body portion 1311 is disposed on a surface of the protective structure 270 away from the base substrate 110, a part of the connection portion 1312 is disposed on a surface of the planarization layer 180 away from the base substrate 110, and the connection portion 1312 is connected with a part of the connection electrode 613 that is not covered by the protection structure 270 through the second via v2. Exemplarily, as shown in FIG. 39, an edge of the protective structure 270 partially extends into the second via V2. In this example, a part of the protective structure 270 is located within the second via V2 and covers a part of the connection electrode 613, in this way, when the first electrode 131 is deposited, the first electrode 131 may be prevented from being partitioned at an edge of the protective structure 270, and an effective connection between the first electrode 131 and the connection electrode 613 may be ensured.

Figure 41:
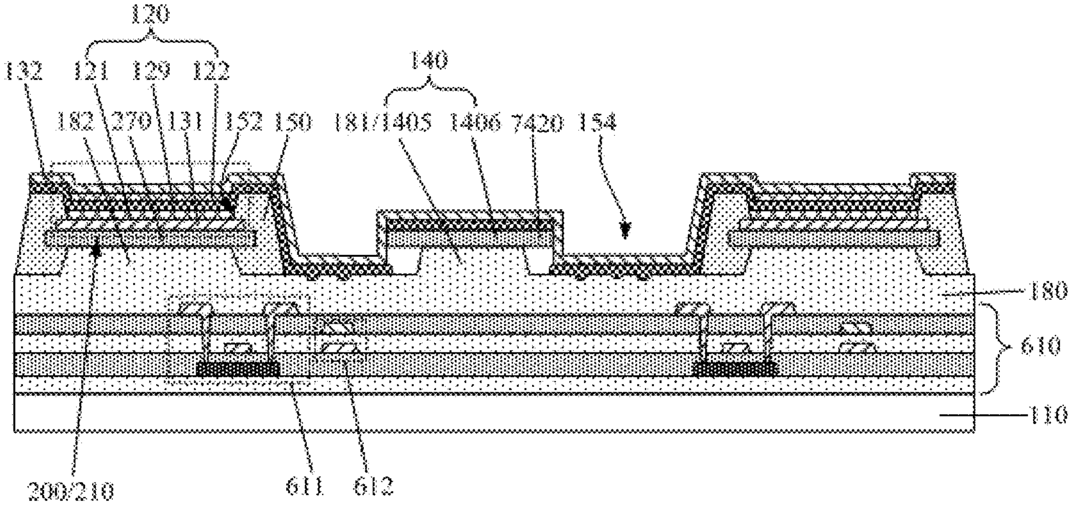
FIG. 41 is a schematic diagram of a sectional structure of another display substrate according to an embodiment of the present disclosure.

As shown in FIG. 41, FIG. 41 is a schematic diagram of a sectional structure of another display substrate according to an embodiment of the present disclosure. The display substrate includes a drive structure layer 610 and a planarization layer 180 which are sequentially stacked on the base substrate 110, and the first electrode 131 is disposed on a side of the planarization layer 180 away from the base substrate 110; the drive structure layer 610 includes a plurality of pixel drive circuits (including a plurality of thin film transistors 611 and a storage capacitor 612), and a pixel drive circuit is connected with the first electrode 131 and configured to drive the light emitting element 210 to emit light.

The partition structure 140 may include a first partition portion 1405 and a second partition portion 1406 that are sequentially stacked along a direction away from the base substrate 110, and materials of the first partition portion 1405 and the second partition portion 1406 are different.

A first convex portion 181 and a second convex portion 182 are disposed on a surface of the planarization layer 180 away from the base substrate 110, and both of the first convex portion 181 and the second convex portion 182 are of an integral structure with the planarization layer 180.

The first convex portion 181 is the first isolation portion 1405, and the display substrate further includes a protective structure 270 disposed on a side of the second convex portion 182 away from the base substrate 110, and the first electrode 131 is disposed on a side of the protective structure 270 away from the base substrate 110.

In this embodiment, the surface of the planarization layer 180 away from the base substrate 110 is provided with the first convex portion 181 and the second convex portion 182 which are of the integral structure with the planarization layer 180, and the first convex portion 181 serves as a part of the partition structure 140 (i.e., the first isolation portion 1405), the protective structure 270 and the first electrode 131 are sequentially disposed on a side of the second convex portion 182 away from the base substrate 110, thus, in a process of forming the second isolation portion 1406 and the protective structure 270 using an etching process, a film layer forming the planarization layer 180 is not etched at positions of the first convex portion 181 and the second convex portion 182 and retains its original thickness, and is etched to a certain thickness at remaining positions. Therefore, surfaces of the finally formed planarization layer 180 at the remaining positions other than the first convex portion 181 and the second convex portion 182 are formed with an uneven topography due to etching, while surfaces of the first convex portion 181 and the second convex portion 182 are still an original flat and smooth topography, further, a surface of the first electrode 131 subsequently formed on a side of the protection structure 270 away from the base substrate 110 may achieve a flat and smooth topography, thus avoiding a problem of an uneven surface of the first electrode 131 caused by the first electrode 131 directly formed on an etched uneven surface of the planarization layer 180 in a previous example of FIG. 19, thereby improving a ripple Mura phenomenon caused by the uneven surface of the first electrode 131 of the display substrate in the example of FIG. 19 and improving display uniformity of the display substrate.

In some examples of the embodiment, as shown in FIG. 41, the protective structure 270 and the second isolation portion 1406 may be disposed in a same layer. The protective structure 270 is made of a same material as the second isolation portion 1406, and may be formed simultaneously in a process of forming the second isolation portion 1406 using an etching process. The protective structure 270 may protect a film layer forming the planarization layer 180 in the etching process, so that the film layer forming the planarization layer 180 at a position where the protective structure 270 is located is not etched, thereby forming the second convex portion 182.

In some examples of the embodiment, as shown in FIG. 41, the second isolation portion 1406 may have a protrusion portion 7420 protruding from the first isolation portion 1405 in an arrangement direction of two adjacent sub-pixels 200. In this way, a partition effect of the partition structure 140 may be improved.

In some examples of the embodiment, as shown in FIG. 41, a circumferential edge of the protective structure 270 may protrude from a circumferential edge of the first electrode 131 in a direction parallel to the base substrate 110. In this way, flatness of a surface of the first electrode 131 may be ensured.

In some examples of the embodiment, as shown in FIG. 41, an orthographic projection of a surface of the second convex portion 182 away from the base substrate 110 on the base substrate 110 falls within an orthographic projection of the protective structure 270 on the base substrate 110.

In some examples of the embodiment, as shown in FIG. 41, the display substrate further includes a pixel definition layer 150 disposed on a side of a plurality of first electrodes 131 away from the base substrate 110, the pixel definition layer 150 is provided with a plurality of pixel openings 152 and pixel spacing openings 154, a pixel opening 152 exposes a first electrode 131, and a pixel spacing opening 154 is located between two adjacent first electrodes 131, the pixel spacing opening 154 at least partially exposes an edge of the partition structure 140.

In the example in FIG. 41, edges on two sides of the partition structure 140 are exposed by the pixel spacing opening 154 in an arrangement direction of adjacent sub-pixels 200. In another implementation mode, a side edge of the partition structure 140 is covered by the pixel definition layer 150 in the arrangement direction of adjacent sub-pixels 200, and the other side edge of the partition structure 140 is located within the pixel spacing opening 154, and reference may be made to the example of FIG. 16.

Based on the foregoing contents, an embodiment of the present disclosure provides a method for manufacturing a display substrate, including: forming a plurality of first electrodes on a base substrate; forming a partition structure on the base substrate; forming a light emitting functional layer on a side of the partition structure and the plurality of first electrodes away from the base substrate, wherein the light emitting functional layer includes a conductive sub-layer; and forming a second electrode on a side of the light emitting functional layer away from the base substrate, wherein the second electrode, the light emitting functional layer, and a plurality of the first electrodes form light emitting elements of a plurality of sub-pixels; wherein the partition structure is located between adjacent sub-pixels, and the conductive sub-layer is disconnected at a position where the partition structure is located; the plurality of sub-pixels includes a plurality of first-color sub-pixels, a plurality of second-color sub-pixels, and a plurality of third-color sub-pixels, the partition structure includes a plurality of annular partition portions, an annular partition portion surrounds at least one of the first-color sub-pixels or at least one of the second-color sub-pixels or at least one of the third-color sub-pixels, and the plurality of annular partition portions surround a plurality of sub-pixels of a same color or a plurality of sub-pixels of different colors; at least one of the annular partition portions is in a closed ring shape, or/and, at least one of the annular partition portions is provided with at least one notch.

A method for manufacturing a display substrate according to an embodiment of the present disclosure may include following acts.

Figure 42A:
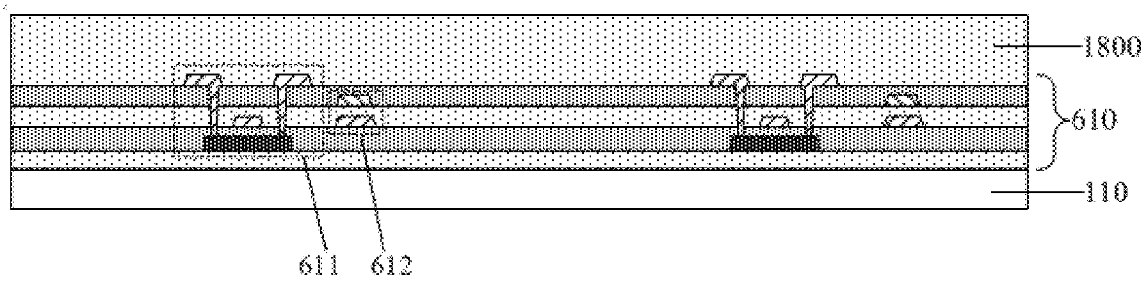
FIG. 42A is a schematic sectional view after forming a planarization thin film in a method for manufacturing a display substrate according to some embodiments.

1) A drive structure layer 610 is formed on a base substrate 110. The drive structure layer 610 includes a plurality of pixel drive circuits, a pixel drive circuit may include a plurality of thin film transistors 611 and a storage capacitor 612, and a connection electrode configured to be connected with a first electrode. As shown in FIG. 42A, each pixel drive circuit in the example of FIG. 42A shows one thin film transistor 611 and one storage capacitor 612.

Figure 43A:
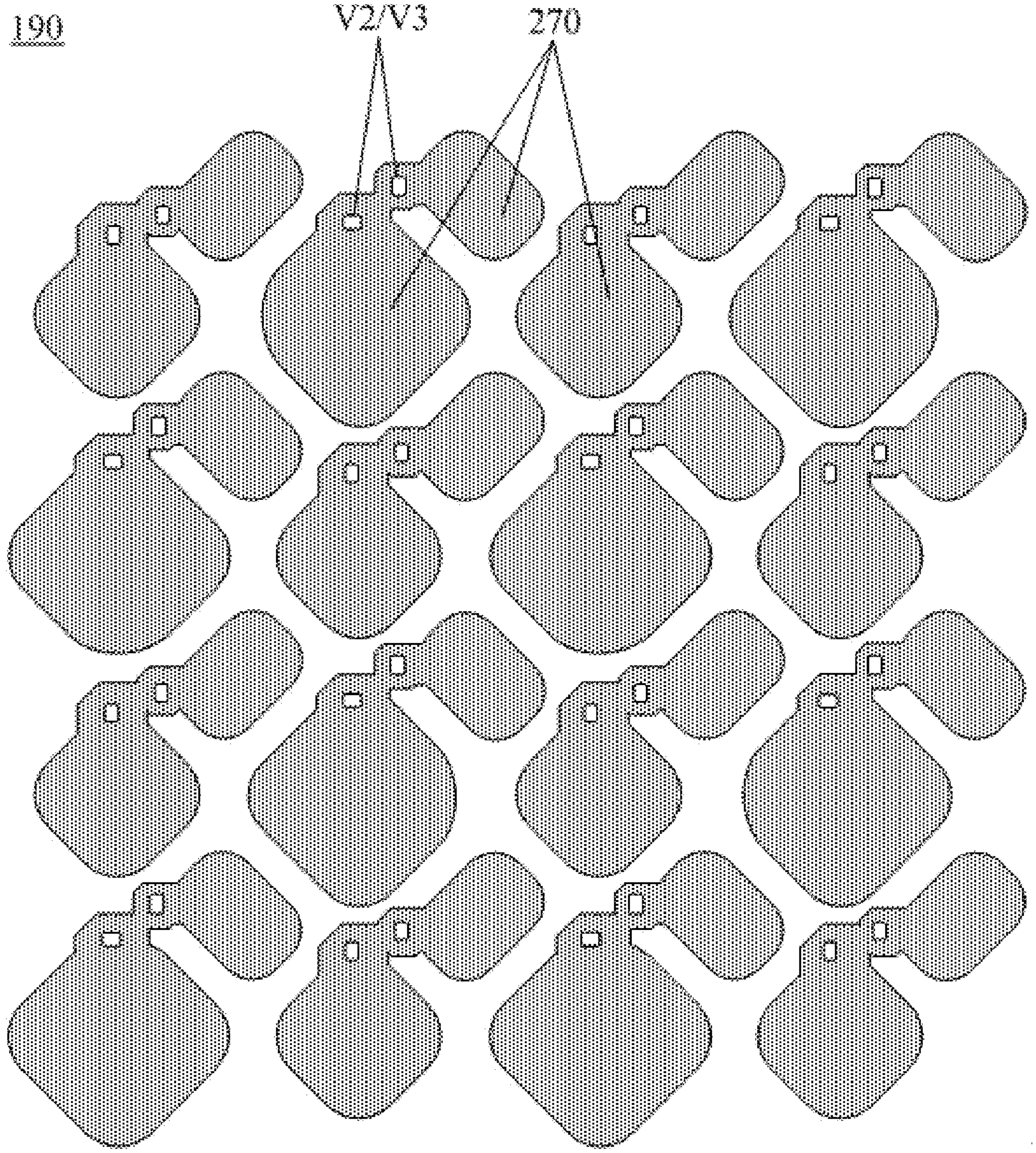
FIG. 43A is a schematic plan view of the display substrate of FIG. 36A after a protective layer is formed.

2) A planarization thin film 1800 is formed on a side of the drive structure layer 610 away from the base substrate 110, and the planarization thin film 1800 is etched so that the planarization thin film 1800 is formed with a plurality of second vias V2, and a second via V2 exposes the connection electrode. As shown in FIG. 42A and FIG. 43A, FIG. 42A shows the planarization thin film 1800, the plurality of second vias V2 of the planarization thin film 1800 are shown in FIG. 43A, a film layer of the planarization film 1800 is not shown.

Figure 42B:
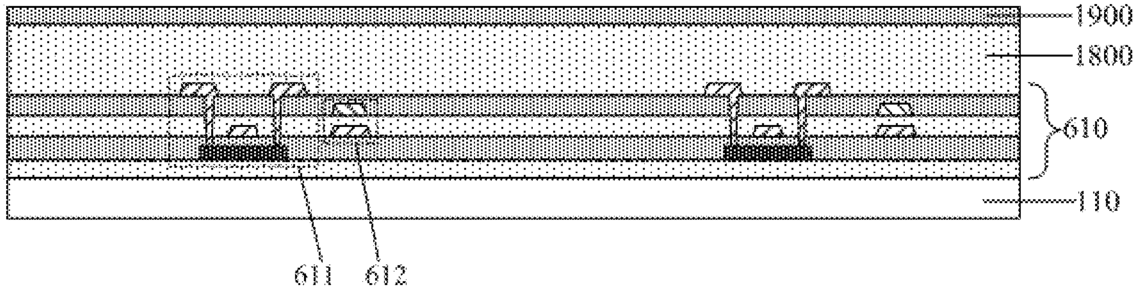
FIG. 42B is a schematic sectional view after forming a protective thin film in a method for manufacturing a display substrate according to some embodiments.

3) A protective thin film 1900 is formed on a side of the planarization thin film 1800 away from the base substrate 110, as shown in FIG. 42B.

Figure 42C:
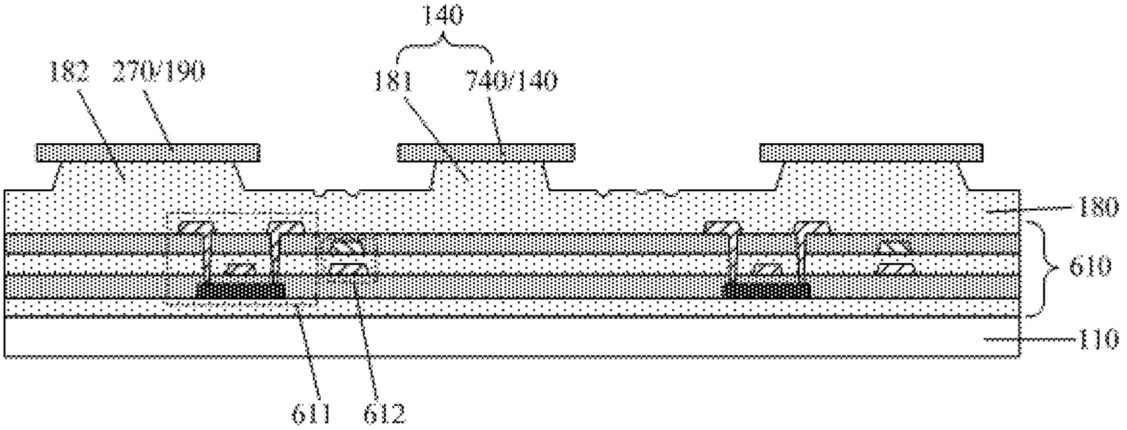
FIG. 42C is a schematic sectional view after forming a protective layer in a method for manufacturing a display substrate according to some embodiments.

4) Using a same etching process, the protective thin film 1900 is patterned to form a protective layer 190, and the planarization thin film 1800 is etched to form a planarization layer 180, as shown in FIG. 42C.

Among them, the protective layer 190 includes a protective structure 270 and an isolation portion 740; a surface of the planarization layer 180 away from the base substrate 110 is formed with a first convex portion 181 and a second convex portion 182, both of the first convex portion 181 and the second convex portion 182 are of an integral structure with the planarization layer 180; the protective structure 270 is located on a side of the second convex portion 182 away from the base substrate 110, and a part of the protective structure 270 is located within the second via; the isolation portion 740 is located on a side of the first convex portion 181 away from the base substrate 110, as shown in FIG. 42C.

Among them, in some examples, such as the display substrate exemplified in FIG. 37A and FIG. 37B, the isolation portion 740 is the partition structure 140. Or, in other examples, such as the display substrate exemplified in FIG. 41, the isolation portion 740 (i.e., the second isolation portion 1406 in the example of FIG. 41) and the first convex portion 181 (i.e., the first isolation portion 1405 in the example of FIG. 41) form the partition structure 140. Herein, in the display substrate exemplified in FIG. 37A and FIG. 37B, a thickness of the isolation portion 740 is sufficient to play a role of partition of the partition structure 140, a thickness of the planarization thin film 1800 etched in an etching process is relatively small, and thicknesses of finally formed first convex portion 181 and second convex portion 182 are correspondingly relatively small, so the isolation portion 740 is used as the partition structure 140. In the display substrate exemplified in FIG. 41, a thickness of the isolation portion 740 may be relatively small, a thickness of the planarization thin film 1800 etched in an etching process is relatively large, and thicknesses of finally formed first convex portion 181 and second convex portion 182 are correspondingly relatively large. Therefore, the isolation portion 740 and the first convex portion 181 are used together as the partition structure 140.

Among them, the protective structure 270 and the isolation portion 740 may not be connected, as shown in FIG. 42C, in the display substrate exemplified in FIG. 41, that is, the protective structure 270 and the second isolation portion 1406 may not be connected. Or, the protective structure 270 and the isolation portion 740 may be connected into an integral structure, and the first convex portion 181 and second convex portion 182 may be connected into an integral structure. In the display substrate exemplified in FIG. 37A, i.e., the protective structure 270 and the partition structure 140 may be connected into an integral structure.

As shown in FIG. 43A, FIG. 43A is a schematic plan view of the display substrate of FIG. 36A after the protective layer 190 is formed. In the example of FIG. 36A, the protective structure 270 and the partition structure 140 are connected into an integral structure, a part of the protective structure 270 close to a circumferential edge forms the partition structure 140, and the protective structure 270 is provided with a third via V3. A plurality of second vias V2 of the planarization layer, and the protective layer 190 are shown in FIG. 43A, and the planarization layer is not shown.

This act may include following processes: forming a mask layer (which may be a photoresist layer) on a side of the protective thin film 1900 away from the base substrate 110, and then forming the protective layer 190 and the planarization layer 180 through exposure, development, etching, removal of the mask layer, etc. In an etching process, both the protective thin film 1900 and the planarization thin film 1800 are etched, that is, after a same etching process, the protective thin film 1900 is patterned to form the protective layer 190 (including the protective structure 270 and the isolation portion 740), and the planarization thin film 1800 is etched to form the planarization layer 180 having a first convex portion 181 and a second convex portion 182 on a surface.

In this example, since the protective thin film 1900 at a position where a first electrode is subsequently formed is not etched in the etching process, the planarization thin film 1800 at the position where the first electrode is subsequently formed will not be etched in the etching process, that is, the protective structure 270 and the second convex portion 182 are formed at the position where the first electrode is subsequently formed after etching, and since it has not been etched, a surface of the formed second convex portion 182 still has an original flat and smooth topography, and a surface of the protective structure 270 may also have a flat and smooth topography, and then a surface of the first electrode subsequently formed on a side of the second convex portion 182 and the protective structure 270 away from the base substrate 110 may achieve a flat and smooth topography, thereby, the problem that the surface of the first electrode 131 is uneven due to the first electrode 131 surface being directly formed on the etched uneven surface of the planarization layer 180 in the previous example of FIG. 19 may be avoided, and further, the ripple Mura phenomenon caused by the uneven surface of the first electrode 131 in the display substrate of the example of FIG. 19 may be improved.

Herein, a material of the planarization layer 180 may be an organic material such as one of resin, acrylic or polyethylene terephthalate, polyimide, polyamide polycarbonate, and epoxy resin, or a combination thereof. Or, the material of the planarization layer 180 may be an inorganic material such as one or more of silicon nitride, silicon oxide, and silicon oxynitride. A material of the protective layer 190 may be an inorganic material, such as one or more of silicon nitride, silicon oxide, and silicon oxynitride. The material of the protective layer 190 may be different from the material of the planarization layer 180, in this way, an etching rate of an etching gas or etching liquid to the planarization thin film 1800 in the etching process is greater than that to the protective thin film 1900, thereby, an edge of the formed isolation portion 740 will protrude from an edge of the first convex portion 181, which is beneficial to improving a partition effect of the formed partition structure 140.

Figure 42D:
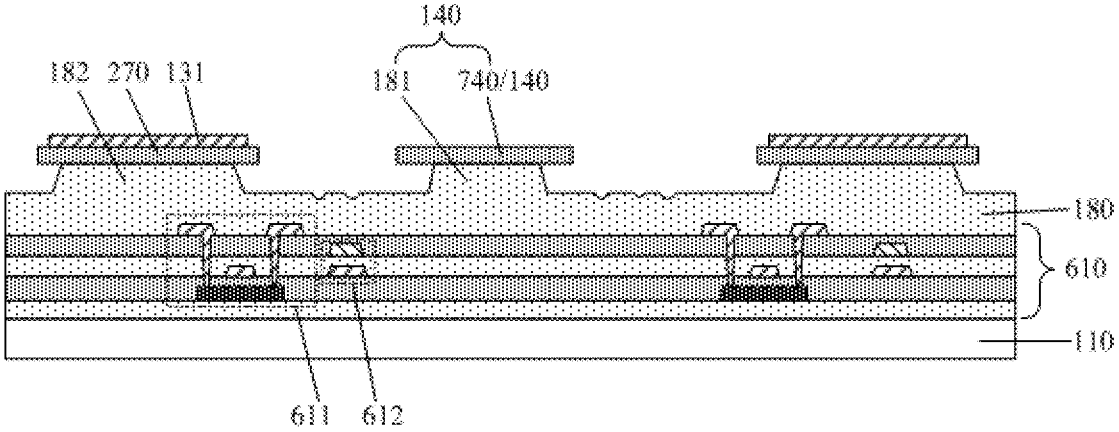
FIG. 42D is a schematic sectional view after a first electrode is formed in a method for manufacturing a display substrate according to some embodiments.

5) A plurality of first electrodes 131 are formed on a side of the protective structure 270 away from the base substrate 110, and a first electrode 131 is connected with the connection electrode through the second via, as shown in FIG. 42D.

Figure 43B:
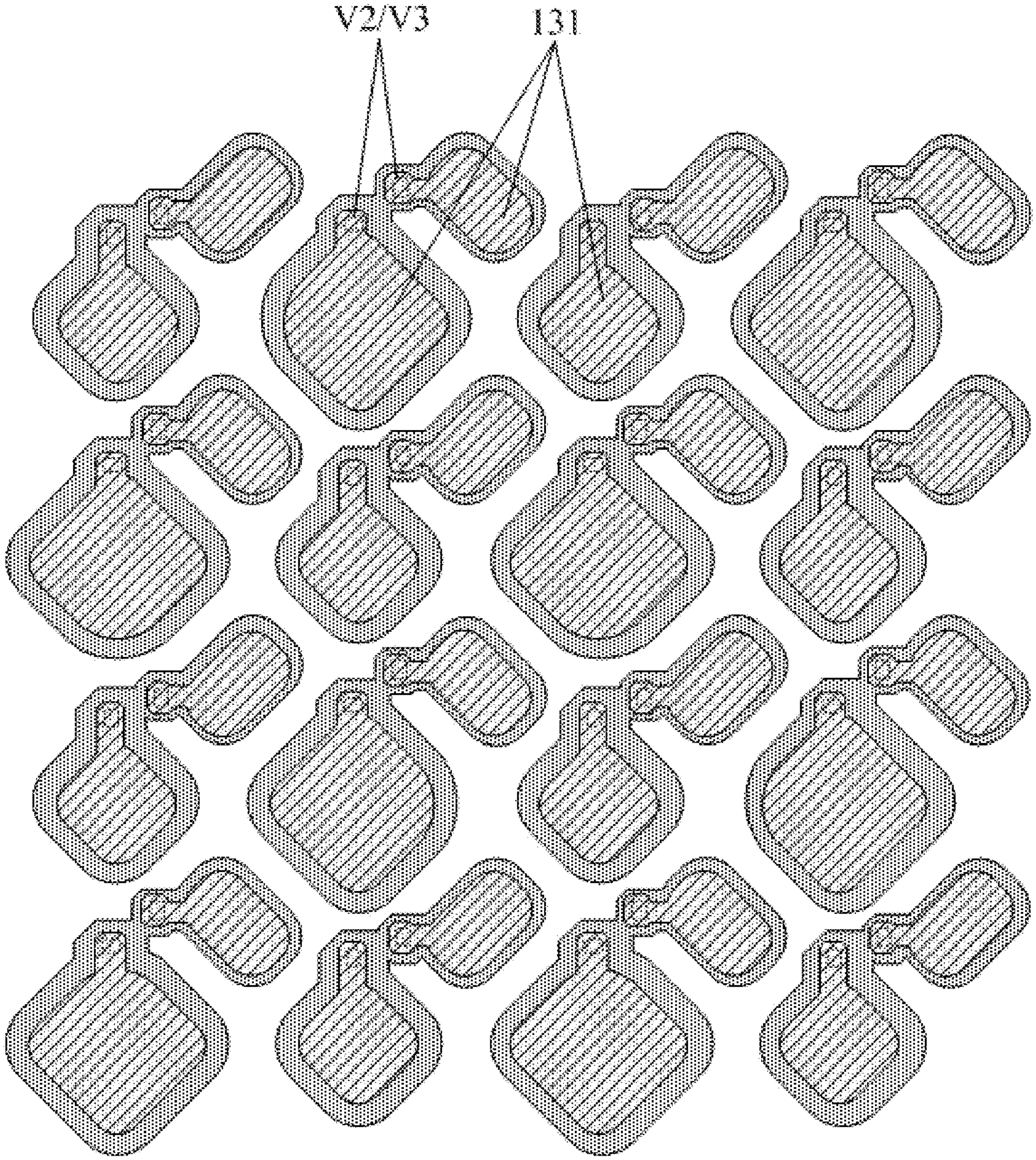
FIG. 43B is a schematic plan view of the display substrate of FIG. 36A after a first electrode is formed.

As shown in FIG. 43B, FIG. 43B is a schematic plan view of the display substrate of FIG. 36A after a first electrode is formed. In the example of FIG. 36A, the first electrode 131 is connected with the connection electrode through the third via V3 of the protective structure and the second via V2 of the planarization layer.

Figure 42E:
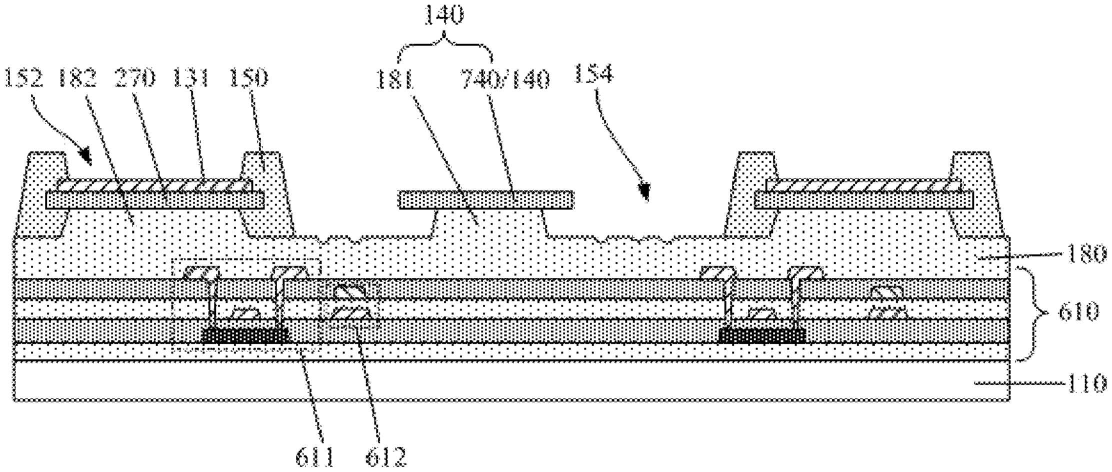
FIG. 42E is a schematic diagram after a pixel definition layer is formed in a method for manufacturing a display substrate according to some embodiments.

6) A pixel definition layer 150 is formed on a side of the plurality of first electrodes 131 away from the base substrate 110, wherein the pixel definition layer 150 is provided with a plurality of pixel openings 152 and pixel spacing openings 154, the pixel openings 152 expose the first electrodes 131, and a pixel spacing opening 154 at least partially exposes an edge of the partition structure 140, as shown in FIG. 42E.

Figure 43C:
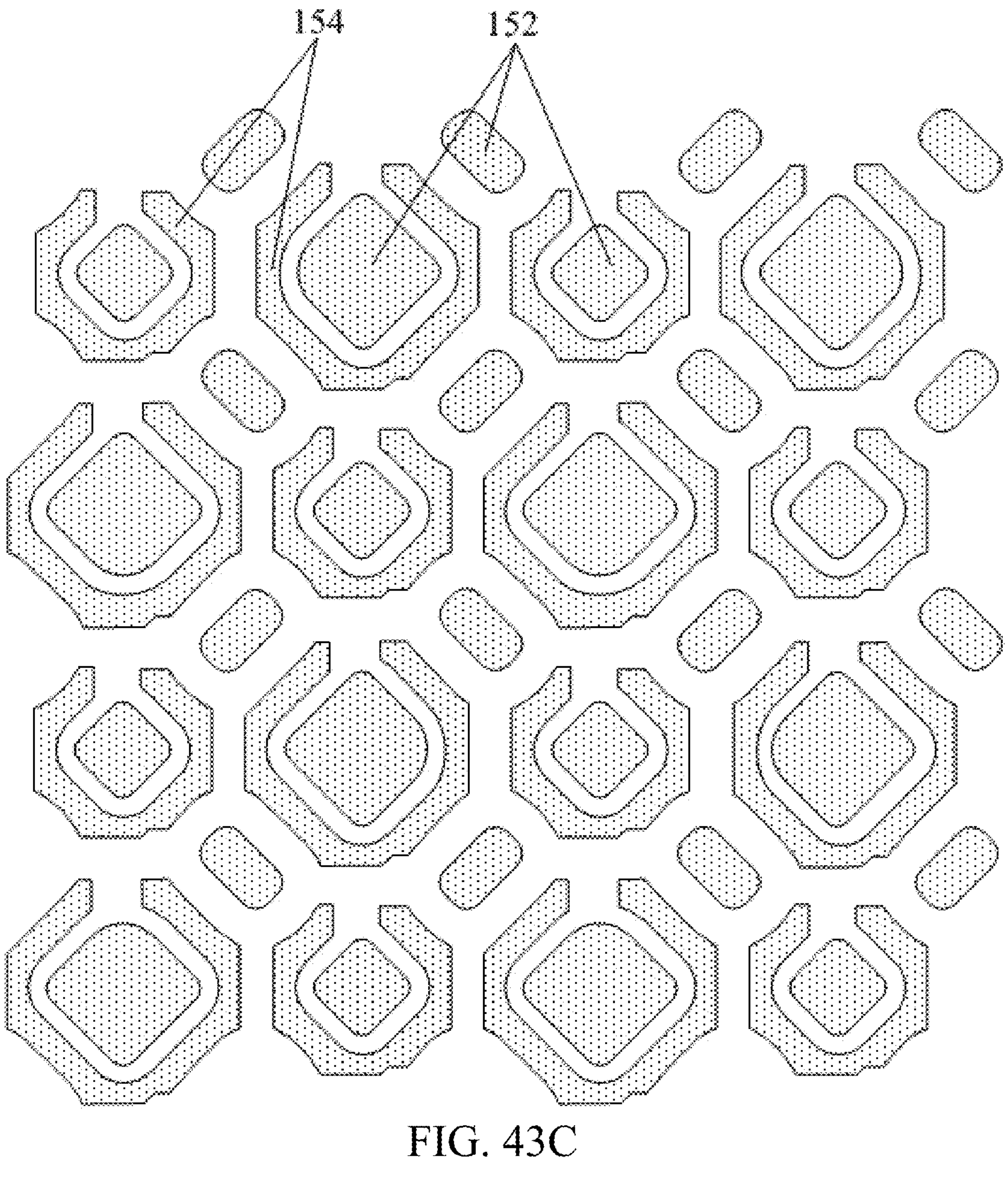
FIG. 43C is a schematic plan view of a pixel opening and a pixel spacing opening of a pixel definition layer in a display substrate of FIG. 36A.

As shown in FIG. 43C, FIG. 43C is a schematic plan view of the pixel openings 152 and the pixel spacing openings 154 of the pixel definition layer 150 in the display substrate of FIG. 36A, the pixel spacing opening 154 is in a ring shape with a notch, which is disposed around a pixel opening 152.

7) A light emitting functional layer 120 and a second electrode 132 are formed on the base substrate 110 on which the above-mentioned structures are formed, which may include following operations.

Exemplarily, as shown in FIG. 37A and FIG. 41, a first emitting layer 121 may be formed on a side of a first electrode 131 of each sub-pixel 200 away from the base substrate 110 using an evaporation process. Among them, a first emitting layer 121 of each sub-pixel 200 may be located within a pixel opening 152 of the sub-pixel 200. Before the first emitting layer 121 is formed, a first hole injection layer and a first hole transport layer may be formed sequentially on a side of first electrodes 131 of a plurality of sub-pixels 200 away from the base substrate 110.

Exemplarily, a conductive sub-layer (such as a charge generation layer) 129 may be formed on a side of first emitting layers 121 of the plurality of sub-pixels 200 away from the base substrate 110 using an evaporation process and using an open mask. In a process of forming the conductive sub-layer 129, the conductive sub-layer 129 is naturally disconnected at an edge of a part of the partition structure 140 exposed by the pixel spacing opening 154. Among them, a first electron transport layer and a first electron injection layer may be sequentially formed on a side of the first emitting layers 121 of the plurality of sub-pixels 200 away from the base substrate 110 before forming the conductive sub-layer (such as the charge generation layer) 129.

Exemplarily, a second emitting layer 122 of each sub-pixel 200 may be formed on a side of the conductive sub-layer 129 away from the base substrate 110 using an evaporation process. Among them, the second emitting layer 122 of each sub-pixel 200 may be located within a pixel opening 152 of the sub-pixel 200. Before the second emitting layer 122 is formed, a second hole injection layer and a second hole transport layer may be formed sequentially on a side of conductive sub-layers 129 of the plurality of sub-pixels 200 away from the base substrate 110.

Exemplarily, a second electrode 132 may be formed on a side of second emitting layers 122 of the plurality of sub-pixels 200 away from the base substrate 110 using an evaporation process and using an open mask. Among them, a second electron transport layer and a second electron injection layer may be sequentially formed on a side of the second emitting layers 122 of the plurality of sub-pixels 200 away from the base substrate 110 before forming the second electrode 132.

Subsequently, an encapsulation layer may be formed on a side of the second electrode 132 away from the base substrate 110. The encapsulation layer may include a first encapsulation layer, a second encapsulation layer, and a third encapsulation layer that are sequentially stacked along a direction away from the base substrate 110, wherein the first encapsulation layer and the third encapsulation layer may be made of an inorganic material, such as at least one of silicon nitride, silicon oxide, and silicon oxynitride, and the second encapsulation layer may be made of an organic material, such as a resin material.

Figure 44A:
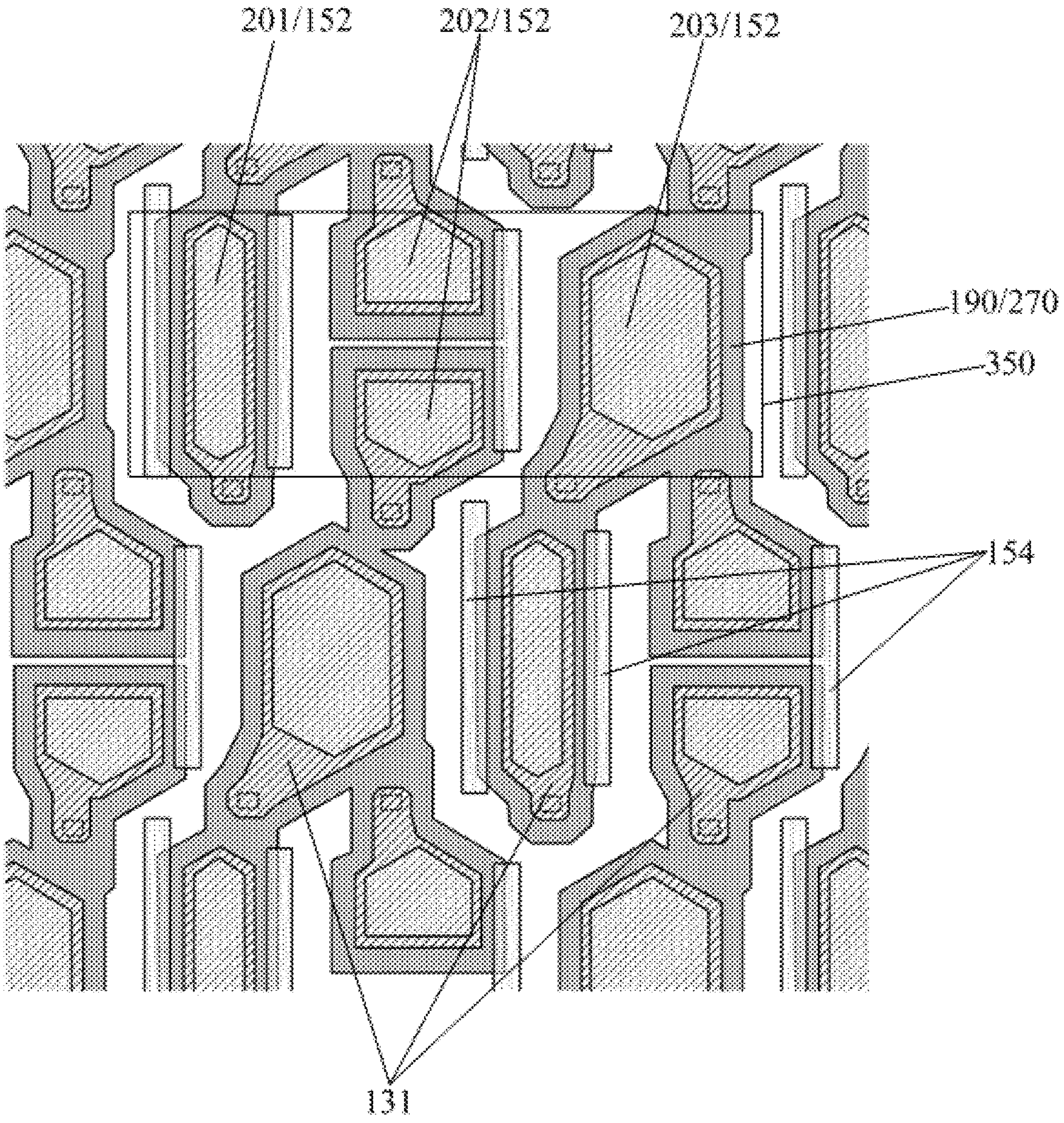
FIG. 44A is a schematic diagram of a planar structure of another display substrate according to an embodiment of the present disclosure.
Figure 44B:
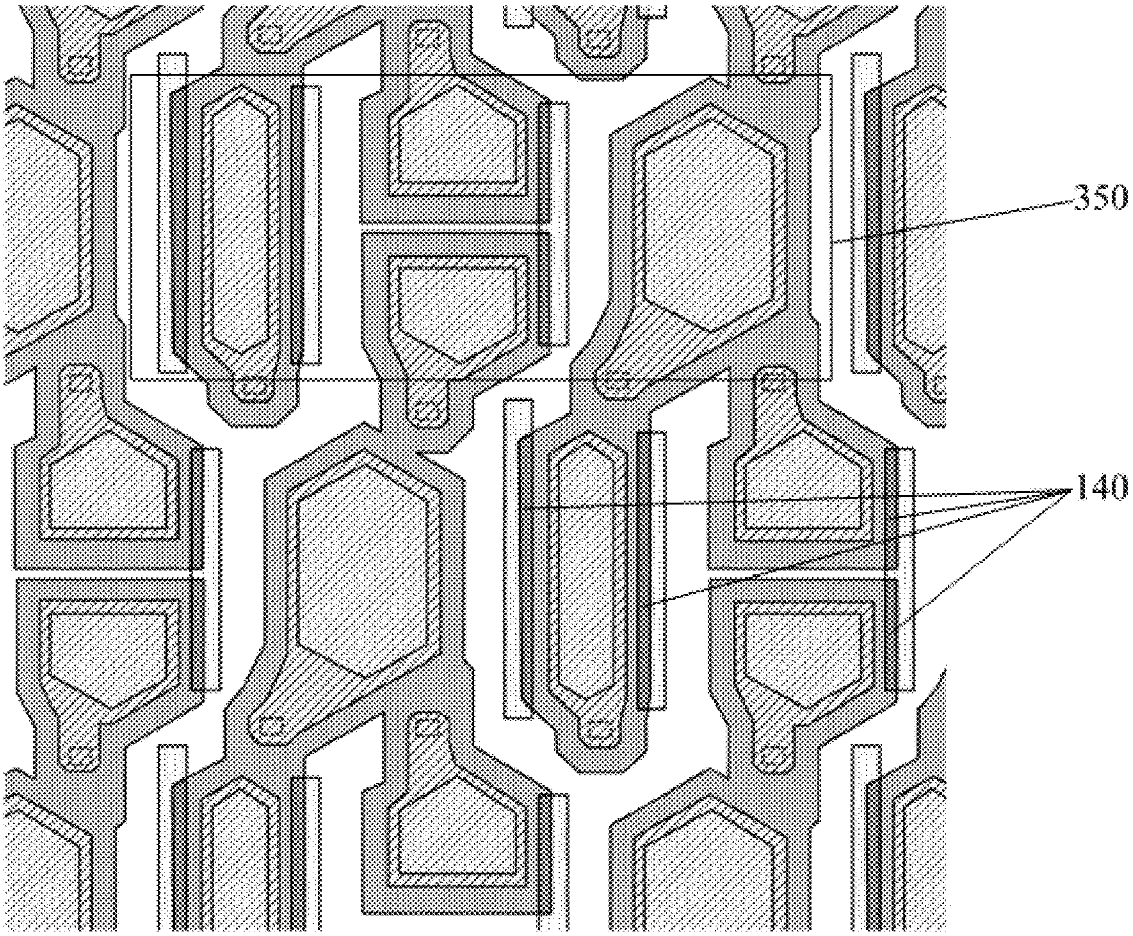
FIG. 44B is a schematic diagram of a planar structure in which a partition structure is highlighted in the display substrate of FIG. 44A.

An embodiment of the present disclosure provides another display substrate, as shown in FIG. 44A and FIG. 44B, wherein FIG. 44A is a schematic diagram of a planar structure of another display substrate according to an embodiment of the present disclosure, and FIG. 44B is a schematic diagram of a planar structure in which a partition structure is highlighted in the display substrate of FIG. 44A, wherein the display substrate includes a drive structure layer and a planarization layer sequentially stacked on a base substrate; the display substrate further includes a protective layer 190 disposed on a side of the planarization layer away from the base substrate, the protective layer 190 includes a protective structure 270 and the partition structure 140, and the first electrode 131 is disposed on a side of the protective structure 270 away from the base substrate 110.

The display substrate further includes a pixel definition layer disposed on a side of a plurality of first electrodes 131 away from the base substrate 110. The pixel definition layer is provided with a plurality of pixel openings 152 and pixel spacing openings 154, a pixel opening 152 exposes a first electrode 131, and a pixel spacing opening 154 is located between two adjacent first electrodes 131 and partially exposes an edge of the partition structure 140 (the edge of the partition structure 140 is an effective partition position).

In this example, exemplarily, the protective structure 270 and the partition structure 140 are connected into an integral structure, that is, a part of the protective structure 270, exposed by the pixel spacing opening 154, close to an edge forms the partition structure 140.

In this example, exemplarily, a plurality of sub-pixels on the display substrate include a plurality of first-color sub-pixels 201, a plurality of second-color sub-pixels 202, and a plurality of third-color sub-pixels 203. A quantity of the second-color sub-pixels 202 is greater than a quantity of the first-color sub-pixels 201 and greater than a quantity of the third-color sub-pixels 203. The quantity of the second-color sub-pixels 202 may be twice the quantity of the first-color sub-pixels 201, and the quantity of the first-color sub-pixels 201 may be equal to the quantity of the third-color sub-pixels 203. In this example, an arrangement of the plurality of sub-pixels on the display substrate may be similar to an arrangement of the plurality of sub-pixels in the foregoing FIG. 9 and FIG. 10. As shown in FIG. 44A, the plurality of sub-pixels are divided into a plurality of sub-pixel groups 350, each of which includes one first-color sub-pixel 201, two second-color sub-pixels 202, and one third-color sub-pixel 203; in each sub-pixel group 350, the first-color sub-pixel 201 and the third-color sub-pixel 203 are arranged along a first direction, and the two second-color sub-pixels 202 are disposed adjacent in a second direction and are located between the first-color sub-pixel 201 and the third-color sub-pixel 203.

In this example, exemplarily, as shown in FIG. 44B, the partition structure 140 may include a plurality of first annular partition portions, a plurality of second annular partition portions, and a plurality of third annular partition portions; each first annular partition portion is disposed around two adjacent second-color sub-pixels; each second annular partition portion is disposed around one first-color sub-pixel; each third annular partition portion is disposed around one third-color sub-pixel. The first annular partition portion, the second annular partition portion, and the third annular partition portion are all provided with a plurality of notches, and two adjacent annular partition portions have a common part, so that only a part of one annular partition portion, such as a strip-shaped partition portion, is disposed between two adjacent sub-pixels of different colors. In this example, as shown in FIG. 44B, a partition structure 140 between the first-color sub-pixel 201 and two adjacent second-color sub-pixels 202 is a strip-shaped partition portion, and a partition structure 140 between the third-color sub-pixel 203 and two adjacent second-color sub-pixels 202 is a strip-shaped partition portion which is disconnected in a middle. In another implementation mode, edges of two protective structures 270 corresponding to two first electrodes 131 of two adjacent second-color sub-pixels 202 may be continuous within the pixel spacing opening 154, then the partition structure 140 between the third-color sub-pixel 203 and the two adjacent second-color sub-pixels 202 is a strip-shaped partition portion that is not disconnected in the middle. In another implementation mode, partition structures 140 with different planar shapes may be formed by changing a pattern of the protective layer 190 and a shape of the pixel spacing opening 154, etc., which is not limited in the present disclosure.

Figure 45A:
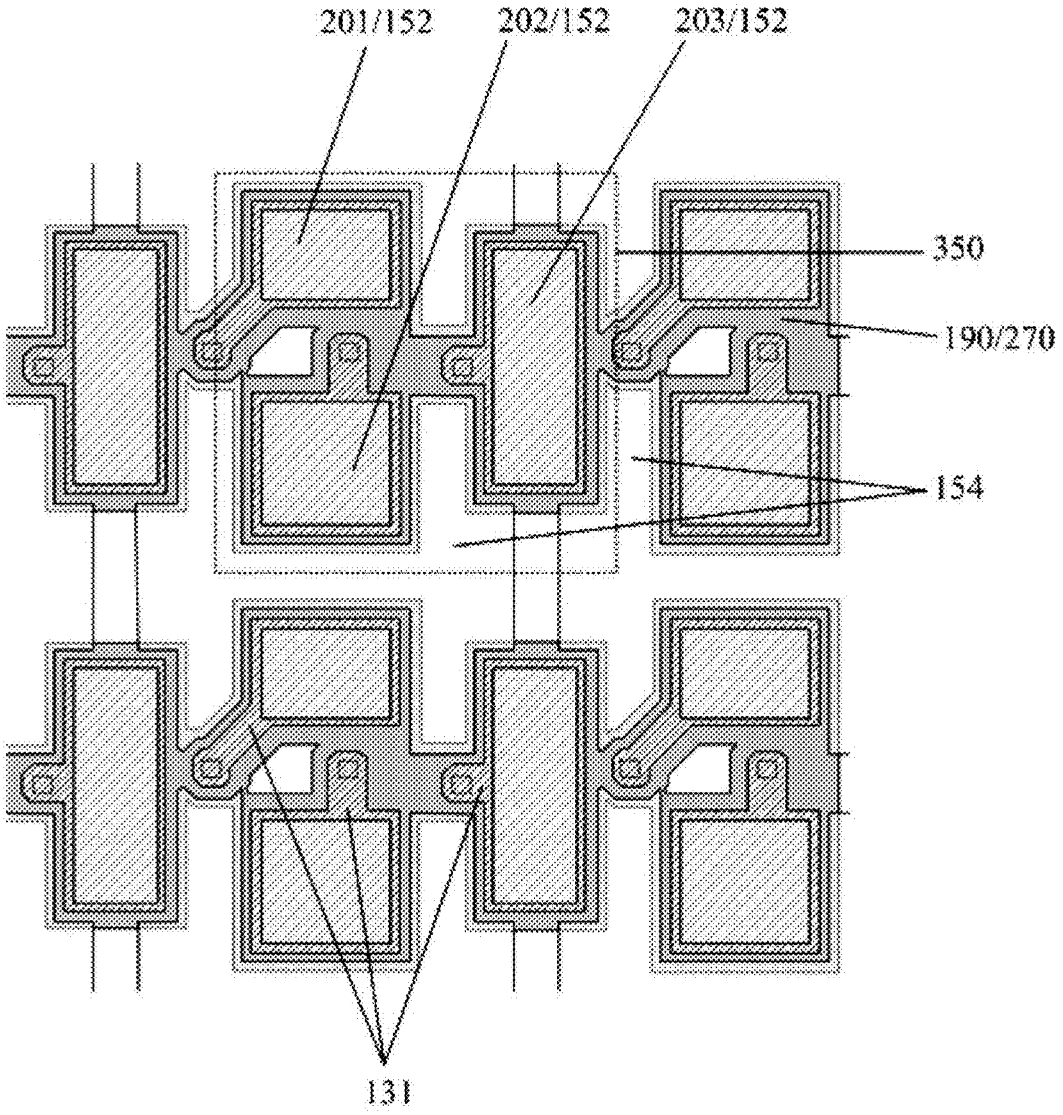
FIG. 45A is a schematic diagram of a planar structure of another display substrate according to an embodiment of the present disclosure.
Figure 45B:
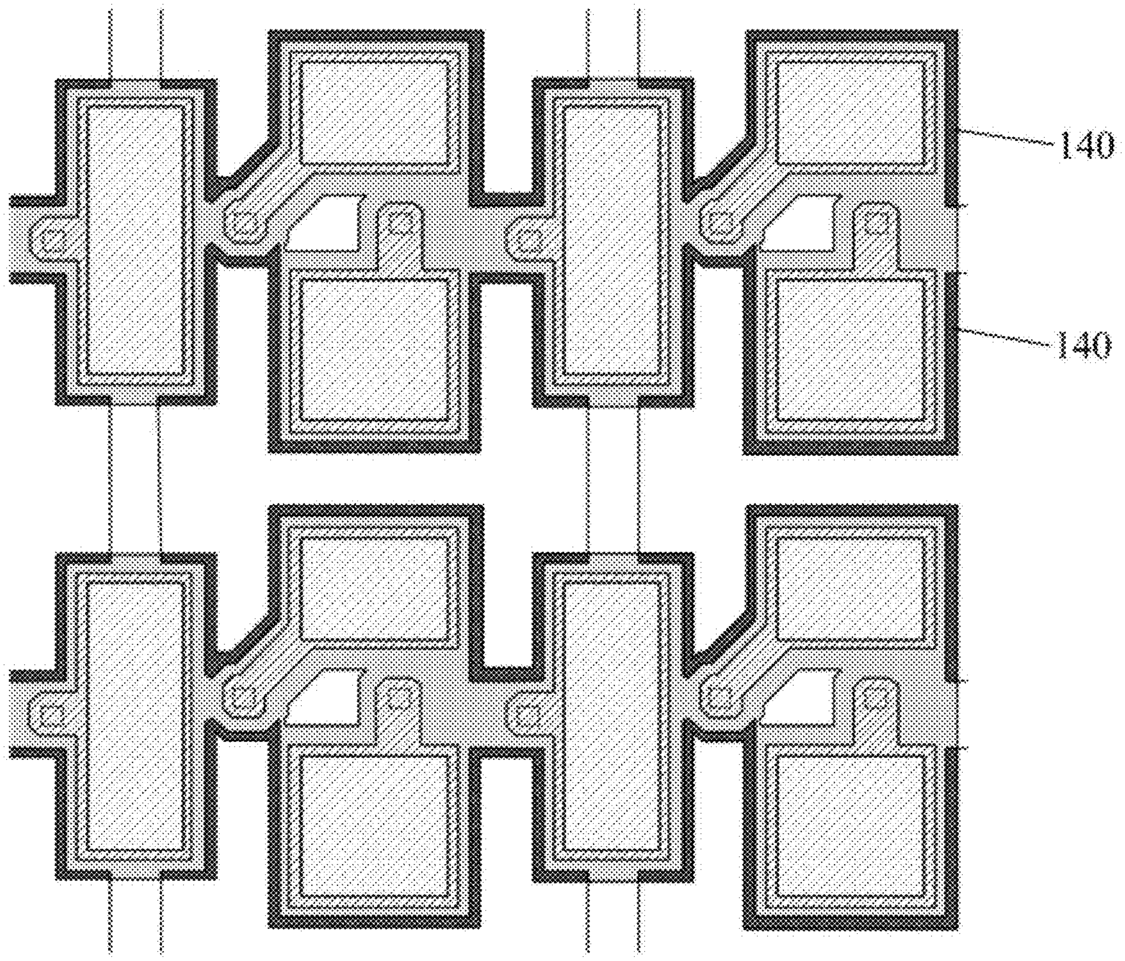
FIG. 45B is a schematic diagram of a planar structure in which a partition structure is highlighted in the display substrate of FIG. 45A.

An embodiment of the present disclosure provides another display substrate, as shown in FIG. 45A and FIG. 45B, wherein FIG. 45A is a schematic diagram of a planar structure of another display substrate according to an embodiment of the present disclosure, and FIG. 45B is a schematic diagram of a planar structure in which a partition structure is highlighted in the display substrate of FIG. 45A, wherein the display substrate includes a drive structure layer and a planarization layer sequentially stacked on a base substrate; the display substrate further includes a protective layer 190 disposed on a side of the planarization layer away from the base substrate, the protective layer 190 includes a protective structure 270 and the partition structure 140, and the first electrode 131 is disposed on a side of the protective structure 270 away from the base substrate 110.

The display substrate further includes a pixel definition layer disposed on a side of a plurality of first electrodes 131 away from the base substrate, the pixel definition layer is provided with a plurality of pixel openings 152 and pixel spacing openings 154, a pixel opening 152 exposes the first electrode 131 and a pixel spacing opening 154 is located between two adjacent first electrodes 131 and partially exposes an edge of the partition structure 140 (the edge of the partition structure 140 is an effective partition position).

In this example, exemplarily, the protective structure 270 and the partition structure 140 are connected into an integral structure, that is, a part of the protective structure 270, exposed by the pixel spacing opening 154, close to an edge forms the partition structure 140.

In this example, exemplarily, a plurality of sub-pixels on the display substrate include a plurality of first-color sub-pixels 201, a plurality of second-color sub-pixels 202, and a plurality of third-color sub-pixels 203. In this example, an arrangement of the plurality of sub-pixels on the display substrate may be the same as an arrangement of the plurality of sub-pixels in the foregoing FIG. 11 and FIG. 12. As shown in FIG. 45A, the plurality of sub-pixels 200 are divided into a plurality of sub-pixel groups 350, each of which includes one first-color sub-pixel 201, one second-color sub-pixel 202, and one third-color sub-pixel 203; in each sub-pixel group 350, the first-color sub-pixel 201 and the third-color sub-pixel 203, and the second-color sub-pixel 202 and the third-color sub-pixel 203 are all arranged along a first direction, the first-color sub-pixel 201 and the second-color sub-pixel 202 are arranged along a second direction, and the third-color sub-pixel 203 is located on a same side of the first-color sub-pixel 201 and the second-color sub-pixel 202.

In this example, exemplarily, as shown in FIG. 45B, the partition structure 140 may include a plurality of first annular partition portions, a plurality of second annular partition portions, and a plurality of third annular partition portions; each first annular partition portion is disposed around one second-color sub-pixel; each second annular partition portion is disposed around one first-color sub-pixel; each third annular partition portion is disposed around one third-color sub-pixel. The first annular partition portion, the second annular partition portion, and the third annular partition portion are all provided with at least one notch, a second annular partition portion and a third annular partition portion which are adjacent may be connected, a first annular partition portion and a third annular partition portion which are adjacent may be connected, notches of a first annular partition portion and a second annular partition portion which are adjacent are all disposed between a first-color sub-pixel and a second-color sub-pixel, so that no partition structure is disposed between a first-color sub-pixel and a second-color sub-pixel which are adjacent; the third annular partition portion may be provided with four notches. In another implementation mode, partition structures 140 with different planar shapes may be formed by changing a pattern of the protective layer 190 and a shape of a pixel spacing opening 154, etc., which is not limited in the present disclosure.

There are following points.

(1) In the drawings of the embodiments of the present disclosure, only structures related to the embodiments of the present disclosure are involved, and other structures may be referred to usual designs.

(2) Features in a same embodiment and features in different embodiments of the present disclosure may be combined with each other if there is no conflict.

What has been described above are only exemplary implementation modes of the present disclosure and is not intended to limit the scope of protection of the present disclosure which is determined by the appended claims.

The invention claimed is:

1. A display substrate, comprising:

a base substrate;

a plurality of sub-pixels located on the base substrate, wherein a sub-pixel comprises a light emitting element, the light emitting element comprises a light emitting functional layer, and a first electrode and a second electrode that are located on two sides of the light emitting functional layer, the first electrode is located between the light emitting functional layer and the base substrate, the light emitting functional layer comprises a conductive sub-layer; and a partition structure located on the base substrate, the partition structure is located between adjacent sub-pixels, and the conductive sub-layer is disconnected at a position where the partition structure is located;

the plurality of sub-pixels comprise a plurality of first-color sub-pixels, a plurality of second-color sub-pixels, and a plurality of third-color sub-pixels, the partition structure comprises a plurality of annular partition portions, an annular partition portion surrounds at least one of the first-color sub-pixels or at least one of the second-color sub-pixels or at least one of the third-color sub-pixels, and the plurality of annular partition portions surround a plurality of sub-pixels of a same color or a plurality of sub-pixels of different colors; at least one of the annular partition portions is in a closed ring shape, or/and, at least one of the annular partition portions is provided with at least one notch.

2. The display substrate according to claim 1, wherein the plurality of annular partition portions comprise a plurality of first annular pixel partition portions and a plurality of second annular pixel partition portions, a first annular pixel partition portion surrounds one of the first-color sub-pixels, and a second annular pixel partition portion surrounds one of the third-color sub-pixels; the first annular pixel partition portion is in a closed ring shape or is provided with at least one first notch, and the second annular pixel partition portion is in a closed ring shape or is provided with at least one second notch.

3. The display substrate according to claim 2, wherein the partition structure between a first-color sub-pixel and a second-color sub-pixel which are adjacent comprises only a part of the first annular pixel partition portion.

4. The display substrate according to claim 2, wherein the partition structure between a third-color sub-pixel and a second-color sub-pixel which are adjacent comprises only a part of the second annular pixel partition portion.

5. The display substrate according to claim 2, wherein the first annular pixel partition portion is provided with at least one first notch; the first notch is located on an extension line of a diagonal of an effective light emitting region of a first-color sub-pixel, or the first notch is disposed opposite to a corner position of an effective light emitting region of a first-color sub-pixel.

6. The display substrate according to claim 2, wherein the second annular pixel partition portion is provided with at least one second notch; the second notch is located on an extension line of a diagonal of an effective light emitting region of a third-color sub-pixel, or the second notch is disposed opposite to a corner position of an effective light emitting region of a third-color sub-pixel.

7. The display substrate according to claim 2, wherein a plurality of first notches are arranged in an array, and form a first notch row and a first notch column along a first direction and a second direction, respectively, a plurality of second notches are arranged in an array, and form a second notch row and a second notch column along the first direction and the second direction, respectively, the first notch row is parallel to the second notch row, and the first notch column is parallel to the second notch column.

8. The display substrate according to claim 1, wherein each of the annular partition portions surrounds at least one of the second-color sub-pixels, and the partition structure further comprises a plurality of first strip-shaped partition portions and a plurality of second strip-shaped partition portions;

a first strip-shaped partition portion extends along a first direction, and a second strip-shaped partition portion extends along a second direction, wherein the first direction and the second direction intersect; the first strip-shaped partition portion connects two of the annular partition portions adjacent in the first direction, and the second strip-shaped partition portion connects two of the annular partition portions adjacent in the second direction; the plurality of the first strip-shaped partition portions and the plurality of the second strip-shaped partition portions connect the plurality of annular partition portions and form a plurality of first grid structures and a plurality of second grid structures in a region other than the plurality of annular partition portions, a first grid structure is disposed around one first-color sub-pixel, and a second grid structure is disposed around one third-color sub-pixel.

9. The display substrate according to claim 1, wherein the plurality of annular partition portions comprise a plurality of first annular partition portions, a plurality of second annular partition portions, and a plurality of third annular partition portions; a first annular partition portion is disposed around one second-color sub-pixel, a second annular partition portion is disposed around one first-color sub-pixel, and a third annular partition portion is disposed around one third-color sub-pixel.

10. The display substrate according to claim 1, wherein each of the annular partition portions is disposed around one of the second-color sub-pixels, at least one of the annular partition portions is provided with a plurality of notches and comprises two third strip-shaped partition portions and two fourth strip-shaped partition portions, a third strip-shaped partition portion is located between a first-color sub-pixel and a second-color sub-pixel which are adjacent, and a fourth strip-shaped partition portion is located between a third-color sub-pixel and a second-color sub-pixel which are adjacent, and an extension direction of the third strip-shaped partition portion intersects with an extension direction of the fourth strip-shaped partition portion.

11. The display substrate according to claim 1, wherein the plurality of annular partition portions comprise a plurality of first annular partition portions, a plurality of second annular partition portions, and a plurality of third annular partition portions; a first annular partition portion is disposed around two adjacent second-color sub-pixels, a second annular partition portion is disposed around one first-color sub-pixel, and a third annular partition portion is disposed around one third-color sub-pixel.

12. The display substrate according to claim 1, further comprising a plurality of pixel drive circuits, and a pixel drive circuit is connected with the first electrode and configured to drive the light emitting element to emit light;

the first electrode comprises a main body portion and a connection portion, the connection portion is connected with the main body portion and configured to be electrically connected with the pixel drive circuit, and at least part of the connection portion is located at a position where the notch is located.

13. The display substrate according to claim 1, further comprising:

a pixel definition layer located on the base substrate, the pixel definition layer is located on a side of the first electrode away from the base substrate, and the pixel definition layer is provided with a plurality of pixel openings and pixel spacing openings; the plurality of pixel openings correspond to the plurality of sub-pixels one by one to define effective light emitting regions of the plurality of sub-pixels, a pixel opening is configured to expose the first electrode, a pixel spacing opening is located between adjacent first electrodes and at least partially exposes an edge of the partition structure.

14. The display substrate according to claim 1, further comprising:

a planarization layer located between the base substrate and the first electrode; and a protective structure located between the planarization layer and the first electrode.

15. The display substrate according to claim 1, wherein the display substrate comprises a drive structure layer and a planarization layer sequentially stacked on the base substrate, and the first electrode is disposed on a side of the planarization layer away from the base substrate; the drive structure layer comprises a plurality of pixel drive circuits, and a pixel drive circuit is connected with the first electrode and configured to drive the light emitting element to emit light;

the partition structure comprises a first isolation portion and a second isolation portion which are sequentially stacked along a direction away from the base substrate, and materials of the first isolation portion and the second isolation portion are different;

a surface of the planarization layer away from the base substrate is provided with a first convex portion and a second convex portion, and both the first convex portion and the second convex portion are of an integral structure with the planarization layer;

the first convex portion is the first isolation portion, the display substrate further comprises a protective structure disposed on a side of the second convex portion away from the base substrate, and the first electrode is disposed on a side of the protective structure away from the base substrate.

16. A display apparatus, comprising the display substrate according to claim 1.

17. A method for manufacturing a display substrate, comprising:

forming a plurality of first electrodes on a base substrate;

forming a partition structure on the base substrate;

forming a light emitting functional layer on a side of the partition structure and the plurality of first electrodes away from the base substrate, wherein the light emitting functional layer comprises a conductive sub-layer; and forming a second electrode on a side of the light emitting functional layer away from the base substrate, wherein the second electrode, the light emitting functional layer, and the plurality of the first electrodes form light emitting elements of a plurality of sub-pixels;

the partition structure is located between sub-pixels which are adjacent, and the conductive sub-layer is disconnected at a position where the partition structure is located;

the plurality of sub-pixels comprises a plurality of first-color sub-pixels, a plurality of second-color sub-pixels, and a plurality of third-color sub-pixels, the partition structure comprises a plurality of annular partition portions, an annular partition portion surrounds at least one of the first-color sub-pixels or at least one of the second-color sub-pixels or at least one of the third-color sub-pixels, and the plurality of annular partition portions surround a plurality of sub-pixels of a same color or a plurality of sub-pixels of different colors; at least one of the annular partition portions is in a closed ring shape, or/and at least one of the annular partition portions is provided with at least one notch.

18. The method for manufacturing the display substrate according to claim 17, wherein the forming the partition structure on the base substrate comprises:

forming a drive structure layer on the base substrate, wherein the drive structure layer comprise a plurality of pixel drive circuits, a pixel drive circuit comprises a connection electrode configured to be connected with a first electrode;

forming a planarization thin film on a side of the drive structure layer away from the base substrate, etching the planarization thin film to enable the planarization thin film to be formed with a plurality of second vias, wherein a second via exposes the connection electrode;

forming a protective thin film on a side of the planarization thin film away from the base substrate;

using a same etching process, patterning the protective thin film to form a protective layer and etching the planarization thin film to form a planarization layer;

wherein the protective layer comprises a protective structure and an isolation portion; a surface of the planarization layer away from the base substrate is formed with a first convex portion and a second convex portion, both the first convex portion and the second convex portion are of an integral structure with the planarization layer; the protective structure is located on a side of the second convex portion away from the base substrate, and a part of the protective structure is located within the second via; the isolation portion is located on a side of the first convex portion away from the base substrate; the isolation portion is the partition structure, or the isolation portion and the first convex portion form the partition structure.

19. The method for manufacturing the display substrate according to claim 18, wherein the forming the plurality of first electrodes on a base substrate comprises: forming a plurality of first electrodes on a side of the protective structure away from the base substrate, wherein a first electrode is connected with the connection electrode through the second via.

20. The method for manufacturing the display substrate according to claim 19, further comprising: forming a pixel definition layer on a side of the plurality of first electrodes away from the base substrate; the pixel definition layer is provided with a plurality of pixel openings and pixel spacing openings, a pixel opening exposes the first electrode, and a pixel spacing opening at least partially exposes an edge of the partition structure.

* * * * *